US010700120B2

(12) United States Patent
Chaji et al.

(10) Patent No.: US 10,700,120 B2
(45) Date of Patent: Jun. 30, 2020

(54) MICRO DEVICE INTEGRATION INTO SYSTEM SUBSTRATE

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 12 days.

(21) Appl. No.: 15/653,120

(22) Filed: Jul. 18, 2017

(65) Prior Publication Data

US 2017/0345867 A1    Nov. 30, 2017

Related U.S. Application Data

(63) Continuation-in-part of application No. 15/060,942, filed on Mar. 4, 2016, now Pat. No. 10,134,803.
(Continued)

(30) Foreign Application Priority Data

Jan. 23, 2015  (CA) ....................................... 2879465
Jan. 23, 2015  (CA) ....................................... 2879627
(Continued)

(51) Int. Cl.
*H01L 27/15*       (2006.01)
*H01L 33/40*       (2010.01)
(Continued)

(52) U.S. Cl.
CPC ........ *H01L 27/156* (2013.01); *H01L 21/6835* (2013.01); *H01L 24/05* (2013.01);
(Continued)

(58) Field of Classification Search
CPC ..................................................... H01L 27/156
See application file for complete search history.

(56) References Cited

U.S. PATENT DOCUMENTS

2002/0048137 A1    4/2002  Williams
2004/0251821 A1    12/2004  Cok
(Continued)

FOREIGN PATENT DOCUMENTS

CA          2880718 A1     7/2016
CA          2887186 A1    11/2016
(Continued)

OTHER PUBLICATIONS

International Search Report and Written Opinion for International Application No. PCT/IB2018/055347 dated Nov. 9, 2018 (17 Pages).
(Continued)

*Primary Examiner* — Peniel M Gumedzoe
*Assistant Examiner* — Christopher A Johnson
(74) *Attorney, Agent, or Firm* — Nixon Peabody LLP

(57) ABSTRACT

This disclosure is related to post processing steps for integrating of micro devices into system (receiver) substrate or improving the performance of the micro devices after transfer. Post processing steps for additional structure such as reflective layers, fillers, black matrix or other layers may be used to improve the out coupling or confining of the generated LED light. In another example, dielectric and metallic layers may be used to integrate an electro-optical thin film device into the system substrate with the transferred micro devices. In another example, color conversion layers are integrated into the system substrate to create different output from the micro devices.

10 Claims, 91 Drawing Sheets

Related U.S. Application Data which is a continuation-in-part of application No. 15/002,662, filed on Jan. 21, 2016.

(30) Foreign Application Priority Data

| Jan. 28, 2015 | (CA) | 2880718 |
|---|---|---|
| Mar. 4, 2015 | (CA) | 2883914 |
| May 4, 2015 | (CA) | 2890398 |
| Jul. 19, 2016 | (CA) | 2936473 |

(51) Int. Cl.

| H01L 33/58 | (2010.01) |
|---|---|
| H01L 33/00 | (2010.01) |
| H01L 23/00 | (2006.01) |
| H01L 21/683 | (2006.01) |
| H01L 25/16 | (2006.01) |
| H01L 25/075 | (2006.01) |
| H01L 33/44 | (2010.01) |
| H01L 33/62 | (2010.01) |
| H01L 33/60 | (2010.01) |

(52) U.S. Cl.
CPC .............. *H01L 24/13* (2013.01); *H01L 24/24* (2013.01); *H01L 24/92* (2013.01); *H01L 24/96* (2013.01); *H01L 24/97* (2013.01); *H01L 25/0753* (2013.01); *H01L 25/167* (2013.01); *H01L 33/005* (2013.01); *H01L 33/405* (2013.01); *H01L 33/58* (2013.01); *H01L 24/08* (2013.01); *H01L 24/16* (2013.01); *H01L 24/32* (2013.01); *H01L 24/80* (2013.01); *H01L 24/83* (2013.01); *H01L 33/44* (2013.01); *H01L 33/60* (2013.01); *H01L 33/62* (2013.01); *H01L 2221/68322* (2013.01); *H01L 2221/68354* (2013.01); *H01L 2221/68363* (2013.01); *H01L 2221/68381* (2013.01); *H01L 2224/0401* (2013.01); *H01L 2224/04105* (2013.01); *H01L 2224/08225* (2013.01); *H01L 2224/12105* (2013.01); *H01L 2224/16227* (2013.01); *H01L 2224/16237* (2013.01); *H01L 2224/24137* (2013.01); *H01L 2224/32225* (2013.01); *H01L 2224/32235* (2013.01); *H01L 2224/80004* (2013.01); *H01L 2224/80006* (2013.01); *H01L 2224/80385* (2013.01); *H01L 2224/80907* (2013.01); *H01L 2224/81385* (2013.01); *H01L 2224/83002* (2013.01); *H01L 2224/83005* (2013.01); *H01L 2224/83385* (2013.01); *H01L 2224/83907* (2013.01); *H01L 2224/92* (2013.01); *H01L 2224/9202* (2013.01); *H01L 2224/96* (2013.01); *H01L 2224/97* (2013.01); *H01L 2933/0016* (2013.01); *H01L 2933/0058* (2013.01); *H01L 2933/0066* (2013.01)

(56) References Cited

U.S. PATENT DOCUMENTS

| 2004/0262614 | A1 | 12/2004 | Hack |
| 2006/0102913 | A1 | 5/2006 | Park |
| 2007/0045620 | A1 | 3/2007 | Park |
| 2009/0302339 | A1 | 12/2009 | Yamazaki |
| 2011/0216272 | A1 | 9/2011 | Yoshida |
| 2013/0130440 | A1 | 5/2013 | Hu |
| 2013/0157438 | A1 | 6/2013 | Maeda |
| 2013/0214302 | A1 | 8/2013 | Yeh |
| 2014/0151678 | A1 | 6/2014 | Sakuma |
| 2014/0333683 | A1 | 11/2014 | Qi |
| 2014/0361265 | A1 | 12/2014 | Liu |
| 2014/0367633 | A1 | 12/2014 | Bibl |
| 2014/0367711 | A1* | 12/2014 | Bibl ................ H01L 24/24 257/89 |
| 2015/0060820 | A1 | 3/2015 | Takagi |
| 2015/0144974 | A1 | 5/2015 | Chen |
| 2015/0228513 | A1 | 8/2015 | Parkhe |
| 2016/0064363 | A1 | 3/2016 | Bower |

FOREIGN PATENT DOCUMENTS

| CA | 2890398 A1 | 11/2016 |
| CN | 103904073 | 7/2014 |
| EP | 1750308 A2 | 2/2007 |
| WO | WO 1997/023903 A1 | 7/1997 |
| WO | WO 2002/084631 A1 | 10/2002 |
| WO | WO 03/088359 A1 | 10/2003 |
| WO | WO 2014/165151 A1 | 10/2014 |
| WO | 2015/081289 | 6/2015 |

OTHER PUBLICATIONS

International Search Report and Written Opinion for International Application No. PCT/IB2016/050307, dated May 4, 2016 (7 pages).
International Search Report and Written Opinion for International Application No. PCT/IB2017/051297, dated May 17, 2017 (7 pages).

* cited by examiner

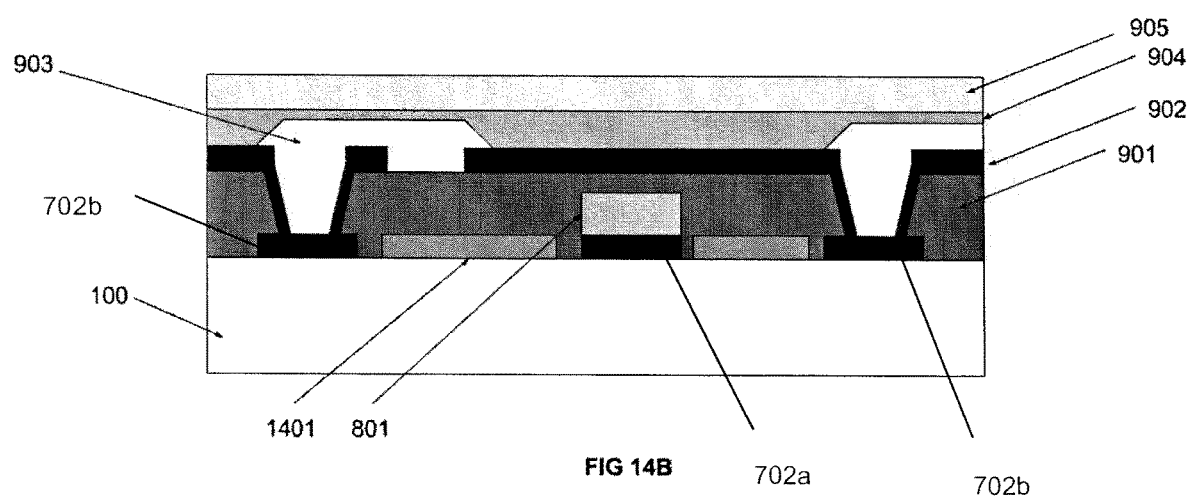

MICRO DEVICE INTEGRATION INTO SYSTEM SUBSTRATE

CROSS REFERENCE TO RELATED APPLICATIONS

This application is a continuation-in-part of, and claims priority from, U.S. application Ser. No. 15/060,942, filed Mar. 4, 2016 (3USP1), which is a continuation-in-part and claims priority from U.S. application Ser. No. 15/002,662, filed Jan. 21, 2016 (3USPT), which claims priority from Canadian Application No. 2,890,398, filed May 4, 2015 (129CAPL), Canadian Application No. 2,883,914, filed Mar. 4, 2015 (128CAPL), Canadian Application No. 2,880,718, filed Jan. 28, 2015 (127CAPL), Canadian Application No. 2,879,465, filed Jan. 23, 2015 (125CAPL), and Canadian Application No. 2,879,627, filed Jan. 23, 2015 (99CAPL), each of which is hereby incorporated by reference herein in its entirety. This application also claims priority to Canadian Application No. 2,936,473, filed Jul. 19, 2016 (14CAPL), which is hereby incorporated by reference herein in its entirety.

TECHNICAL FIELD

The present disclosure relates to the integration of transferred micro device systems onto a receiver substrate. More specifically, the present disclosure relates to the post processing steps for enhancing the performance of micro devices after transferring into a receiver substrate including the development of optical structure, the integration of electro-optical thin film devices, the addition of color conversion layers, and the proper patterning of devices on a donor substrate.

BACKGROUND

An object of the present invention is to overcome the shortcomings of the prior art by providing a light emitting micro device and a thin film electro-optical light emitting device integrated on a same receiver substrate.

SUMMARY OF THE INVENTION

Accordingly, the present invention relates to an integrated optical system comprising a plurality of pixels, each pixel comprising:
a receiver substrate;
a light emitting micro device integrated on the receiver substrate;
a planarization or bank region surrounding the micro device; and
a thin-film light emitting electro-optical device, at least a portion of which is mounted on the planarization or bank region.

BRIEF DESCRIPTION OF THE DRAWINGS

The invention will be described in greater detail with reference to the accompanying drawings which represent preferred embodiments thereof, wherein:

FIG. 14B shows an example of a system substrate and an integrated micro device with two thin film electro-optical devices and a reflective layer on the receiver substrate.

DETAILED DESCRIPTION

Figure 1:
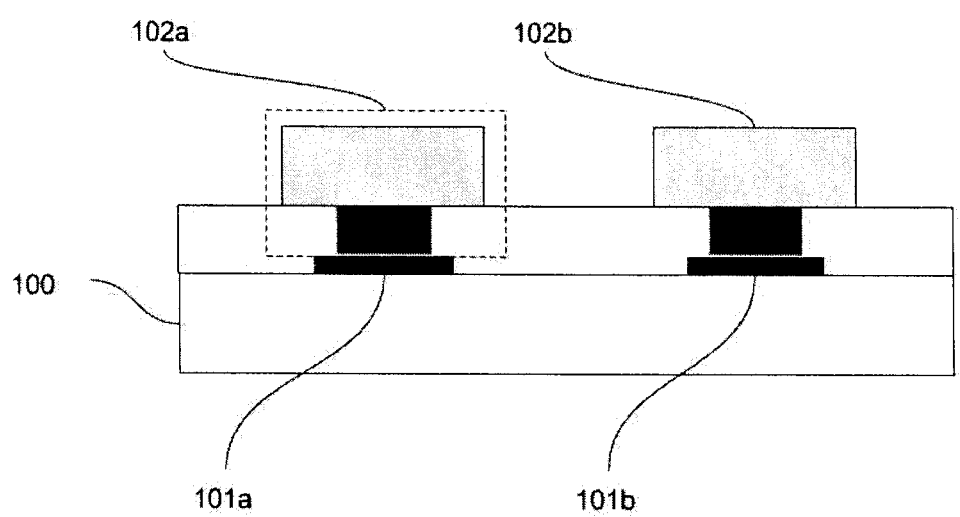
FIG. 1 shows a receiver substrate with contact pads, and an array of transferred micro-devices attached to the receiver substrate.

While the present teachings are described in conjunction with various embodiments and examples, it is not intended that the present teachings be limited to such embodiments. On the contrary, the present teachings encompass various alternatives and equivalents, as will be appreciated by those of skill in the art.

The process of developing a system based on micro devices comprises pre-processing the devices on a donor substrate (or a temporary substrate), transferring the micro devices from the donor to the receiver substrate, and post processing to enable device functionality. The pre-processing step may include patterning and adding bonding elements. The transfer process may involve bonding of a pre-selected array of micro devices to the receiver substrate followed by removing the donor substrate. Several different selective transfer processes have been already been developed for micro devices. After the integration of the micro devices into the receiving substrate, additional post processes may be performed to make required functional connections.

In this disclosure, emissive device is used to describe different integration and post processing methods. However, it is clear for one skill in the art that other devices such as sensors can be used in these embodiments. For example, in case of sensor micro devices, the optical path will be similar to emissive micro devices but in reverse direction.

Some embodiments of this disclosure are related to post-processing steps for improving the performance of the micro devices. For example, in some embodiments, the micro device array may comprise micro light emitting diodes (LEDs), Organic LEDs, sensors, solid state devices, integrated circuits, (micro-electro-mechanical systems) MEMS, and/or other electronic components. The receiving substrate may be, but is not no limited to, a printed circuit board (PCB), thin film transistor backplane, integrated circuit substrate, or, in one case of optical micro devices such as LEDs, a component of a display, for example a driving circuitry backplane. In these embodiments, in addition to interconnecting the micro devices, post processing steps for additional structure such as reflective layers, fillers, black matrix or other layers may be used to improve the out coupling of the generated LED light. In another example, dielectric and metallic layers may be used to integrate an electro-optical thin film device into the system substrate with the transferred micro devices.

In one embodiment, the active area of the pixel (or sub-pixel) is extended to be larger than the micro device by using fillers (or dielectric). Here, the filler is patterned to define the pixel's active area (the active area is the area that emits light or is absorbing input light). In another embodiment, reflective layers are used to confine the light within the active area.

In one embodiment, the reflective layer may be one of the micro device electrodes.

In another embodiment, the active area may comprise a few sub-pixels or pixels.

The active area can be larger, smaller, or the same size as the pixel (sub-pixel) area.

In another embodiment, thin film electro-optical devices are deposited into the receiver substrate after the micro devices are integrated into the receiver substrate.

In one embodiment, an optical path is developed for the micro device to emit (or absorb) light through all or some layers of the electro-optical device.

In another embodiment, the optical path for the micro device is not through all or some layers of the optoelectronic device.

In one embodiment, the optoelectronic device is a thin film device.

In another embodiment, the electrode of the electro-optical device is used to define the active area of the pixel (or sub-pixel).

In another embodiment, at least one of the electro-optical device electrodes is shared with the micro-device electrode.

In one embodiment color conversion material covers the surface and surrounds partially (or fully) the body of the micro device.

In one embodiment, the bank structure separates the color conversion materials.

In another embodiment color conversion material covers the surface (and/or partially or fully the body of) the active area.

In one embodiment, the micro devices on donor substrate are patterned to match the array structure in the receiver (system) substrate. In this case, all the devices in part (or all) of the donor substrate are transferred to the receiver substrate.

In another embodiment, VIAs are created in the donor substrate to couple the micro devices on the donor substrate with the receiver substrate.

In another embodiment, the donor substrate has more than one micro device types and at least in one direction the pattern of the micro device types on the donor substrate matches partially or fully the pattern of the corresponding areas (or pads) on the system substrate.

In another embodiment, the donor substrate has more than one micro device types and at least in one direction the pitch between different micro devices in donor substrate is a multiple of the pitch of the corresponding area (or pads) on the system substrate.

In another embodiment, the donor substrate has more than one micro device type. At least in one direction, the pitch between two different micro devices matches the pitch of the corresponding areas (or pads) on the receiver (or system) substrate.

In one embodiment, the pattern of different micro device types on the donor substrate creates a two dimensional array of each type where the pitch between each array of different types matches the pitch of the corresponding areas on the system substrate.

In another embodiment, the pattern of different micro device types on the donor substrate create a one dimensional array where the pitch of the arrays matches the pitch of the corresponding areas (or pads) on the system substrate.

FIG. 1 shows a receiver substrate 100, contact pads 101*a* and 101*b*, and micro devices 102*a* and 102*b*, being in an array attached to the receiver substrate 100. The contact pads 101*a* and 101*b* onto which the micro devices 102*a* and 102*b* have been transferred, are located in an array parallel to and mounted on the receiver substrate 100. The micro devices 102*a* and 102*b* are transferred from a donor substrate and bonded to the contact pads 101*a* and 101*b*. The micro devices 102*a* and 102*b* may be any micro device that may typically be manufactured in planar batches, including but not limited to LEDs, OLEDs, sensors, solid state devices, integrated circuits, MEMS, and/or other electronic components.

Figure 2A:
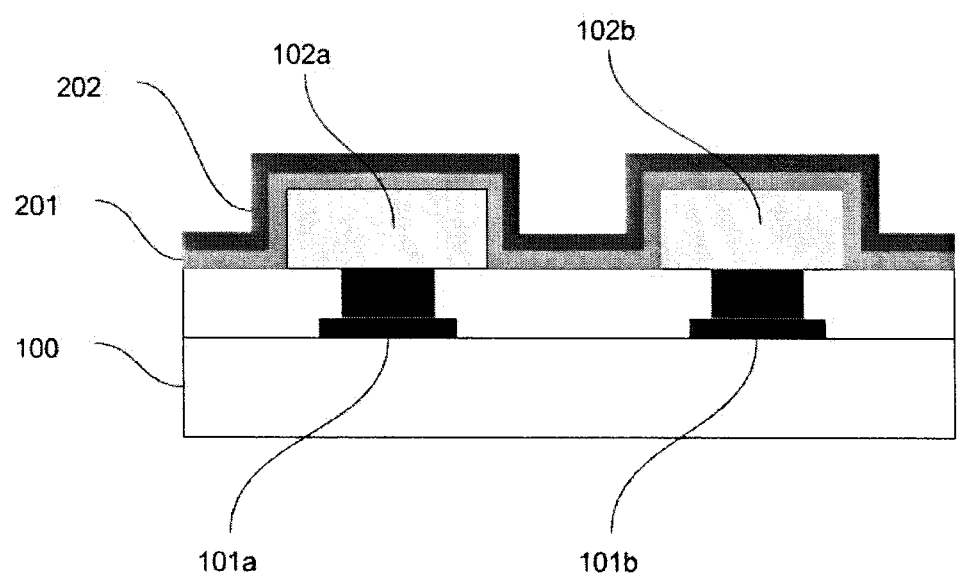
FIG. 2A shows a receiver substrate with contact pads, an array of transferred micro-devices attached to the receiver substrate, and conformal dielectric and reflective layers on top.

As depicted in FIG. 2A, in one embodiment where the micro devices 102a and 102b are micro LEDs, a conformal dielectric layer 201 and a reflective layer 202 may be formed over the bonded micro LEDs 102a and 102b. In some embodiments, the conformal dielectric layer 201 is approximately 0.1-1 μm thick, and may be deposited by any of a number of different thin film deposition techniques. The conformal dielectric layer 201 isolates the sidewalls of the micro LEDs 102a and 102b from the reflective layer 202. In addition, the dielectric layer 201 passivates and protects the sidewalls of the micro LEDs 102a and 102b. The conformal dielectric layer 201 may also cover the top surface of the receiver substrate 100 between adjacent micro LED devices 102a and 102b. The conformal reflective layer 202 may be deposited over the dielectric layer 201. The reflective layer 202 may be a single layer or made up of multiple layers. A variety of conductive materials may be used as the reflective layer 202. In some embodiments, the conformal reflective layer 202 may be a metallic bilayer with a total thickness up to 0.5 μm.

Figure 2B:
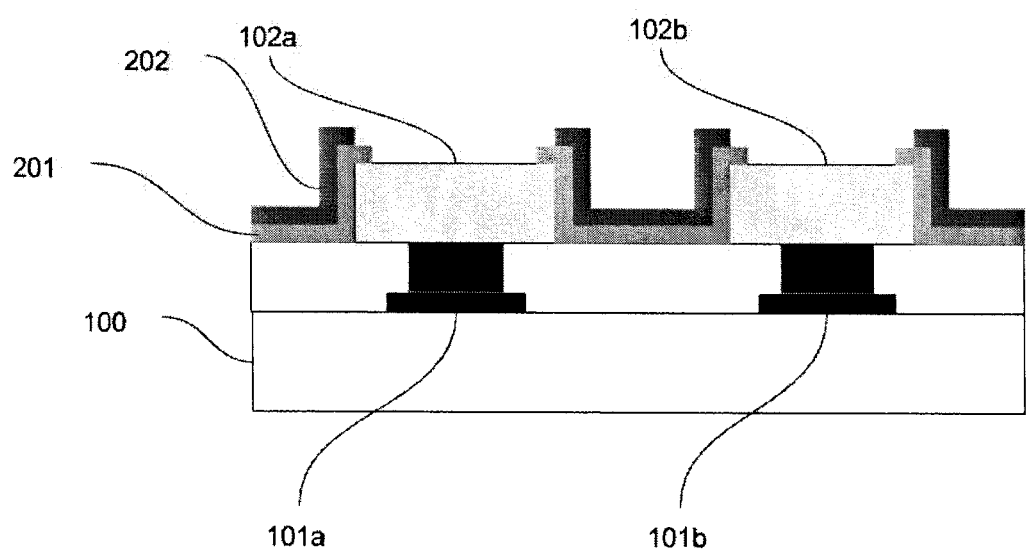
FIG. 2B shows a receiver substrate with contact pads, an array of transferred micro-devices attached to the receiver substrate, and patterned conformal dielectric and reflective layers.
Figure 2C:
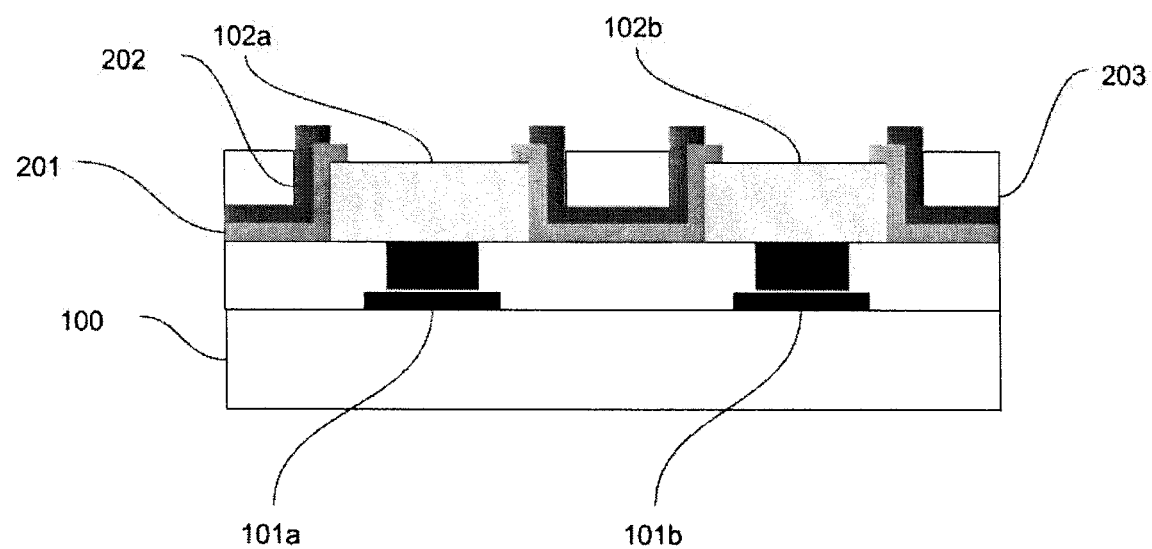
FIG. 2C shows a receiver substrate with contact pads, an array of transferred micro-devices attached to the receiver substrate, patterned conformal dielectric and reflective layers, and a black matrix layer formed between adjacent micro-devices.

Referring to FIG. 2B, the dielectric layer 201 and the reflective layer 202 may then be patterned by using for example lithographic patterning and etching to partially expose the top surface of micro LEDs 102a and 102b. In one embodiment where the micro LEDs 102a and 102b are integrated into a backplane of a display system, referring also to FIG. 2C, a black matrix 203 may be formed between adjacent micro LEDs 102a and 102b, and on the reflective layer 202 to reduce the reflection of the ambient light. In one example the black matrix 203 may be a layer of resins, such as polyimide or polyacrylic, in which particles of black pigment, such as carbon black, have been dispersed. In some embodiments, the thickness of the black matrix layer 203 may be 0.01-2 μm. The black matrix layer 203 may be patterned and etched so as to expose the top surface of the micro LEDs 102a and 102b as shown in FIG. 2C. Optionally, the thickness of the black matrix 203 may be engineered to planarize the integrated substrate 100. In another embodiment, a planarization layer, which may be made of organic insulating material, is formed and patterned to planarize the backplane substrate.

Figure 3A:
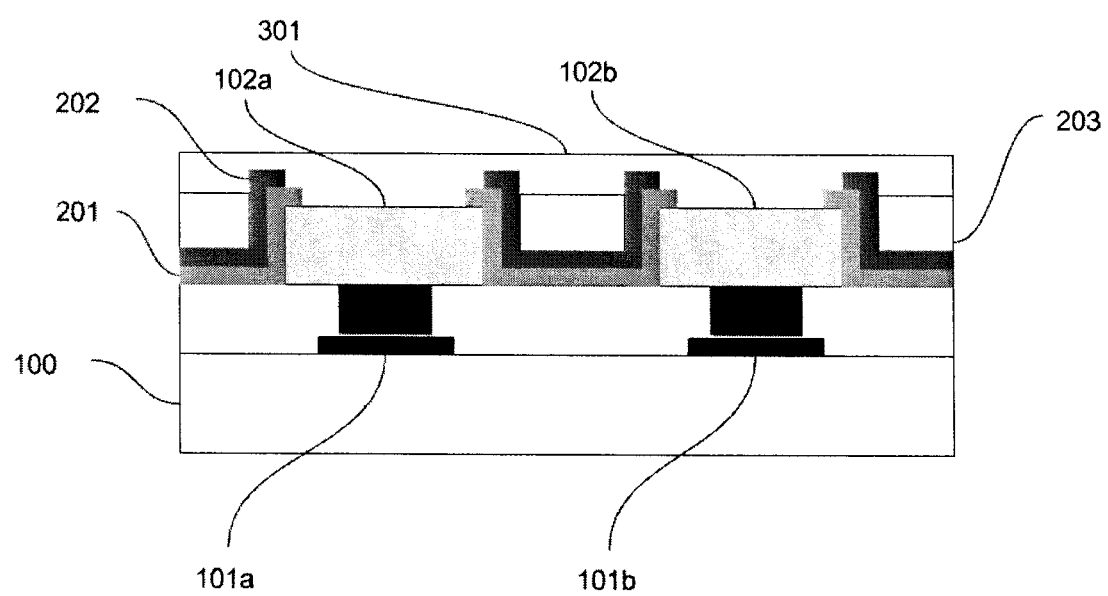
FIG. 3A shows a receiver substrate with contact pads, an array of transferred micro-devices attached to the receiver substrate, patterned conformal dielectric and reflective layers, a black matrix layer, and a transparent conductive layer deposited on the substrate.

Referring to FIG. 3A, a transparent conductive layer 301 may be conformally deposited over the substrate 100, covering the black matrix 203 and the top surface of micro LEDs 102a and 102b. In some embodiments, the transparent electrode 301 may be 0.1-1 um thick layers of oxides, including but not limited to indium tin oxide (ITO) and Aluminum doped Zinc Oxide. In a case where the integrated assembly is a display structure, the transparent electrode 301 may be the common electrode of the micro LED devices 102a and 102b.

Optionally, the reflective layer 202 may be used as a conductivity booster for the transparent electrode 301. In this case, part of the reflective layer 202 may not be covered with the black matrix 203, or other planarization layers, so that the transparent electrode layer 301 may connect to the reflective layer 202.

Figure 3B:
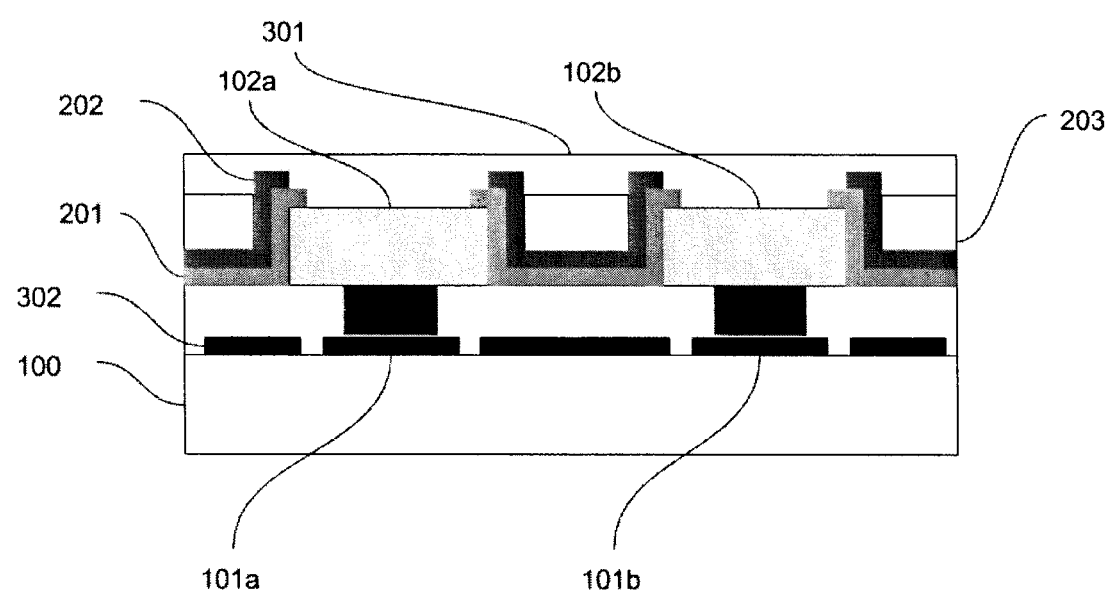
FIG. 3B shows a receiver substrate with an integrated array of transferred micro-devices attached to the receiver substrate and optical reflective components for light outcoupling enhancement.

In another embodiment shown in FIG. 3B, a reflective or other type of optical component 302 may be formed on the substrate 100 to enhance out-coupling of light produced by the micro device 102a and 102b. The common contact 301 is transparent to allow light output through this layer. These structures may be referred as top emission structures.

Figure 3C:
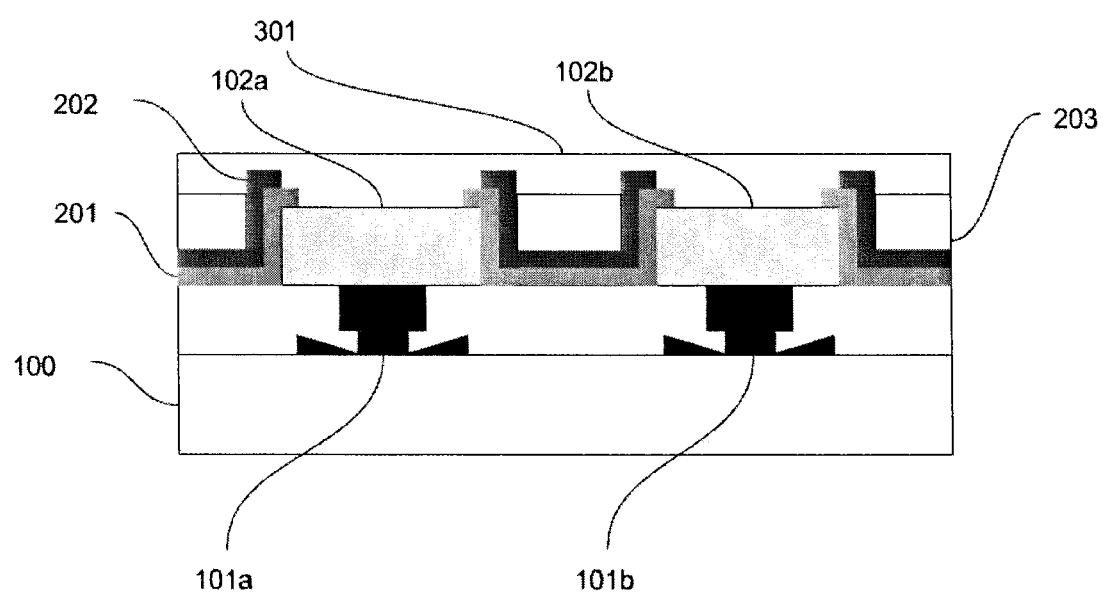
FIG. 3C shows a receiver substrate with an integrated array of transferred micro-devices attached to the receiver substrate and concave contact pads for light outcoupling enhancement.

Referring to FIG. 3C, the contact pads 101a and 101b may be formed to have a concave or other shaped structure to enhance the out-coupling of light produced by micro-devices 102a and 102b. The form of the contact pads 101a and 101b is not limited to the concave form and may have other forms depending on the micro device light emission characteristics.

Figure 3D:
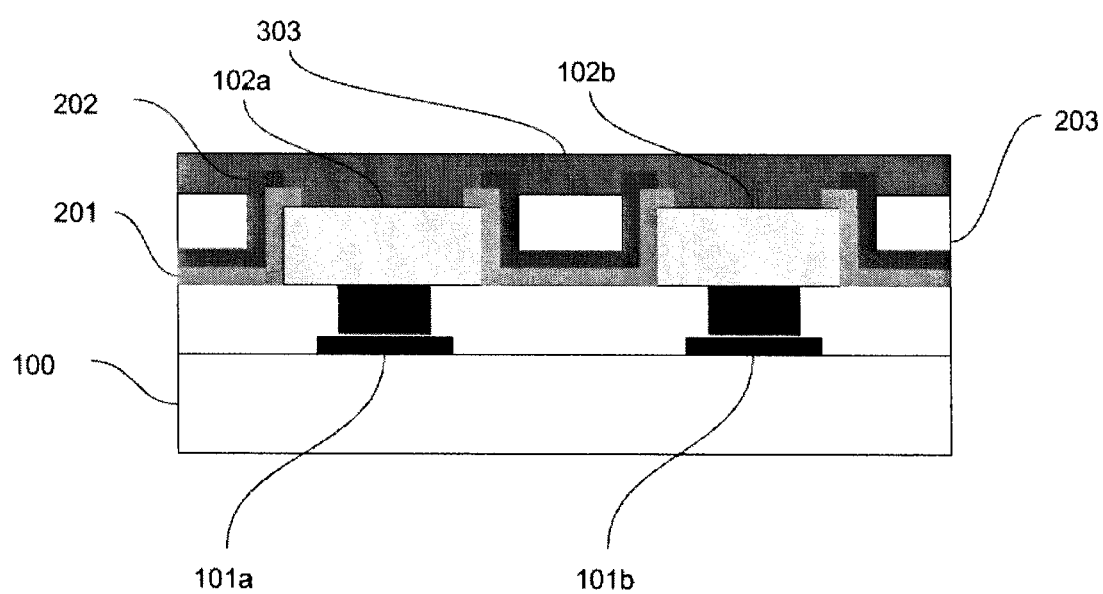
FIG. 3D shows a receiver substrate with an integrated array of transferred micro-devices attached to the receiver substrate in a bottom emission configuration.

In an embodiment, referring to FIG. 3D, the structure is designed to output light from the substrate 100. In these bottom emission structures, the substrate 100 may be transparent and the common electrode 303 is designed to be reflective for better light extraction.

Figure 3E:
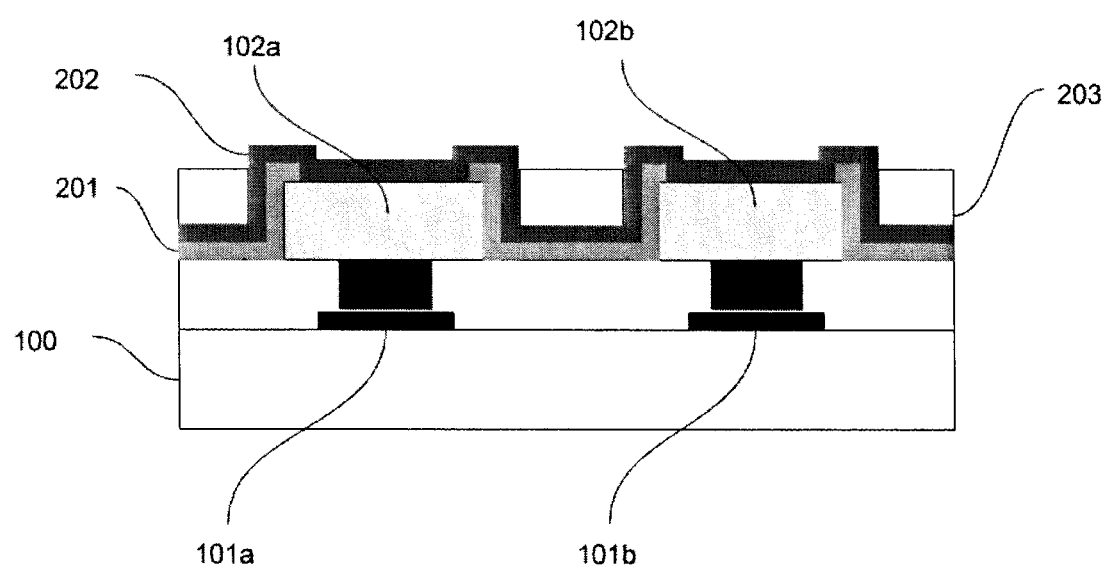
FIG. 3E shows a receiver substrate with an integrated array of transferred micro-devices attached to the receiver substrate.

In another embodiment shown in FIG. 3E, the reflective layer 202 may be extended to cover the micro devices 102a and 102b, and act as the common top electrode as well.

Figure 4A:
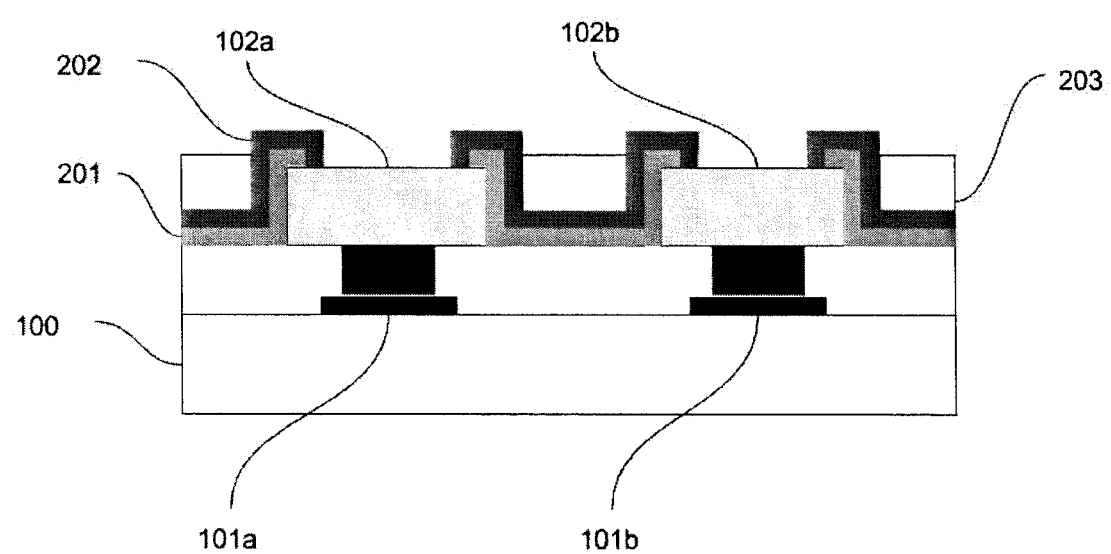
FIG. 4A shows a receiver substrate with transferred micro-devices, a conformal dielectric layer, and a connected reflective layer.

Referring to FIG. 4A, in another embodiment, the dielectric layer 201 may be deposited and patterned before forming the reflective layer 202, which may allow a direct contact between micro LEDs 102a and 102b, and the reflective layer 202. Accordingly the reflective layer 202 may be used as a common top contact for the micro devices 102a and 102b. The black matrix 203 or alternatively a planarization layer may be used.

Figure 4B:
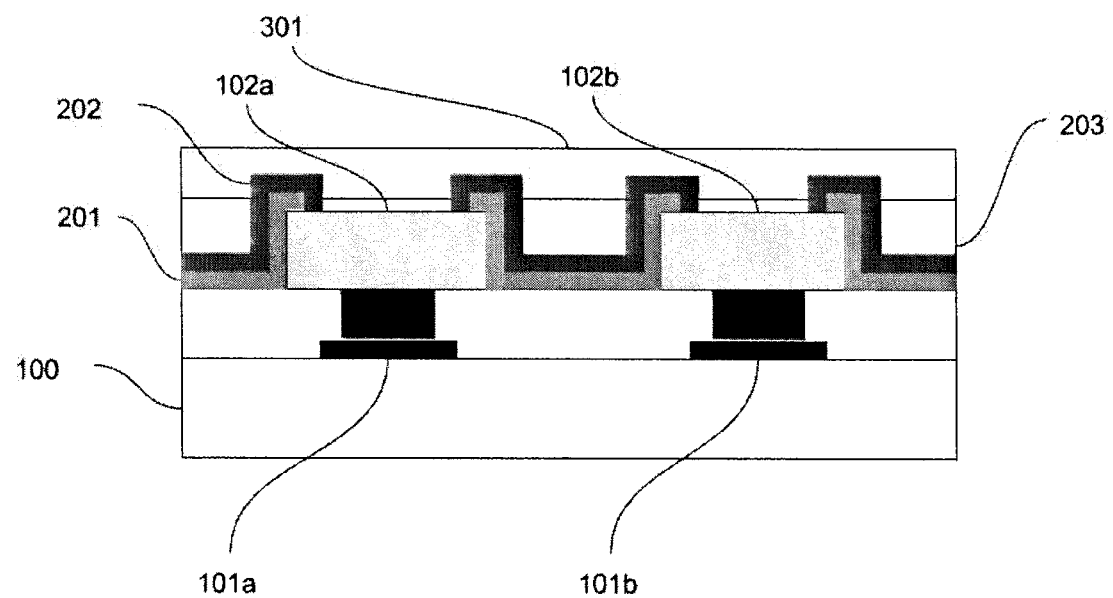
FIG. 4B shows a receiver substrate with transferred micro-devices, conformal dielectric layer, connected reflective layer, and a transparent conductive layer deposited on the substrate.

Referring to FIG. 4B, in other embodiments, a common transparent electrode 301 or/and other optical layers may be deposited on top of the substrate 100 to enhance conductivity and/or light out coupling.

Figure 5:
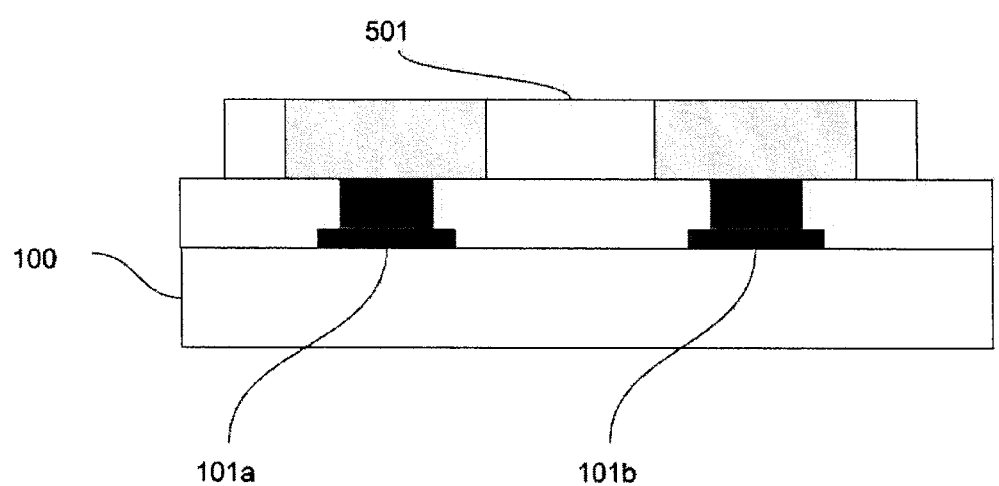
FIG. 5 shows a receiver substrate with transferred micro-devices and a patterned filler which defines the pixels (or sub-pixels).

One of the main challenges with micro optoelectronic devices is the empty space between adjacent micro devices 102a and 102b. Display systems with this structural characteristic may create an image artifact called the "screen door effect". In one embodiment, the micro device sizes may be optically extended to be the same or larger than the micro device size. In one embodiment shown in FIG. 5, after transferring the array of micro devices 102a and 102b from the donor to the receiver substrate 100, a transparent filler 501 may be deposited and patterned to define the pixel (or sub-pixel). In one example, the size of the filler 501 may be the smaller or the maximum size possible in a pixel (or sub-pixel) area. In another example, the filler 501 size may be larger than the pixel or sup-pixel area. The filler 501 may have a different or a similar shape as the pixel area on the system substrate 100. The processes mentioned in FIG. 3 and FIG. 4 may then be applied to improve the light extraction from the micro devices 102a and 102b.

Figure 6A:
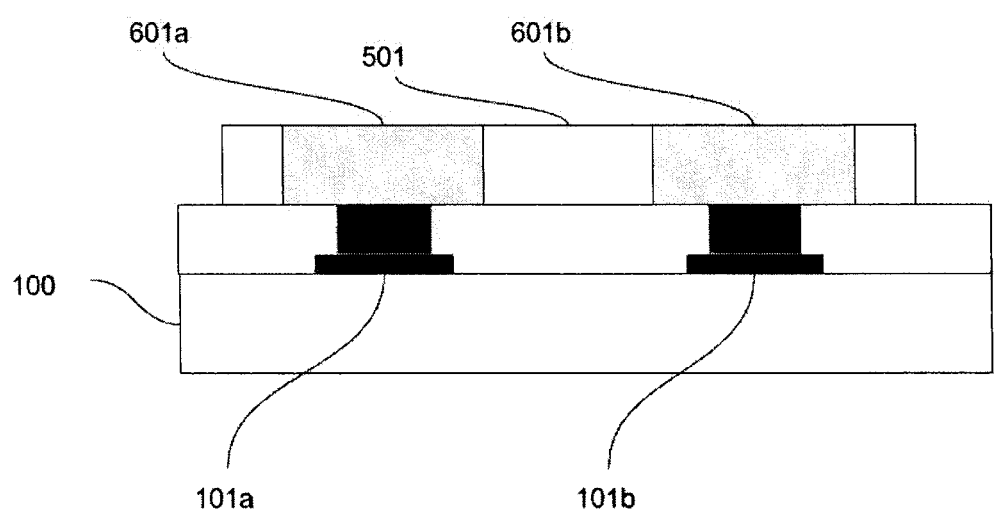
FIG. 6A shows a pixelated filler structure covering all sub-pixels in at least one pixel (for example covering both sub-pixels for a pixel made of two sub-pixels).
Figure 6B:
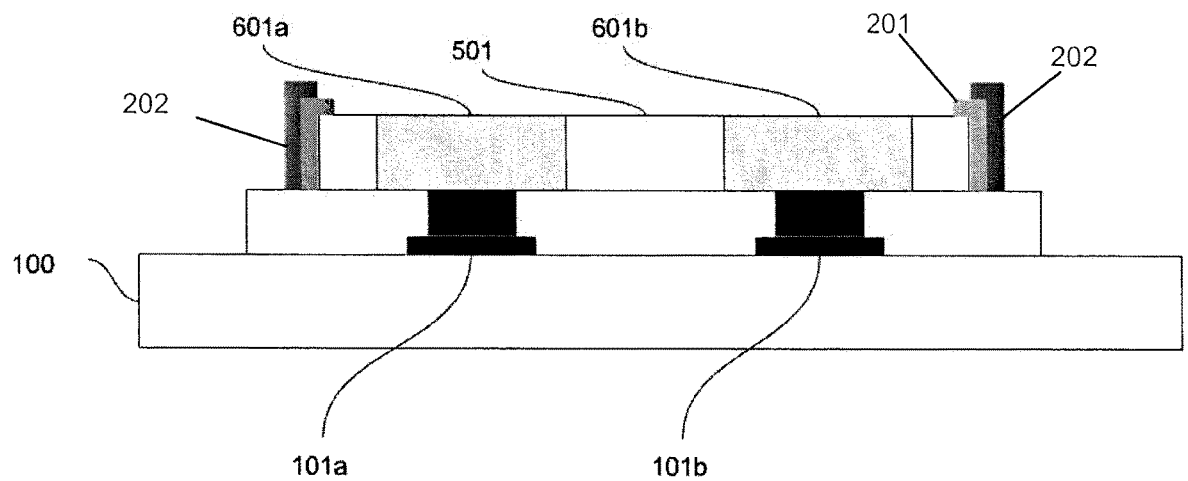
FIG. 6B shows a pixel made of two sub-pixels, a filler layer which is patterned to define the pixel, and patterned conformal dielectric and reflective layers around the pixel.
Figure 6C:
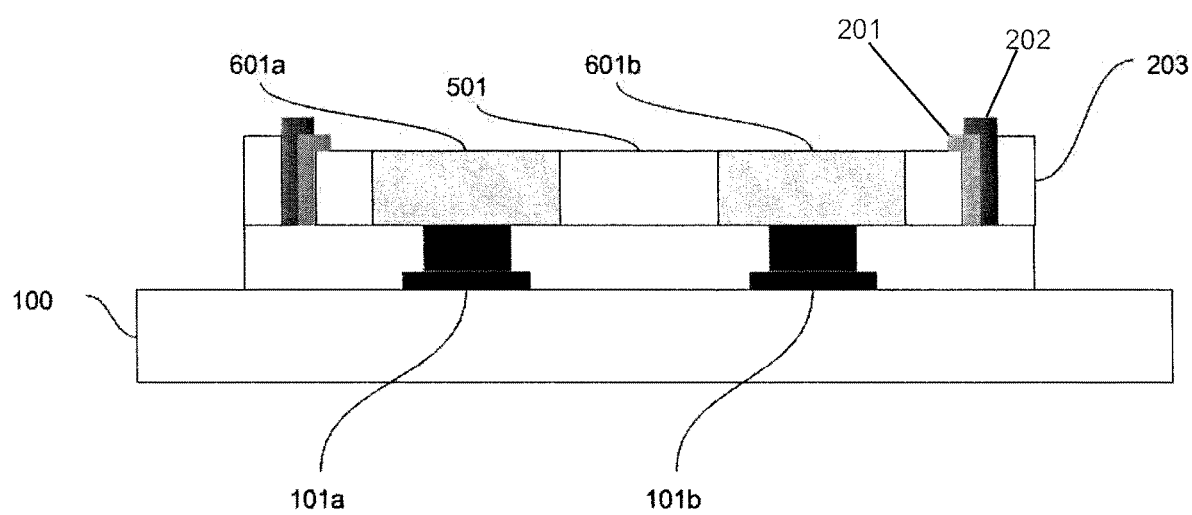
FIG. 6C shows a pixel made of two sub-pixels, a filler layer which is patterned to define the pixel, patterned conformal dielectric and reflective layers around the pixel, and a black matrix layer wrapped around the pixel.
Figure 6D:
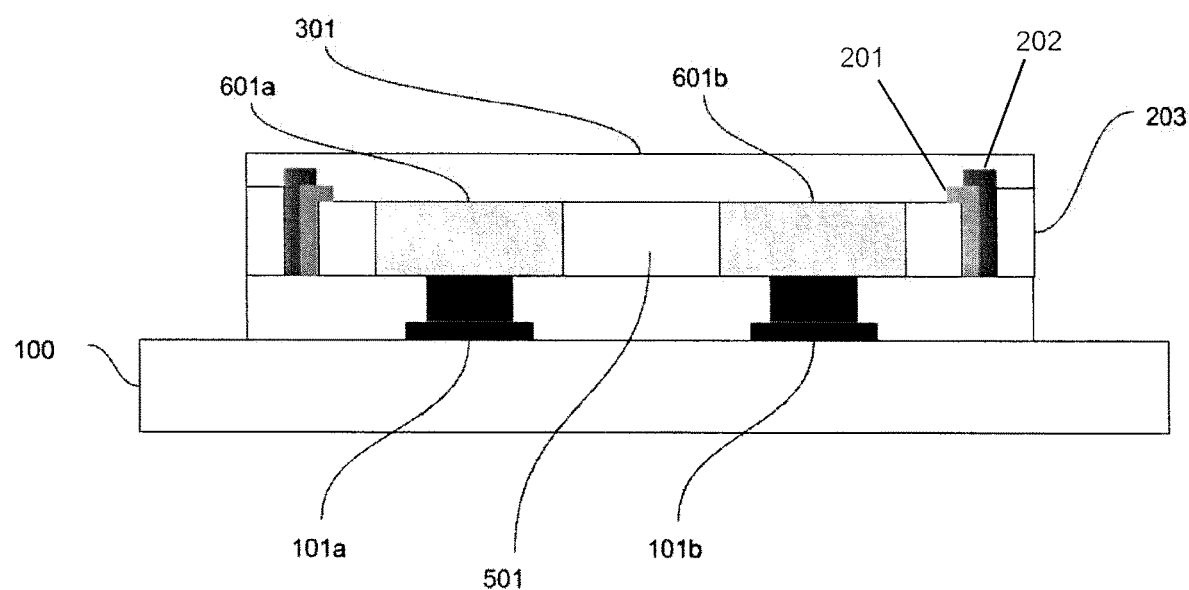
FIG. 6D shows a pixel made of two sub-pixels, a filler layer which is patterned to define the pixel, patterned conformal dielectric and reflective layers around the pixel, a black matrix layer wrapped around the pixel, and a transparent conductive layer deposited on the substrate.

Referring to FIG. 6A, in an embodiment where the pixel 601 is comprised of two sub-pixels 601a and 601b, the filler 501 is patterned to define the active area of the pixel 601 (active area being defined as the area from which the display emits light). Here, the active area can be smaller, larger, or the same size as the pixel (or sub-pixel) area. As shown in FIG. 6B, FIG. 6C, and FIG. 6D processes mentioned in FIG. 2 and FIG. 3 may be applied. This configuration manages the discoloration at the edges due to the separation between sub-pixels 601a and 601b.

Referring to FIG. 6B, a dielectric layer 201 and a reflective layer 202 may be formed around over pixel 601.

Referring also to FIG. 6C, a black matrix 203 may be formed between adjacent pixels 601 and around each sub-pixel 601a and 601b to reduce the reflection of the ambient light.

Referring to FIG. 6D, a transparent conductive layer 301 may be deposited on top of the substrate 100, covering the black matrix 203 and the top surface of micro LEDs 601a and 601b.

Figure 6E:
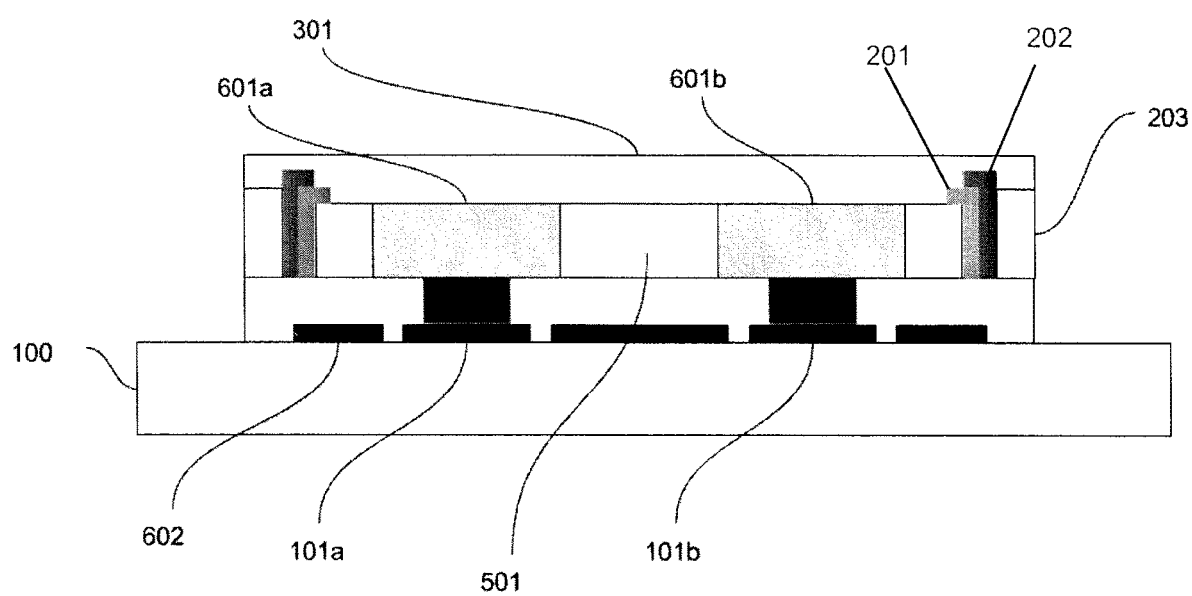
FIG. 6E shows a pixel made of two sub-pixels with reflective optical components on the receiver substrate for better light outcoupling.

In another embodiment shown in FIG. 6E, reflective or other optical components 602 may be formed on the substrate 100 to enhance out-coupling of light produced by the micro device 601*a* and 601*b*. The common contact 301 is transparent for the light to output through this layer. These structures may be referred to as top emission structures.

Figure 6F:
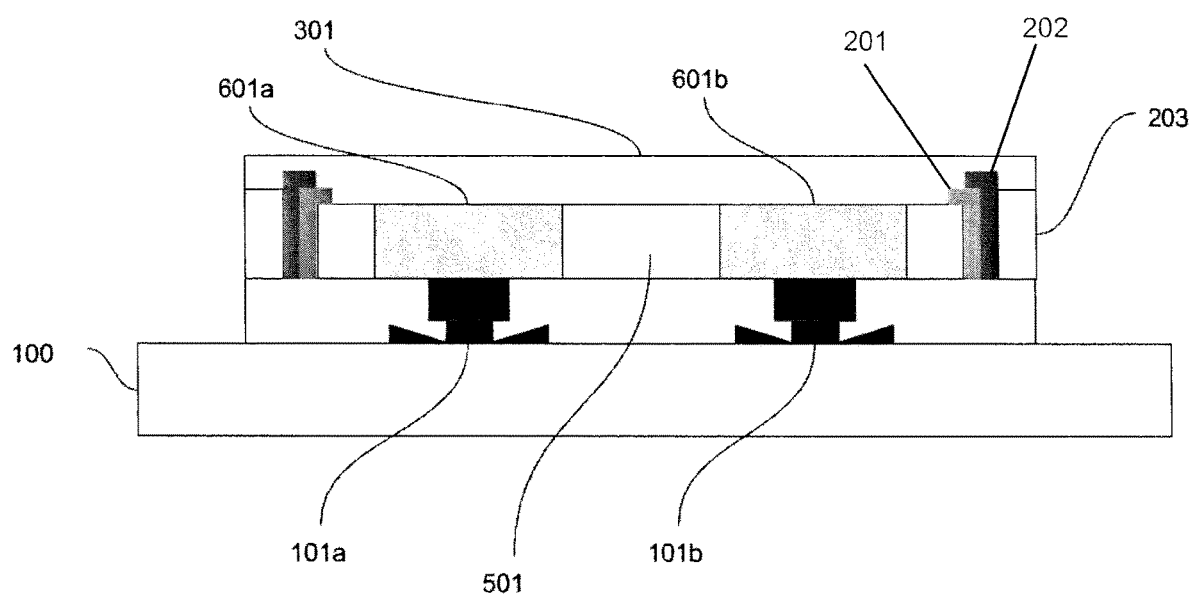
FIG. 6F shows a pixel made of two sub-pixels with concave contact pads on the receiver substrate.

Referring to FIG. 6F, the contact pads 101*a* and 101*b* may be formed to have a concave structure to enhance the out-coupling of light produced by micro-devices 101*a* and 101*b*. The form of the contact pads 101*a* and 101*b* is not limited to the concave form and may have other forms depending on the micro device light emission characteristics.

Figure 6G:
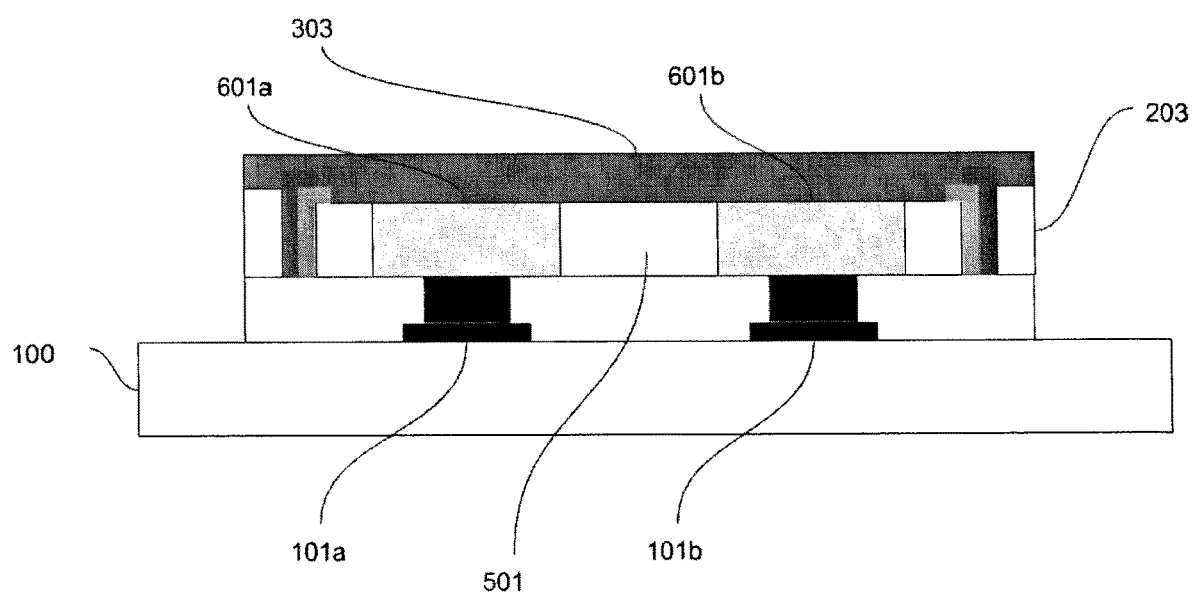
FIG. 6G shows a pixel made of two sub-pixels with a bottom emission configuration.

Referring to FIG. 6G, in another embodiment, the structure is designed to output light from the substrate 100. In these bottom emission structures, the substrate 100 may be transparent and the common electrode 303 may be comprised a reflective material for better light extraction.

Figure 6H:
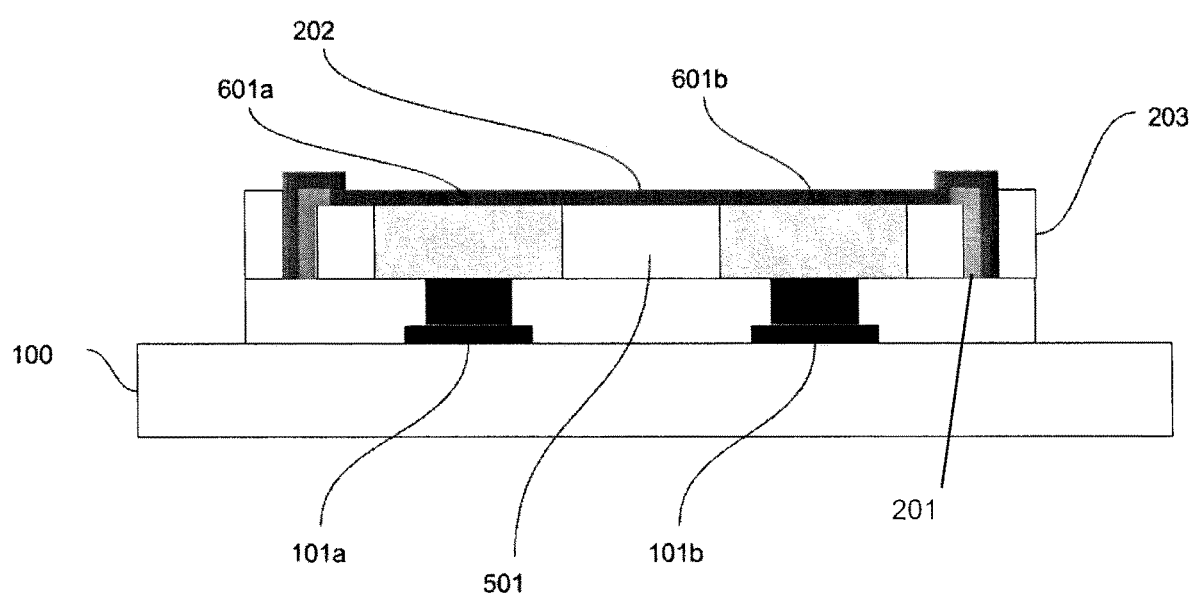
FIG. 6H shows a pixel made of two sub-pixels with a bottom emission configuration, a common top electrode, and side reflectors.

In another embodiment shown in FIG. 6H, the reflective layer 202 may be extended to cover the micro devices 601*a* and 601*b*, and act as the common top electrode as well.

In other embodiments, the aforementioned pixel definition structure can cover more than one pixel (or sub-pixel) 601*a* and 601*b*.

In another case, a reflective layer or the contact pads 101*a* and 101*b* on the receiving substrate 100 may be used to cover the receiving substrate 100 and create a reflective area before transferring the micro devices 601*a* and 601*b* for better light out coupling.

In all aforementioned embodiments, the reflective layer can also be opaque. In addition, the reflective layers can be used as one of the electrodes for the micro device 601*a* and 601*b* or as one of the system substrate connections (electrode, signal, or power line). In another embodiment, the reflective layer can be used as a touch electrode. The reflective layers can be patterned to act as a touch screen electrode. In one case, they can be patterned in vertical and horizontal directions to form the touch screen crossing electrode. In this case, one can use a dielectric between vertical and horizontal traces.

Hybrid Structures

In another embodiment, a thin film electro-optical device 904 is integrated into the receiver substrate 100 after an array of micro devices 801 have been transferred to the receiver substrate 100.

Figure 7:
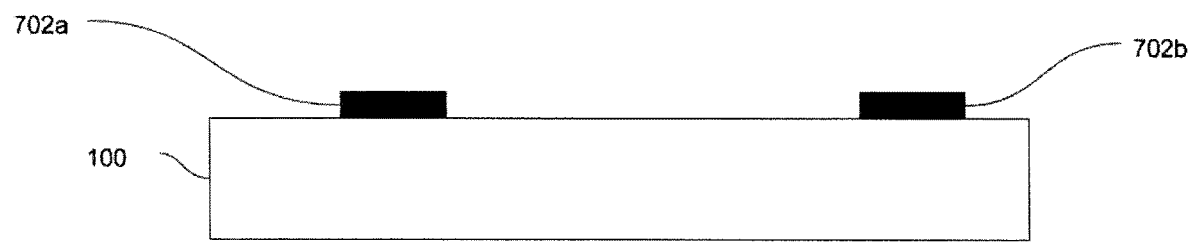
FIG. 7 shows a receiver substrate with two contact pads.

FIG. 7 illustrates the receiver substrate 100 and lower electrode contact or bonding pads 702*a* and 702*b* upon which the array of micro devices 801 are transferred, and into which a thin film electro-optical device 904 is integrated in a number of hybrid structure embodiments.

Figure 8:
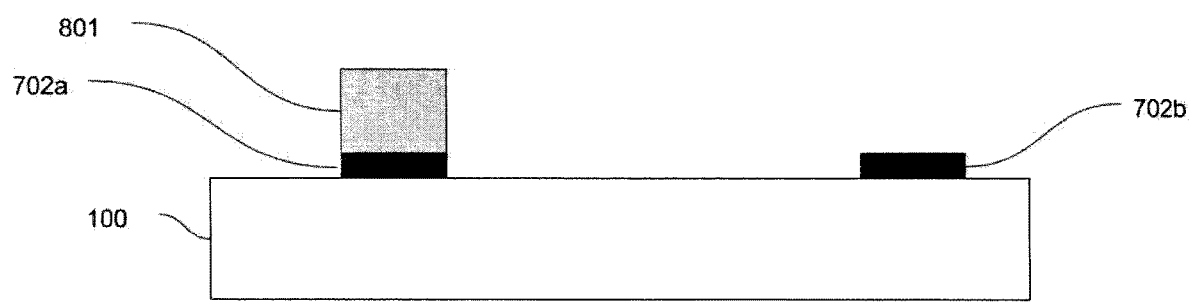
FIG. 8 shows a receiver substrate with a transferred micro device bonded to one of the contact pads.
Figure 9:
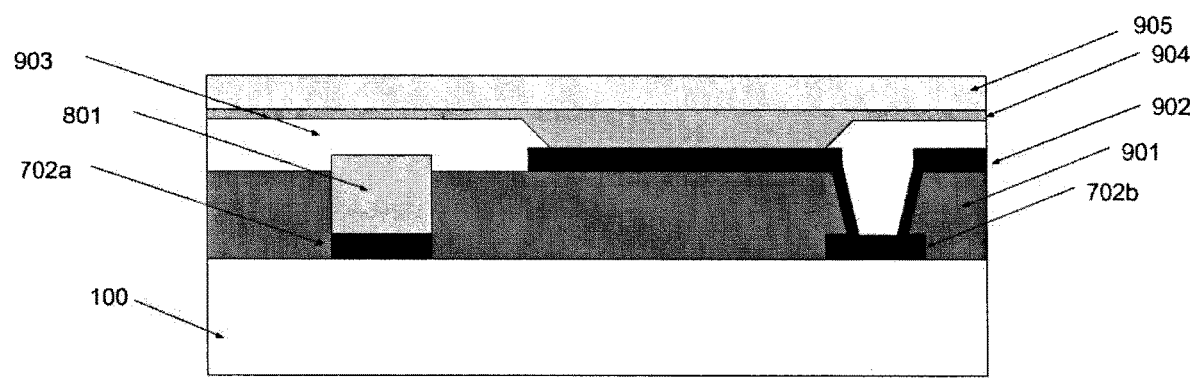
FIG. 9 shows the integration of a transferred micro-device with an electro-optical thin film device in a hybrid structure.

Referring to FIG. 8, one of the micro devices 801 may be transferred and bonded to the bonding pad 702*a* of the receiver substrate 100. In one case, as shown in FIG. 9, a dielectric layer 901 may be formed over the receiver substrate 100 to cover the exposed electrodes 702*a* and 702*b* and any other conductive layers. Lithography and etching may be used to pattern the dielectric layer 901. A conductive layer 902 is then deposited and patterned to form a bottom electrode of the thin film electro-optical device 904. If there is no risk of unwanted coupling between the bottom electrode 902 and other conductive layers in the receiver substrate 100, the dielectric layer 901 may be eliminated. However, the dielectric layer 901 can act as a planarization layer as well to offer better fabrication of the electro-optical devices 904.

Still referring to FIG. 9, a bank layer 903 may be deposited on the receiver substrate 100, e.g. over the dielectric layer 901 and the micro device 801, to cover the edges of the bottom electrode 902 and the micro device 801. The thin film electro-optical device 904 may then be formed over the bank layer 903 and the bottom electrode 902 structures. Organic LED (OLED) devices are an example of such a thin film electro-optical device 904, which may be formed using different techniques, such as but not limited to shadow mask, lithography, and printing patterning. Finally, a top electrode 905 of the electro-optical thin film device 904 is deposited and patterned if needed.

In an embodiment in which the thickness of the micro devices' 801 is significantly high, cracks or other structural problems may occur within the bottom electrode 902. In these embodiments, a planarization layer 903 may be used in conjunction with or without the dielectric layer 901 to address this issue.

Figure 10:
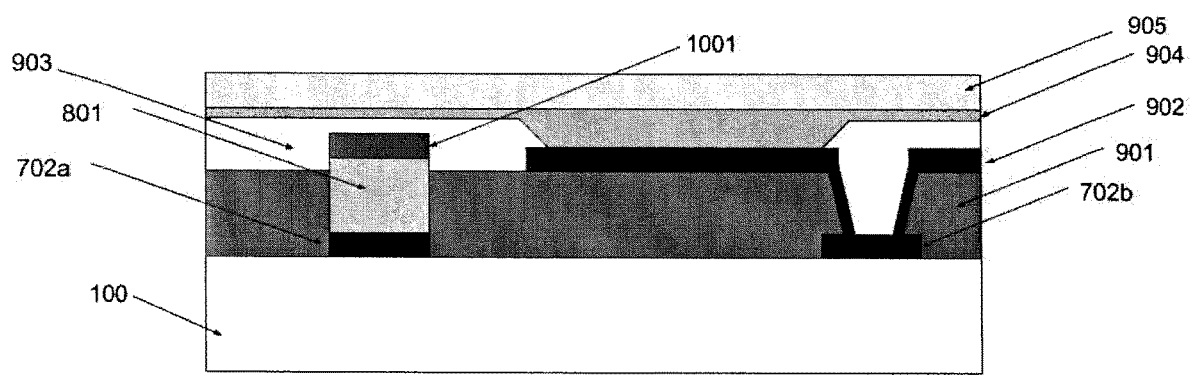
FIG. 10 shows another example of an integration of a transferred micro-device with an electro-optical thin film device in a hybrid structure.

In another embodiment shown in FIG. 10, the micro device 801 may have an upper device electrode 1001. The upper device electrode 1001 may be common between other micro devices 801 in or on the system substrate 100. In this case, the planarization layer 901 (if present) and/or the bank structure 903 covers the upper device electrode 1001 to insulate the upper electrode 1001 from the electro-optical thin film device 904 and the top and bottom electrodes 902 and 905, to avoid any shorts between the electro-optical device 904 and device electrode 1001.

Figure 11:
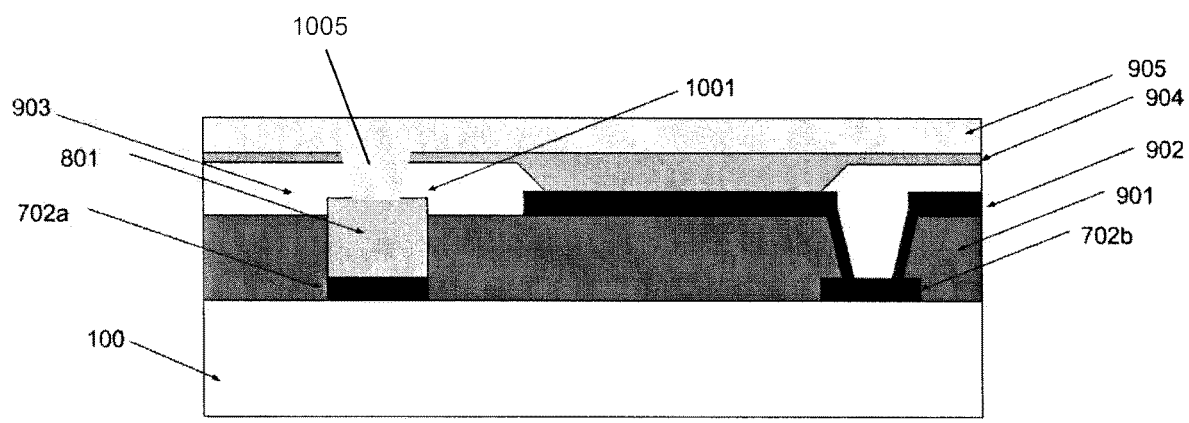
FIG. 11 shows an example of the integration of a transferred micro-device with an electro-optical thin film device in a hybrid structure with a common top electrode.

Referring to FIG. 11, in one embodiment, the top electrode 905 of the thin film electro-optical device 904 may be connected to the micro device 801 through an opening 1005 in the bank (planarization) layer 903 and the electro-optical thin-film device 904. In this case, the electro-optical thin-film device 904 may be formed selectively so that it is not covering the opening 1005.

In another case, the lower electrode 702*a* of the micro device 801 may be shared between the thin film electro-optical device 904 and the transferred micro device 801.

Figure 12:
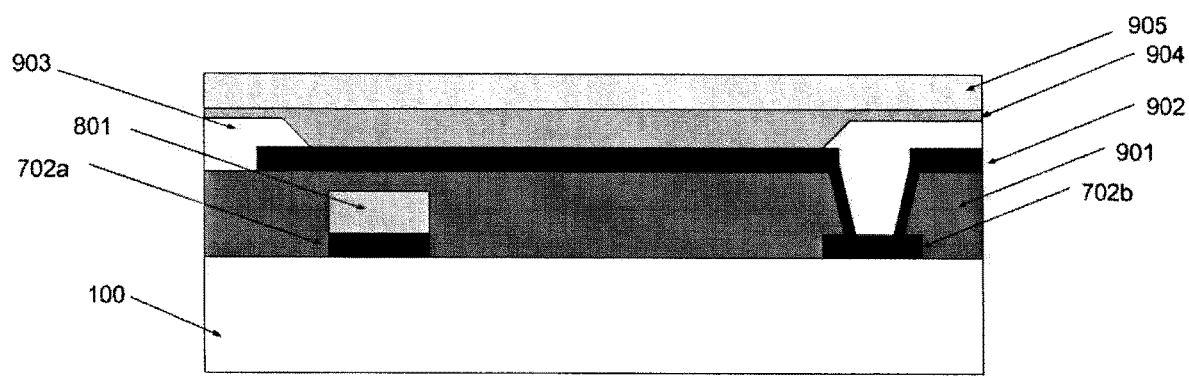
FIG. 12 shows an embodiment for the integration of a transferred micro-device with an electro-optical thin film device in a dual surface hybrid structure with both top and bottom transparent electrodes.
Figure 13A:
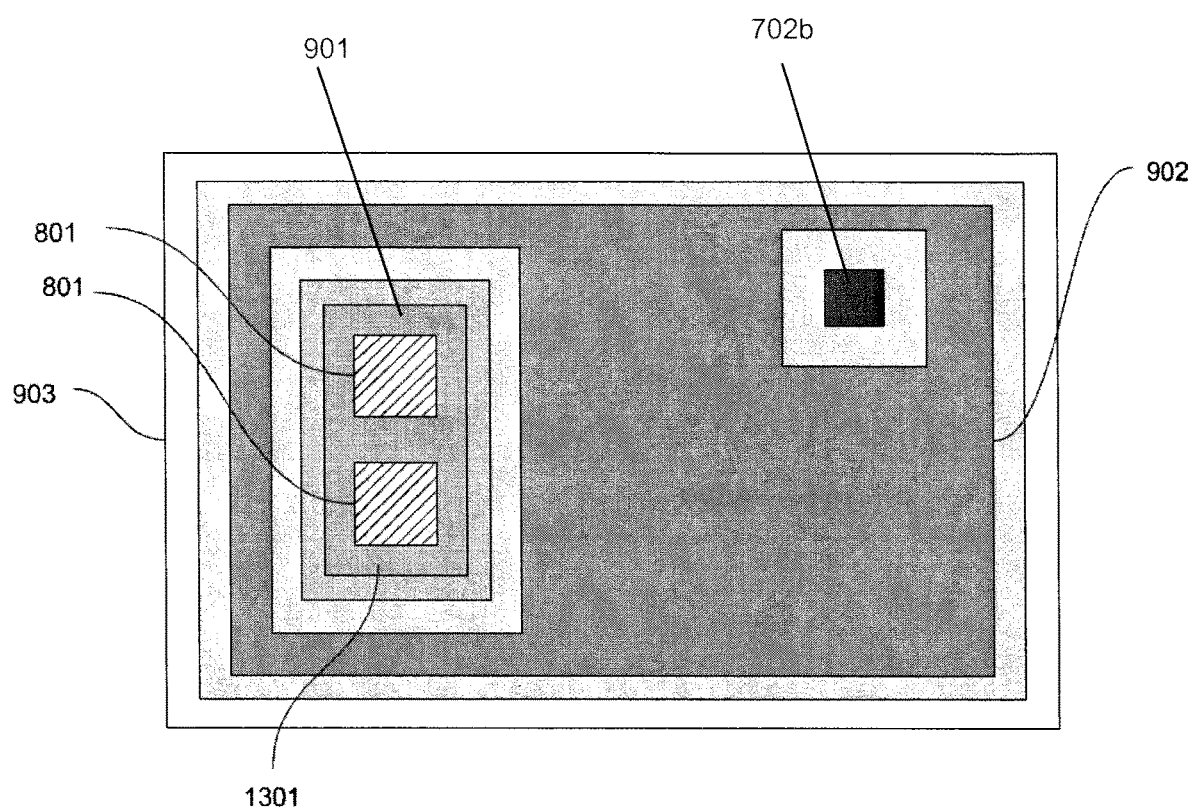
FIG. 13A shows another embodiment for a system substrate and an integrated micro device with thin film electro-optical device.

Referring to FIG. 12, in another example, the bottom electrode 902 of the thin film electro-optical device 904 can be extended over the micro device 801, so that the thin film electro-optical device 904 may be superposed over or around the micro device 801. In case the micro device 801 needs to have a transparent path to the outside through its top electrode 1001, the bottom electrode 902 (if not transparent) needs to have an opening over the micro device 801 (for example as shown in FIG. 13A in association with another embodiment). In this case, the opening can be covered by the bank layer 903 as well. The opening is not limited to the specific structure illustrated in FIG. 12 and can be developed with different methods.

Still referring to FIG. 12, the micro device 801 may have a transparent path through the substrate 100, if the lower electrode 702*a* is transparent. In a case where a transparent path is required through the upper electrode 1001, either the bottom electrode 902 and the micro device upper electrode 1001 need to be transparent or there needs to be a combination of openings in one or both of the upper electrode 1001 and the bottom electrode 902 and transparency in one or both of the upper electrode 1001 and the bottom electrode 902.

FIG. 13A shows a layout structure where the bottom electrode 902 has an opening 1301 to allow a transparent path through to the top electrode 905. The opening 1301 may also extend through the bank layer 903 for the common top electrode 905. If there is no common top electrode 905 and if the bank layer 903 is transparent, the opening 1301 in the bank layer 903 is not needed. In some embodiments, if the top electrode 905 is also opaque, the opening 1301 in the top electrode 905 is also needed for top emission.

Figure 13B:
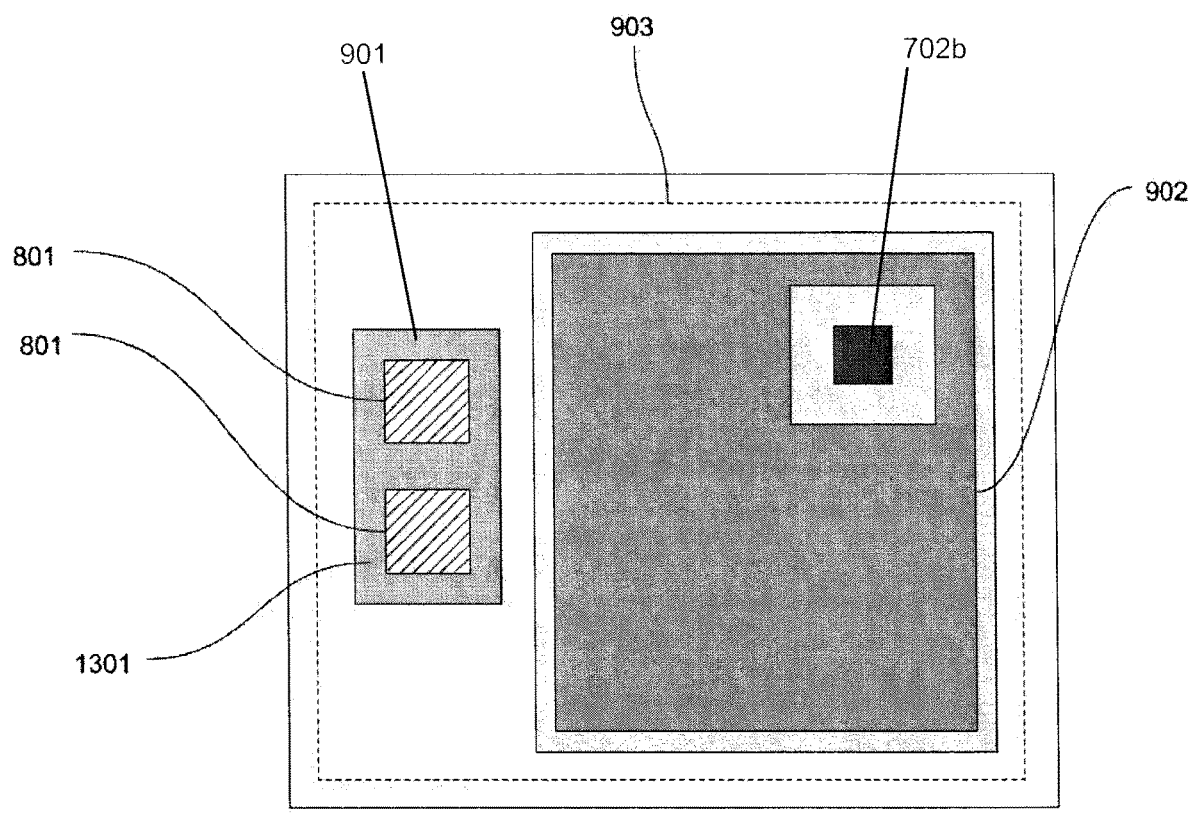
FIG. 13B shows another embodiment of a system substrate and an integrated micro device with a thin film electro-optical device.

Referring to FIG. 13B, in another embodiment, to provide a transparent path for the micro device 801, the bottom electrode 902 does not cover the micro device 801. There can be an opening 1301 in the bank layer 903 for a common top electrode 905. If there is no common top electrode 905 and the bank layer 903 is transparent, the opening 1301 in the bank layer 903 is not needed.

Figure 14A:
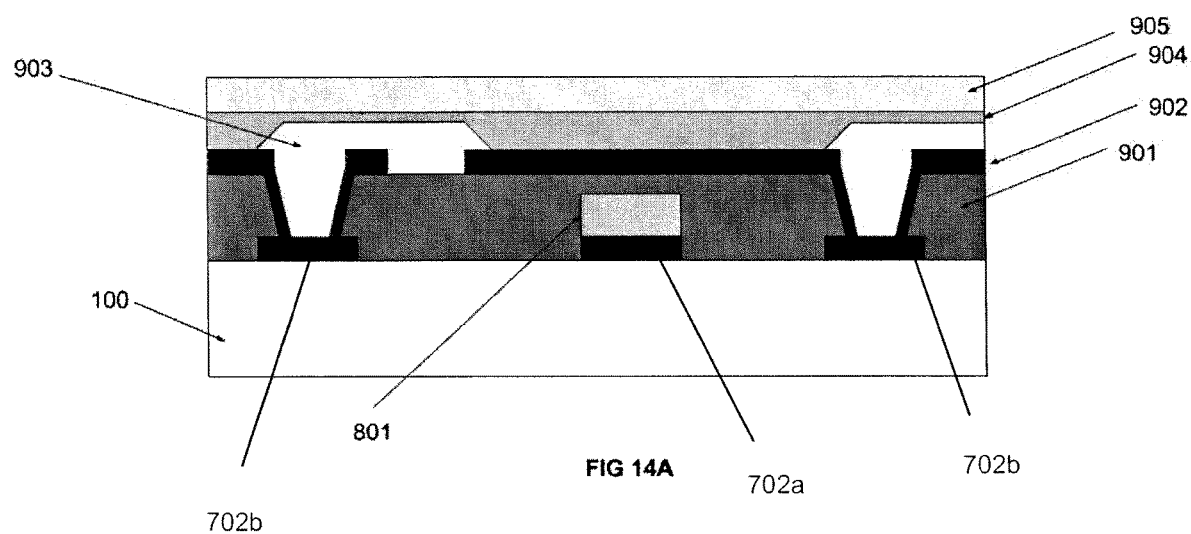
FIG. 14A shows an embodiment of a system substrate and an integrated micro device with two thin film electro-optical devices.
Figure 14C:
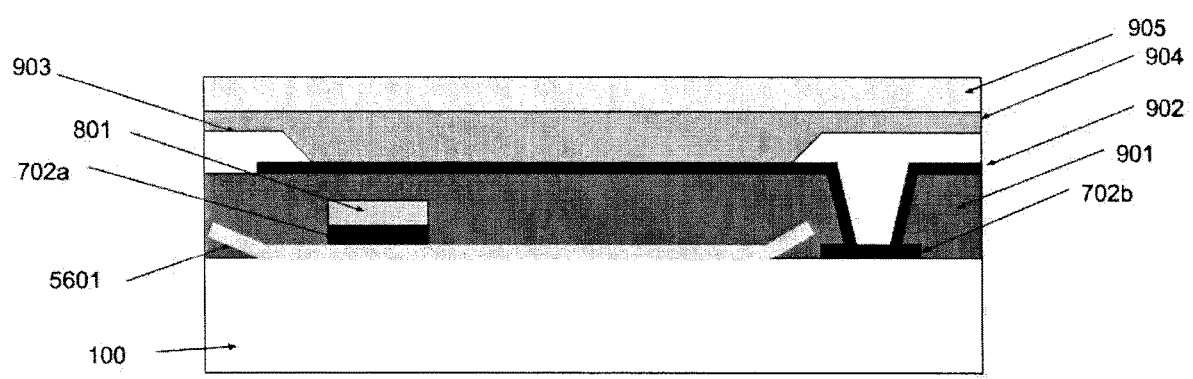
FIG. 14C and FIG. 14D show example of micro-LED and optoelectronic device where the light passes through the optoelectronic device.
Figure 14D:
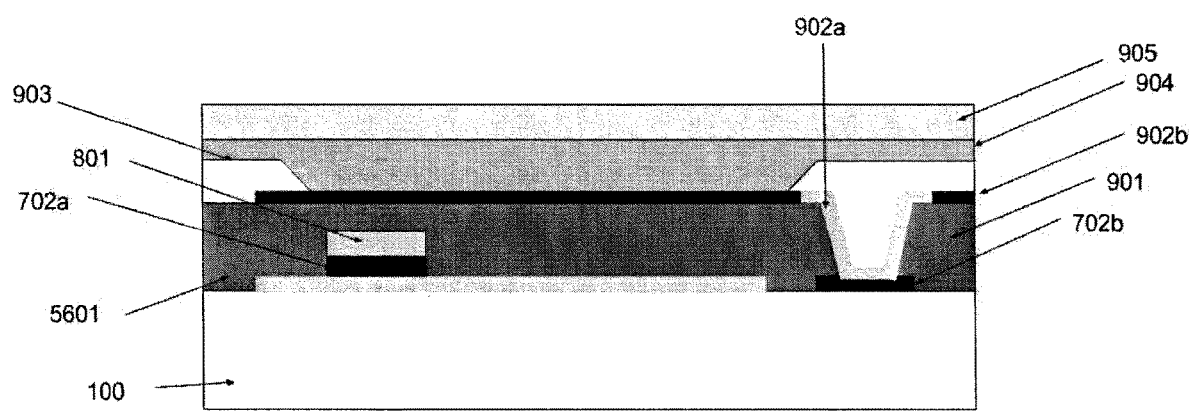
Figure 14E:
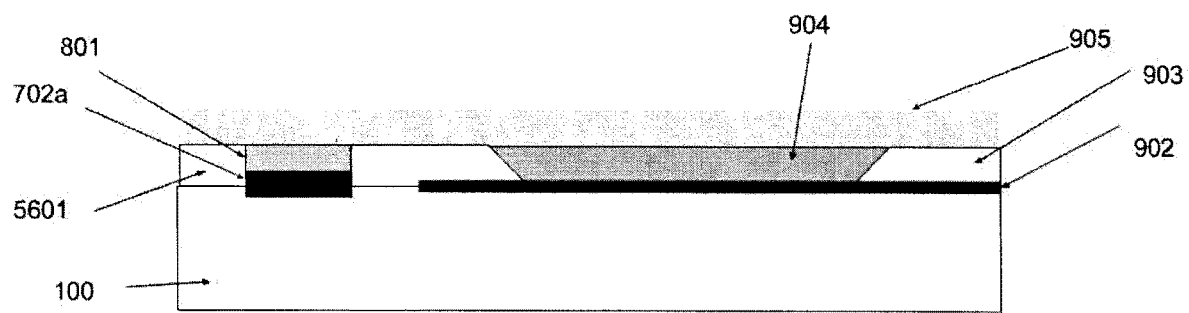
FIG. 14E, FIG. 14F, and FIG. 14G show another examples of micro-LED integrated with optoelectronic device on system substrate.
Figure 14F:
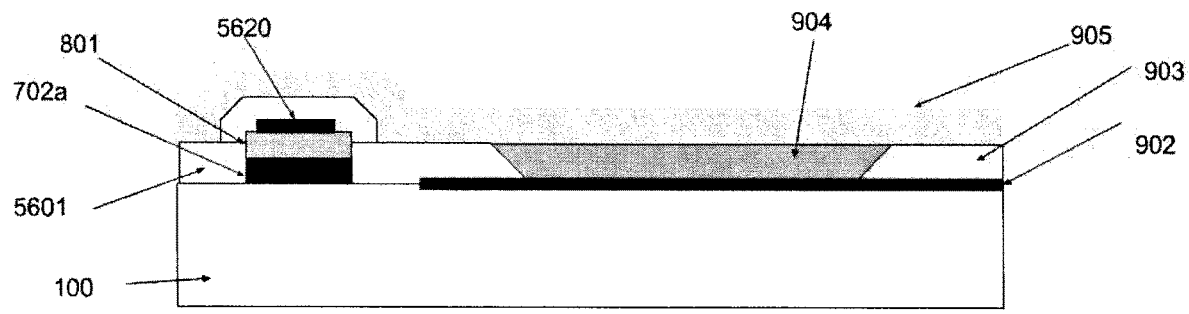
Figure 14G:
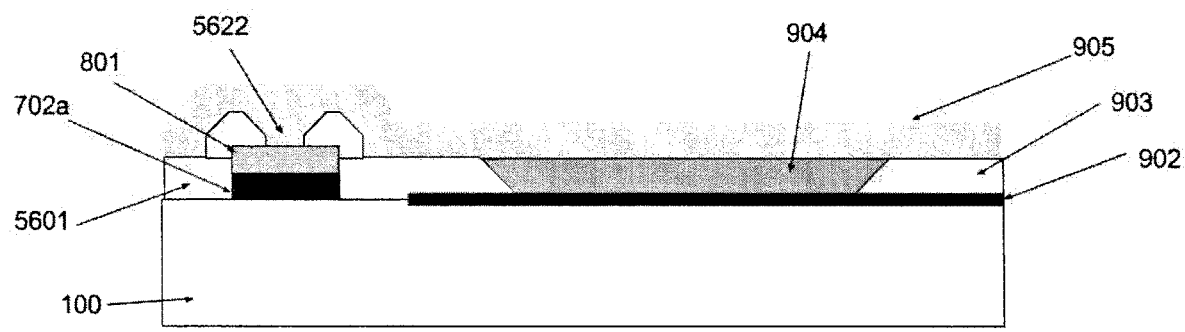
Figure 14H:
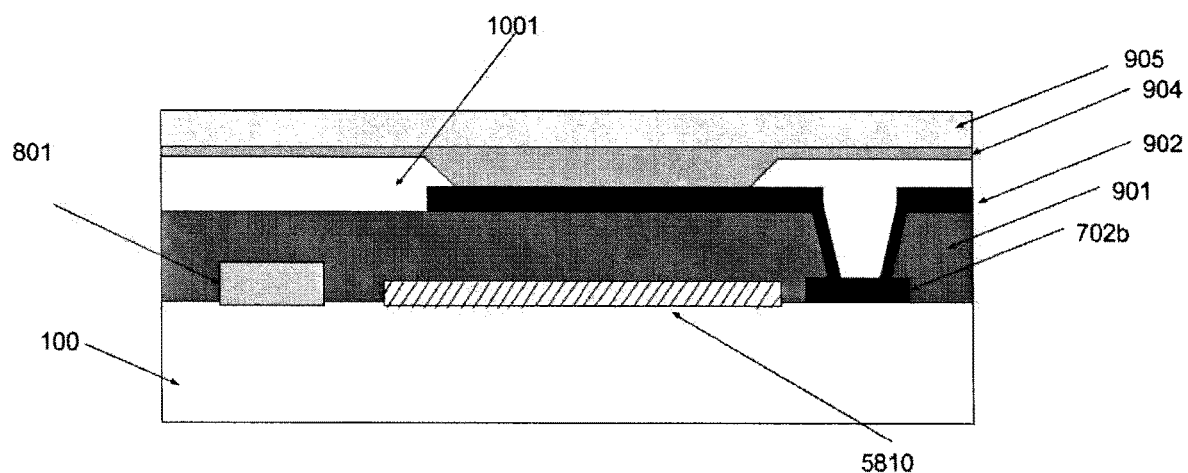
FIG. 14H and FIG. 14I show another example of micro-LED integrated with optoelectronic device and color filter on system substrate.
Figure 14I:
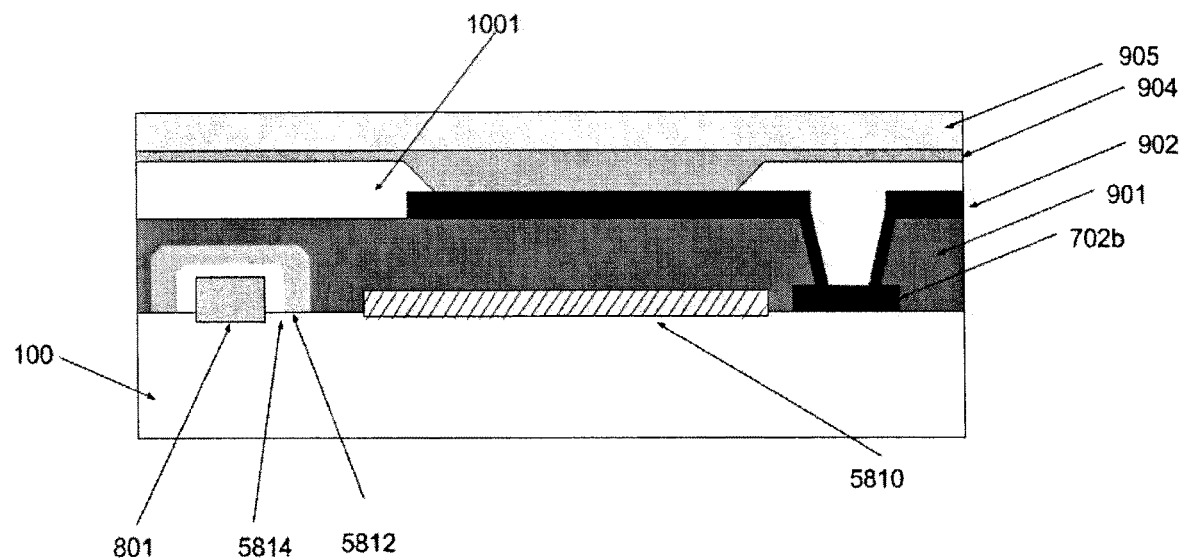
Figure 14J:
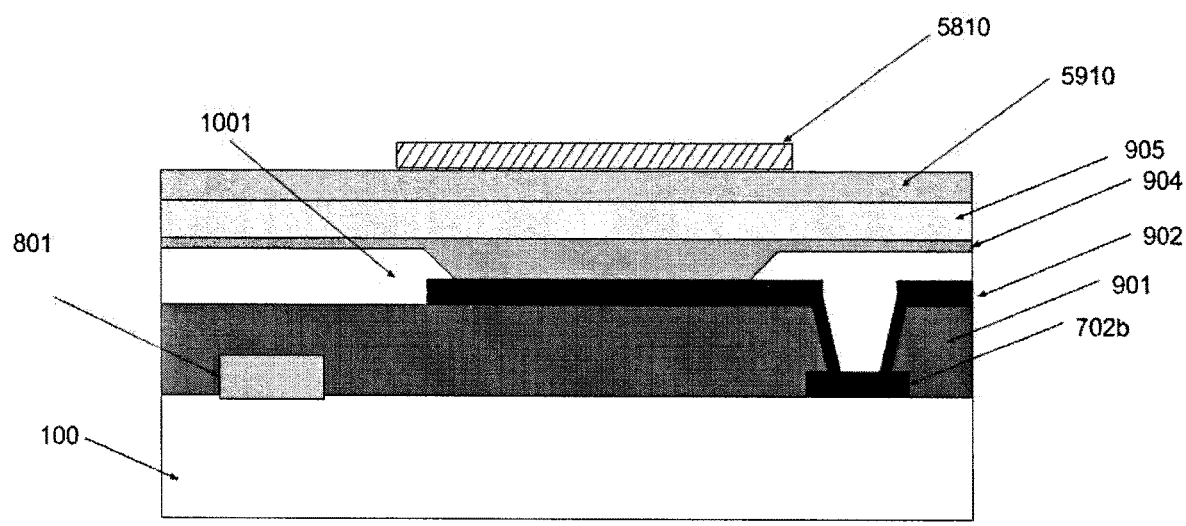
FIG. 14J shows another example of micro-LED integrated with optoelectronic device and color filter on system substrate.

In another case, the contact pad structures 702b of the thin film electro-optical device 904 can be extended to act as reflective layer. As can be seen in FIG. 14A, the two side-by-side pixels with contacts 702b can act to laterally confine the light generated by the micro device 801 in the pixel. In another embodiment shown in FIG. 14B, a reflective layer 1401 mounted on a top surface of the substrate 100 can reflect more of the light toward the top electrode 905. As a result, the out coupling of the light generated by the micro device 801 is enhanced. In this case, the best practice is either to make both top and bottom electrodes 902 and 905 of the thin film electro-optical device 904 transparent, or make openings if the electrodes 902 and 905 are opaque.

In another embodiment, the thin film electro-optical devices 904 and micro devices 801 may be on two opposite sides of the system substrate 100. In this case, the system substrate circuitry can either be on one side of the system substrate 100 and connected to the other side through contact holes or, the circuits can be on both sides of the system substrate 100.

In another case, the micro device 801 may be on one system substrate 100 and the thin film electro-optical device 904 on another system substrate. These two substrates may then be bonded together. In this case, the circuit can be on one of the system substrates or on both substrates.

FIGS. 14-1A and 14-1B show different structures in which the micro device (LED) 801, and the thin film electro-optical device 904 are integrated to develop a semiconductor device. Here a reflective or light confinement structure 5601 extending along the substrate 100 beneath both the micro-device 801 and the thin film electro-optical device 904, ideally mounted on the substrate 100, is used to direct the light output of the micro device 801. The reflective structure 5601 may be the same as the micro device electrode 702a or a separate electrode 702a may be used. As shown in FIG. 14-1B, a first part 902a of the bottom electrode 902, which extends from the contact pad 702b to a main planar section 902b parallel to the optoelectronic device 904 may be comprised of a reflective material capable of being used as a light confinement or reflective structure for directing light in the desired direction, e.g. through the substrate 100 or top electrode 905, and preventing light from entering adjacent pixels. The first part 902a of the bottom electrode 902 can be deposited first followed by the rest of the bottom electrode 902b or the first part 902a can be deposited after the main planar section 902b. Also, other electrodes can be deposited to connect the micro device 801. Ideally, both bottom and top electrodes 902 and 905 of the thin film optoelectronic device 904 are transparent, so that the light from the micro device 801 and the optoelectronic device 904 are emitted through the top electrode 905. Any stray light not emitted outwardly may be redirected by the reflective structure 5601 and 902a outwardly through the top electrode 905. The optoelectronic device 904 can be formed between bank structure 903, which may alternatively be black matrix. After the optoelectronic device 904, other structures can be integrated, such as encapsulation.

FIGS. 14-2A, B and C describe another structure in which the optoelectronic device 904 and the micro device 801 are side by side on the substrate 100. Here, the micro device 801 is transferred to the system substrate 100. A planarizing layer 903 (or bank layer) is deposited and patterned to open an area for the optoelectronic device 904. The optoelectronic device 904 is deposited with different possible methods, such as vapor deposition, printing, and so on. Then top electrode 905 is deposited over top both the optoelectronic device 904 and the micro device 801. Here, other structures can be deposited after the top electrode 905. The light can go through the top electrode 905 or the system substrate 100. In one structure described in FIG. 14-2A, the micro device 801 and the optoelectronic device 905 have the same top electrode 905. In another structure described in FIG. 14-2B, the micro device 801 has a separate upper electrode 5620 covered by the passivation (dielectric) layer 903. Here, the top electrode 905, which extends over both the thin film electro-optical device 904 and the micro device 801, may be used as a light confinement/reflective structure to guide the light from the micro device 801 and the thin film electro-optical device 904 through the system substrate 100. In another example shown in FIG. 14-2C, the top electrode 905 is shared; however, the passivation/planarization layer 903 is patterned at 5622 into one or more concave structures to create one or more light confinement/reflective structures for directing light in the desired direction, e.g. back through the substrate 100. Here a separate layer can be used to create the light confinement structure before depositing the top electrode 905.

In all structures described here, the contact electrode(s) 702a for the micro device 801 can be deposited after the micro device 801 is transferred to the system substrate 100 or a contact 702a can pre-exist before the transfer process. There can be a planarization layer 901 or 903 before the micro device 801 and other devices are mounted on the system substrate 100 to improve surface profile. In this case, there can be openings to connect the micro device 801 to the other elements in the system substrate 100.

Structures described hereinbefore can be combined. For example, the light confinement or extraction structures and hybrid devices can be mixed.

In hybrid devices described here in FIGS. 9 to 14, thin film light emitting device structures 904 can include a color filter. In the case of using color filters, the light from the micro device 801 needs to pass the thin film light emitting device structure 904 and through the color filter.

FIGS. 14-3A and 14-3B show two example of integrating micro device 801 with a color filter 5810 and the optoelectronic device 904. In this case, the light goes through the system substrate 100. After deposition of the color filter 5810, location of the bonding pads 702a and 702b, and transfer of the micro device 801 and the upper electrode 1001 (the order of these steps may be changed), a planarization, e.g. dielectric, layer 901 may be deposited, if required. Two or three different planarization layers may be deposited after each previous step. Then the optoelectronic device 904 and the bottom and top electrodes 902 and 905, respectively, are deposited and formed. Here, the micro device 801 may include a light confinement structure before transfer (this can be used for other structures in this document as well). Also, as shown in FIG. 14-3B, the light confinement structure can be formed after the transfer of the micro device 801. In the illustrated embodiment, the light confinement has a passivation layer 5814, thereby insulated from the micro device 801 and upper electrode 1001, and a reflective layer 5812 formed into a concave structure for reflecting light in a desired direction, e.g. through the substrate 100.

FIG. 14-4 shows another example of integrating the micro device 801 with the optoelectronic device 904 and the color filter 5810 mounted over the optoelectronic device 904 and the top electrode 905. All the above structures, such as light confinement structures, can be used with micro device 801 and the optoelectronic device 904 in this example. Here, the light goes through the transparent top electrode 905. There may be a transparent protective layer 5910 (or layers) in between the top electrode 905 and the color filter 5810 in this structure.

Integration

This document also discloses various methods for the integration of a monolithic array of micro devices into a system substrate or selective transferring of an array of micro devices to a system substrate. Here, the proposed processes are divided into two categories. In the first category, the pitch of the bonding pads on the system substrate is the same as the pitch of the bonding pads of the micro devices. In the second category, bonding pads on the system substrate have a larger pitch compared to that of the micro devices. For the first category, three different schemes of integration or transfer are presented 1. Front-side Bonding
2. Back-side bonding
3. Substrate Through via Bonding.

Figure 15:
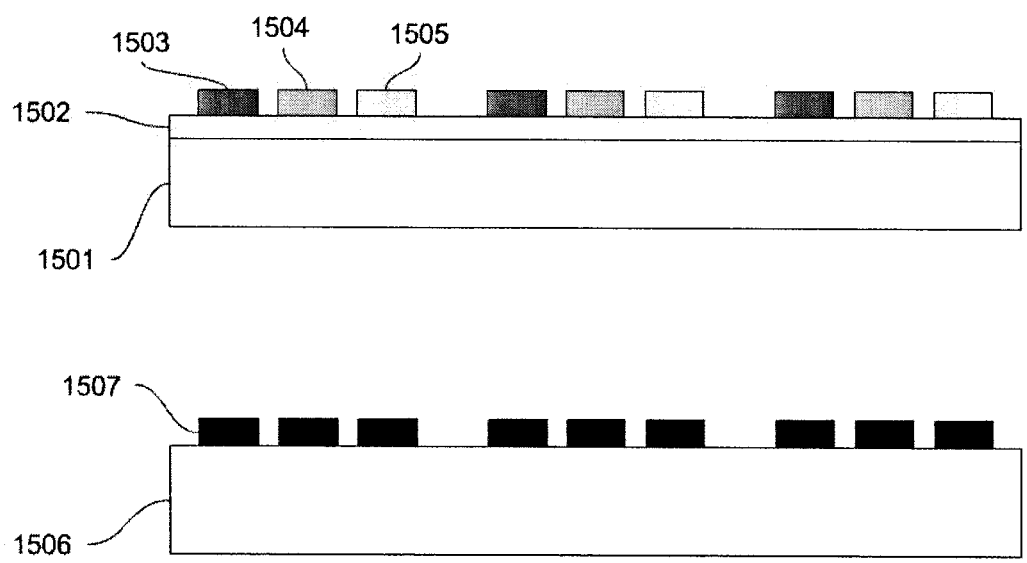
FIG. 15 illustrates a cross section of a system substrate and a micro device substrate.
Figure 16:
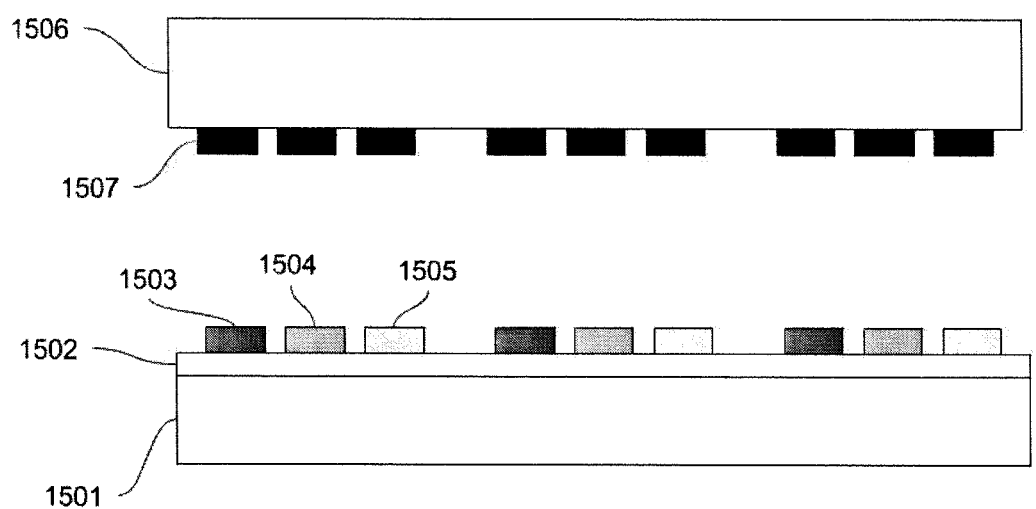
FIG. 16 shows the alignment step for a system substrate and a micro device substrate in a transfer process.
Figure 17:
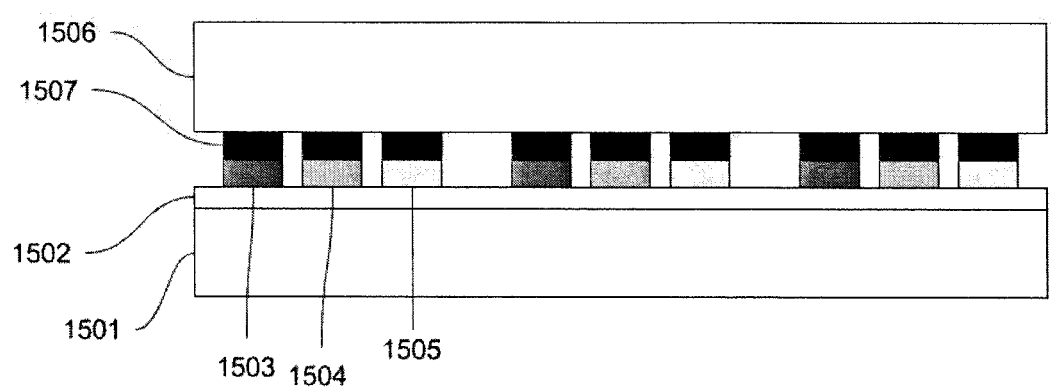
FIG. 17 shows the bonding step for a system substrate and a micro device substrate in a transfer process.
Figure 18:
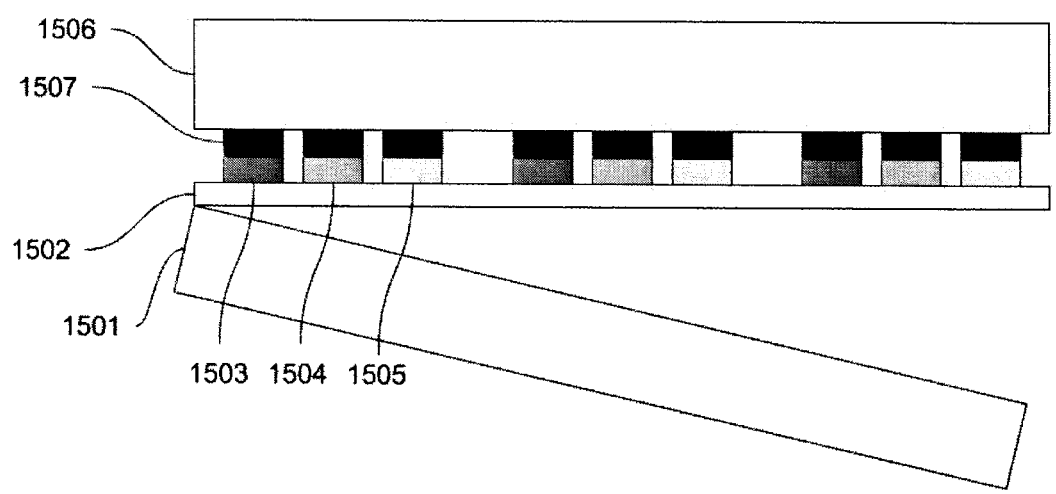
FIG. 18 shows the micro device substrate removal step for a system substrate and a micro device substrate in a transfer process.
Figure 19:
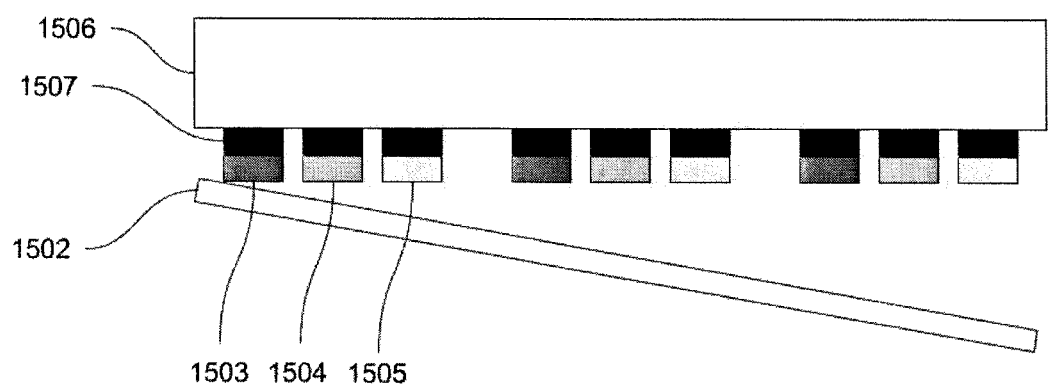
FIG. 19 shows the sacrificial layer removal step for a system substrate and a micro device substrate in a transfer process.
Figure 20:
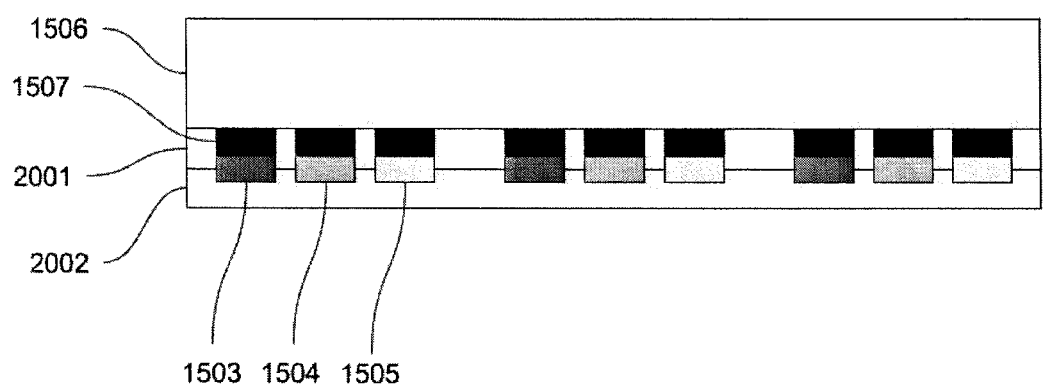
FIG. 20 shows the common electrode formation step for a system substrate and a micro device substrate in a transfer process.

In this embodiment micro-devices may be of the same type or different types in terms of functionality. In one embodiment, micro-devices are micro-LEDs of the same color or of a number of different colors (e.g. Red, Green, and Blue), and the system substrate is the backplane, controlling individual micro-LEDs. Such multi-color LED arrays are fabricated directly on a substrate or transferred to a temporary substrate from the growth substrate. In one example shown in FIG. 15, RGB micro-LED devices 1503, 1504, and 1505 were grown on a sacrificial/buffer layer 1502 and the substrate 1501. In one case, the system substrate 1506 having contact pads 1507 can be aligned (FIG. 16) and bonded to the micro device substrate 1501 as it is shown in FIG. 17. After removing the micro-device substrate 1501 (FIG. 18) and sacrificial/buffer layer 1502 (FIG. 19), a filler dielectric coating 2001 (e.g. Polyimide resist) may be spin-coated/deposited on the integrated sample (FIG. 20). This step may be followed by an etching process to reveal the tops of the micro-LED devices. In the case of micro-LED devices, a common transparent electrode 2002 may be deposited on the sample. In another embodiment, a top electrode may be deposited and patterned to isolate micro devices for subsequent processes.

Figure 21:
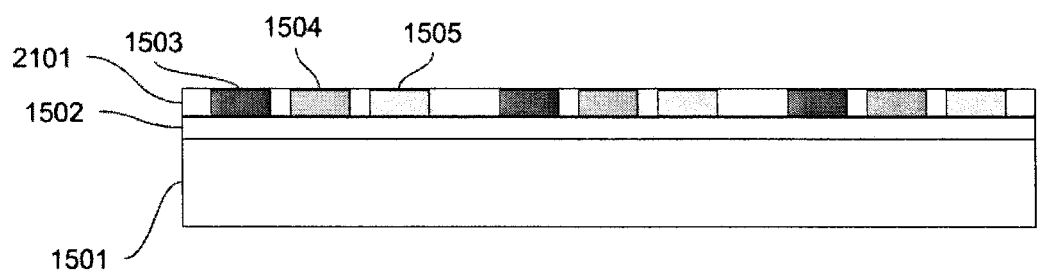
FIG. 21 is a cross section of a micro device substrate with a filler layer(s).
Figure 22:
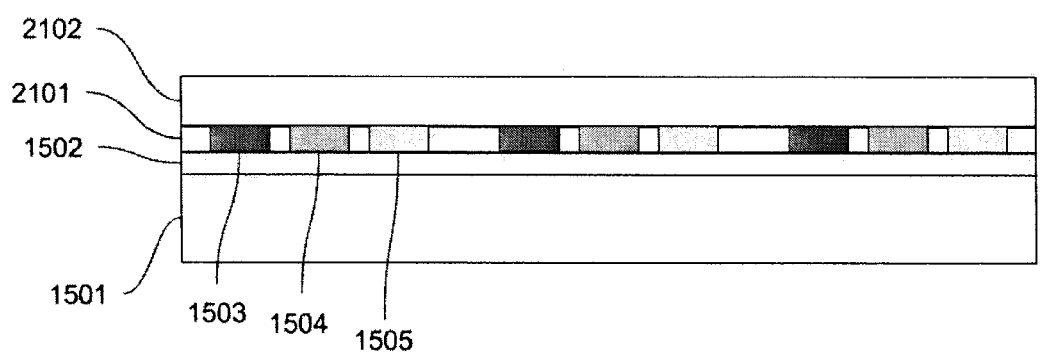
FIG. 22 is a cross section of a micro device substrate covered with a support layer.
Figure 23:
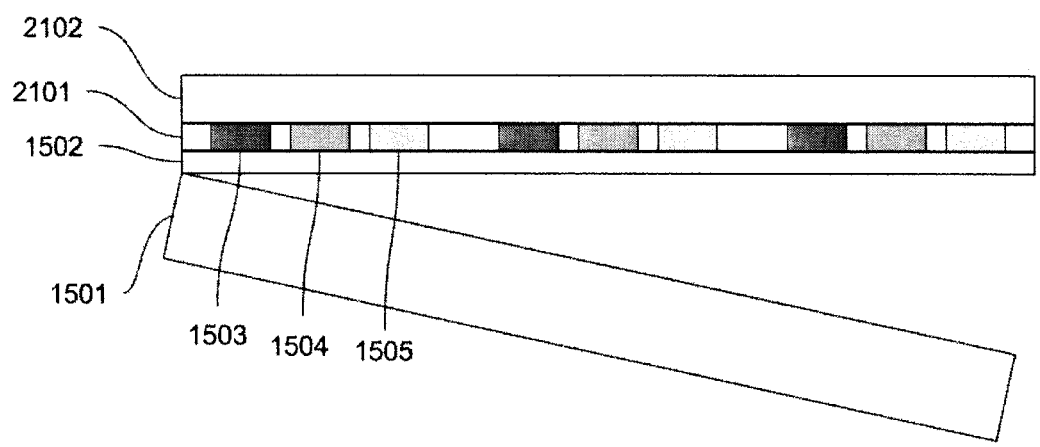
FIG. 23 shows the micro device substrate removal step for a micro device substrate in a transfer process.
Figure 24A:
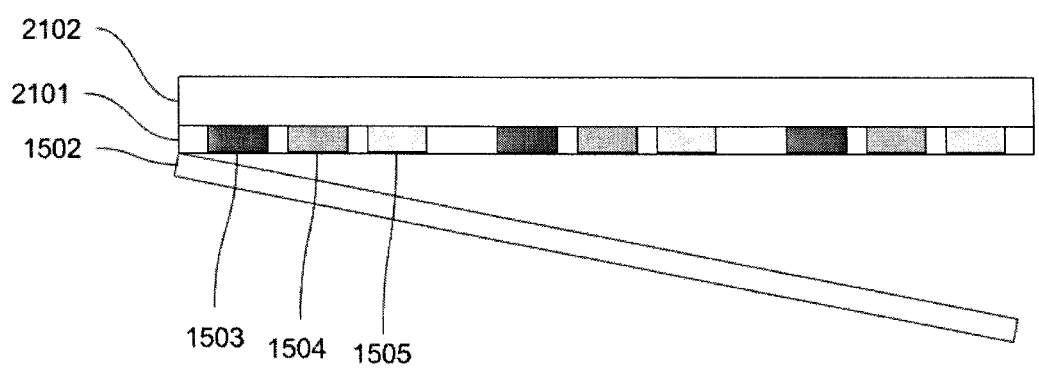
FIG. 24A and FIG. 24B show the sacrificial layer removal step for a micro device substrate in a transfer process. A system substrate with contact pads is shown as well.
Figure 24B:
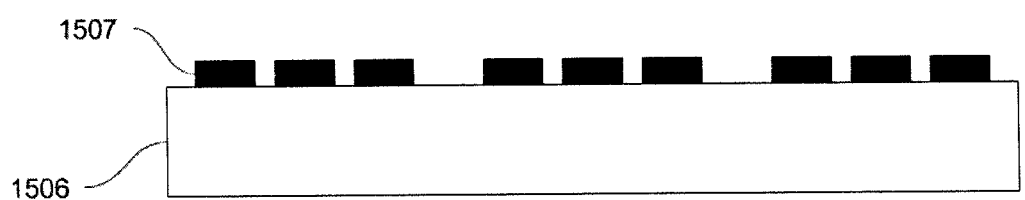
Figure 25:
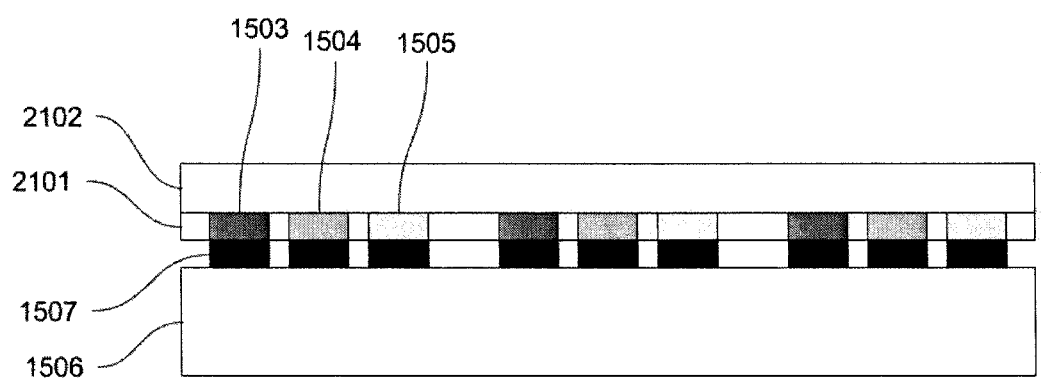
FIG. 25 shows the bonding step for a system substrate and a micro device substrate in a transfer process.
Figure 26A:
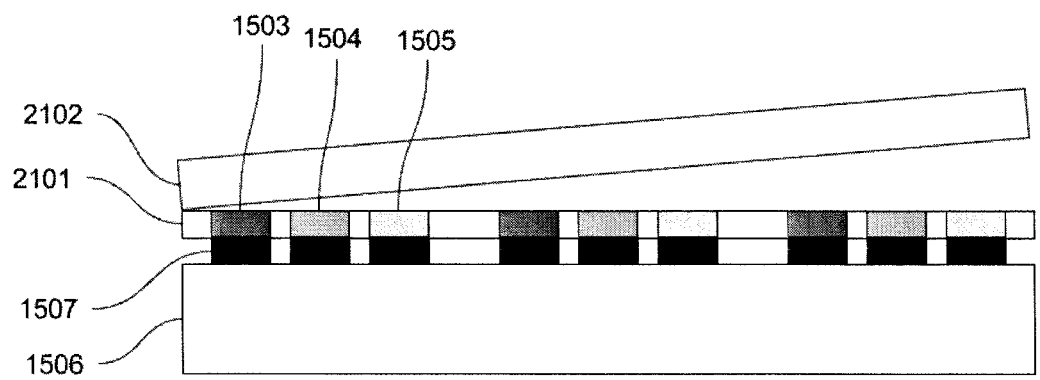
FIG. 26A and FIG. 26B show the supporting layer removal step for a micro device substrate in a transfer process. A system substrate with contact pads and transferred micro devices is shown as well.
Figure 26B:
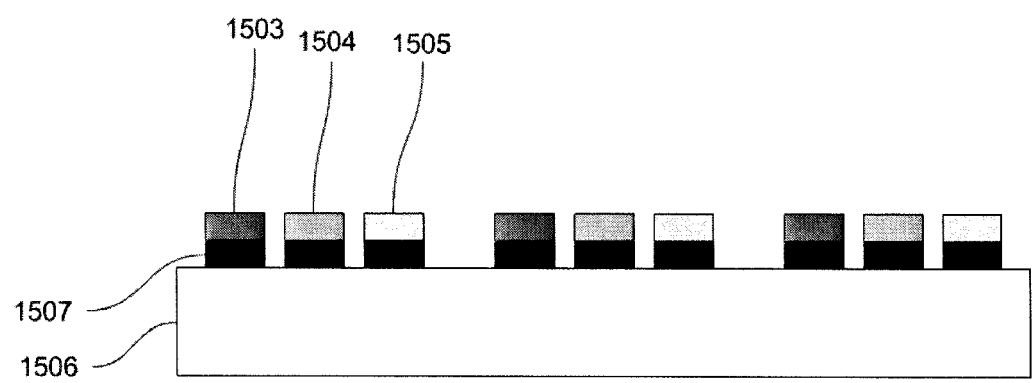

In another embodiment, as shown in FIG. 21 the micro devices 1503, 1504, and 1505 are grown on a buffer/sacrificial layer 1502. A dielectric filler layer 2101 is deposited/spin-coated on the substrate to fully cover the micro devices. In one example illustrated in FIG. 21, this step is followed by an etching process to reveal the tops of the micro devices 1503, 1504, and 1505 to form the top common contact and seeding layer for subsequent processes (e.g. electroplating). Referring to FIG. 22, a thick mechanical supporting layer 2102 is then deposited, grown or bonded on the tops of the sample. Here, the filler layer 2101 can be a black matrix layer or a reflective material. Also, before depositing the mechanical support, one can deposit an electrode (either as a patterned or a common layer). The mechanical support layer is then deposited. In the case of optoelectronic devices such as LEDs, the mechanical support layer needs to be transparent. As shown in FIG. 23 and FIG. 24, the micro device substrate 1501 is then removed using various processes such as laser lift-off or etching. In one case, the thickness of the substrate is initially reduced to a few micrometers by processes such as but not limited to deep reactive ion etching (DRIE). The remaining substrate then is removed by processes such as but not limited to a wet chemical etching process. In this case, the buffer/sacrificial layer 1502 may act as an etch-stop layer to ensure a uniform etched sub-surface and to avoid any damage to the micro devices. After removing the buffer layer 1502 as shown in FIG. 24, another etching (e.g. RIE) is performed to expose the micro devices. One may deposit and pattern a metallic layer to serve as the upper contact and bond pads for the micro-devices if they haven't been formed during the micro device fabrication. The system substrate 1506 having contact pads 1507 can then be aligned and bonded to the micro device array as shown in FIG. 25. Depending on the type and functionality of the micro devices the mechanical supporting layer 2102 and filler layer 2101 may be then removed as shown in FIG. 26A and FIG. 26B.

In another embodiment, through substrate vias are implemented to make contacts to the back of the micro devices.

Figure 27:
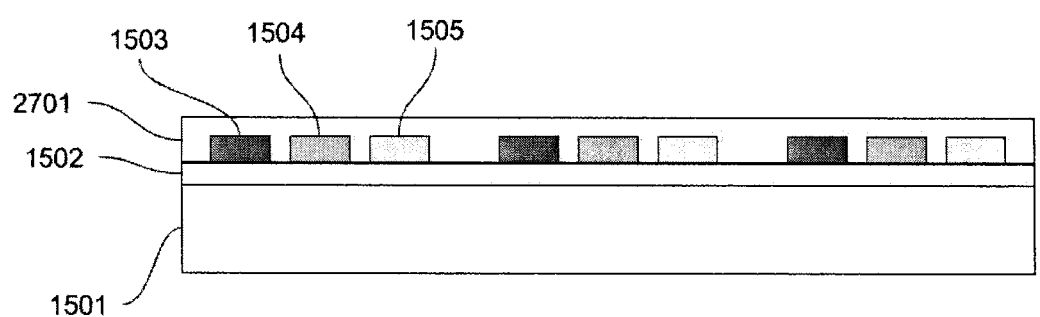
FIG. 27 is a cross section of a micro device substrate covered with a filler layer.

Referring to FIG. 27, in one embodiment, the micro devices 1503, 1504, and 1505 may be multicolor micro-LEDs grown on an insulating buffer layer 1502. This buffer layer 1502 may function as an etch-stop layer as well. A dielectric layer 2701 is deposited as a filler layer over and around the micro devices 1503, 1504 and 1505.

Figure 28A:
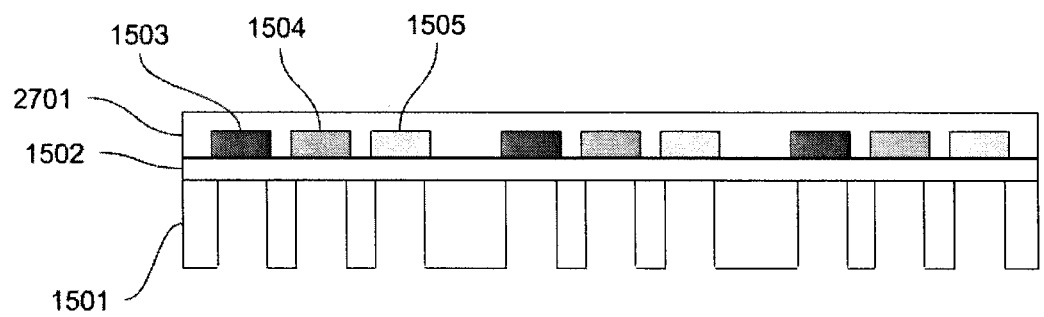
FIG. 28A and FIG. 28B are cross sections of a micro device substrate with via holes in the substrate and the sacrificial layer.
Figure 28B:
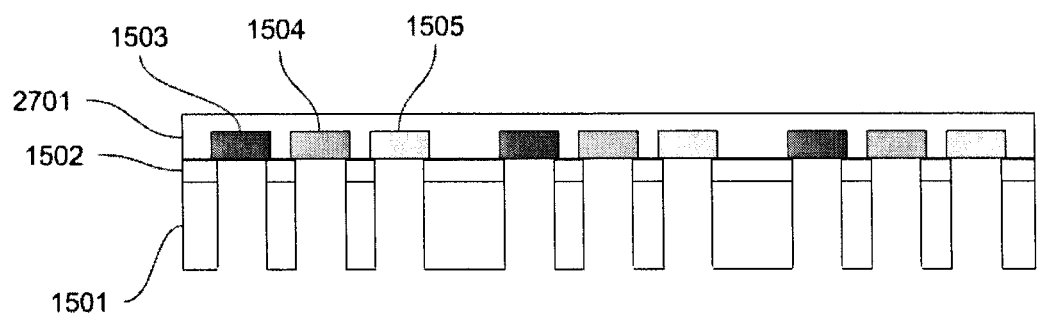

Referring to FIG. 28A and FIG. 28B, using processes such as but not limited to photolithography, patterns are formed on the backside of the substrate 1501. In one embodiment, a method such as DRIE is used to make through substrate holes in the substrate 1501. Buffer layer 1502 which may act as an etchstop layer may be removed using for example a wet-etch process.

Figure 29:
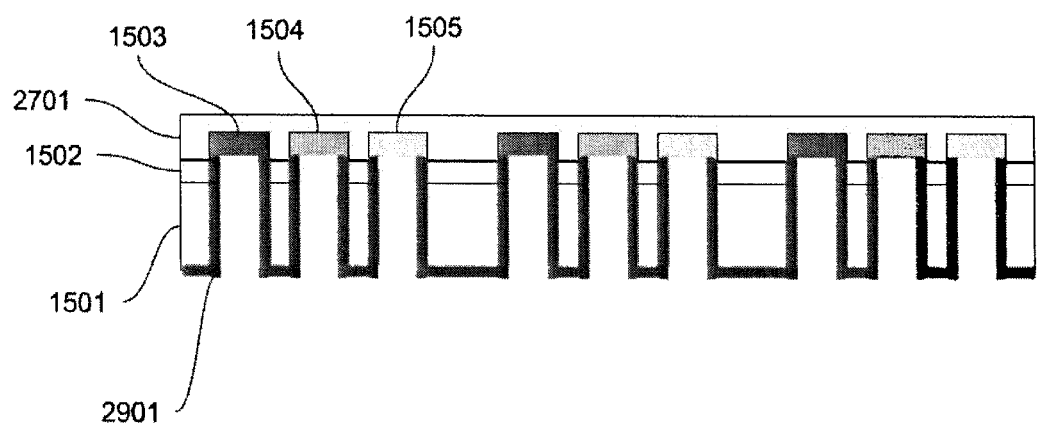
FIG. 29 is a cross section of a micro device substrate with via holes in the substrate and the sacrificial layer covered by an insulating layer.

Referring to FIG. 29, an insulating film 2901 may be deposited on the back of the substrate 1501. The insulating layer 2901 may be partially removed from back side of the micro devices 1503, 1504, and 1505 to allow formation of electrical contacts to these micro devices.

Figure 30:
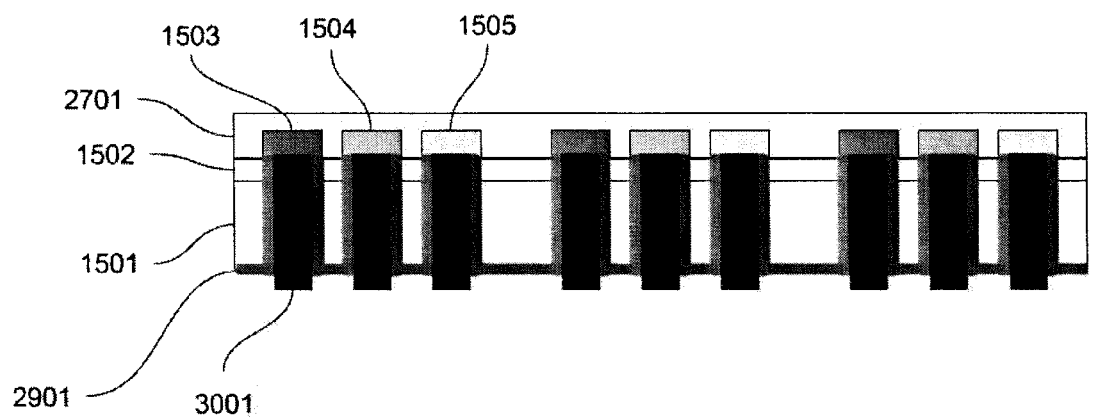
FIG. 30 is a cross section of a micro device substrate with a conductive layer filled via holes in the substrate and the sacrificial layer.

Referring to FIG. 30, the through holes are filled with a conductive material 3001 using processes such as but not limited to electroplating. Here, the vias may act as the micro device contacts and bonding pads.

Figure 31:
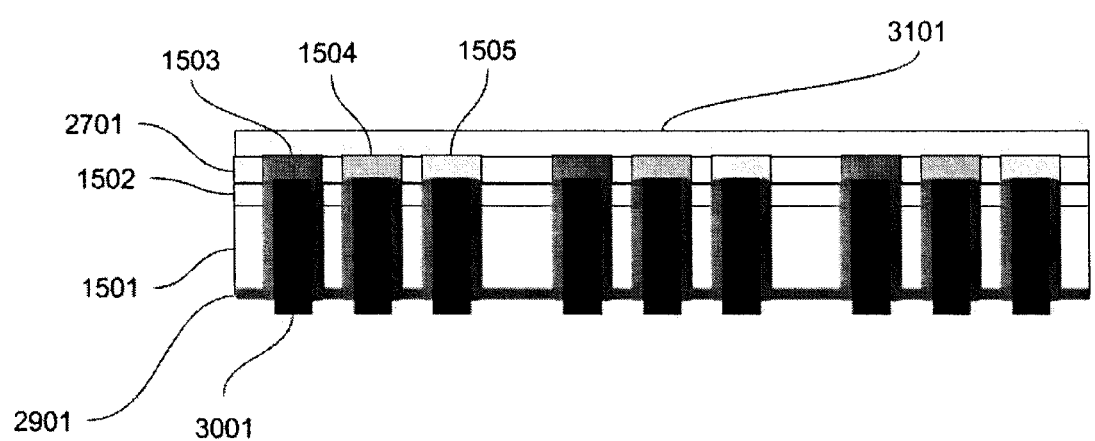
FIG. 31 is a cross section of a micro device substrate with a common top electrode.

As illustrated in FIG. 31, a common front contact 3101 of the micro devices 1503, 1504, and 1505 is formed by performing an etching process (e.g. using RIE) to reveal the tops of the micro devices 1503, 1504 and 1505 followed by the deposition of a transparent conductive layer to form the front contact 3101.

Figure 32:
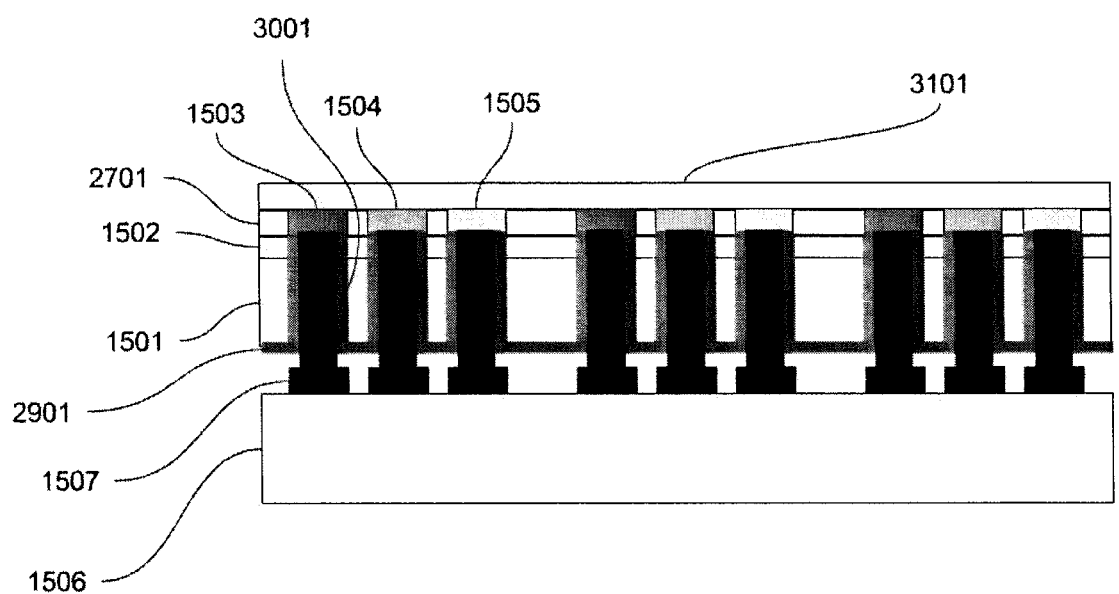
FIG. 32 is a cross section of an integrated system substrate with a common top electrode.

Referring to FIG. 32, the micro device substrate 1501 is then aligned and bonded to the system substrate 1506 having contact pads 1507, which in this example may be a backplane controlling individual devices.

In another embodiment, micro devices have been fabricated on a substrate with arbitrary pitch length to maximize the production yield. For example the micro devices may be multi-color micro-LEDs (e.g. RGB). The system substrate for this example may be a display backplane with contact pads having a pitch length different than those of the micro-LEDs.

Figure 33A:
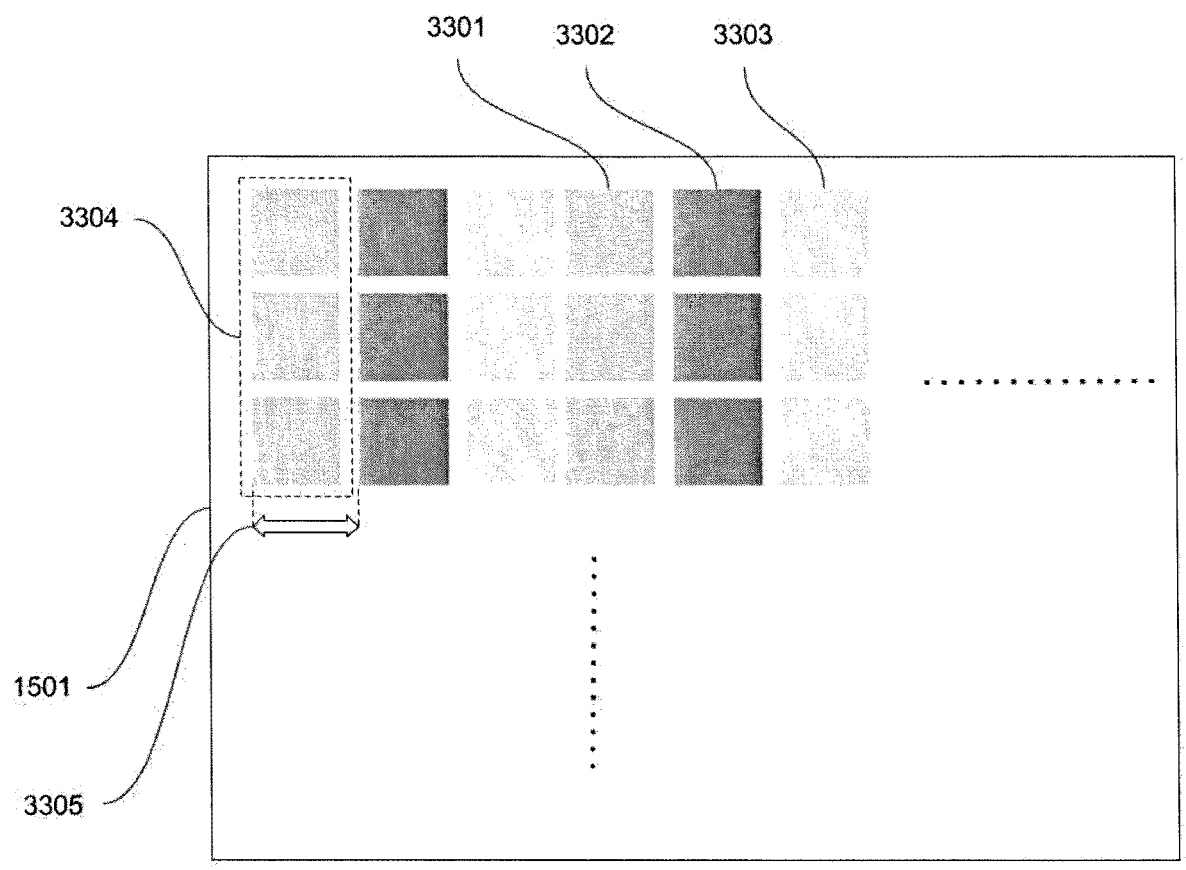
FIG. 33A shows a two dimensional arrangement of micro devices in a donor substrate.

Referring to FIG. 33A, in one embodiment, the donor substrate 1501 has micro device types 3301, 3302, and 3303 and they are patterned in the form of one dimensional arrays 3304 in which for each micro device 3301, 3302, or 3303 from one type, there is at least a micro device from another type that their pitch 3305 matches the pitch of the corresponding areas (or pads) on the receiver (or system) substrate 1506.

Figure 33B:
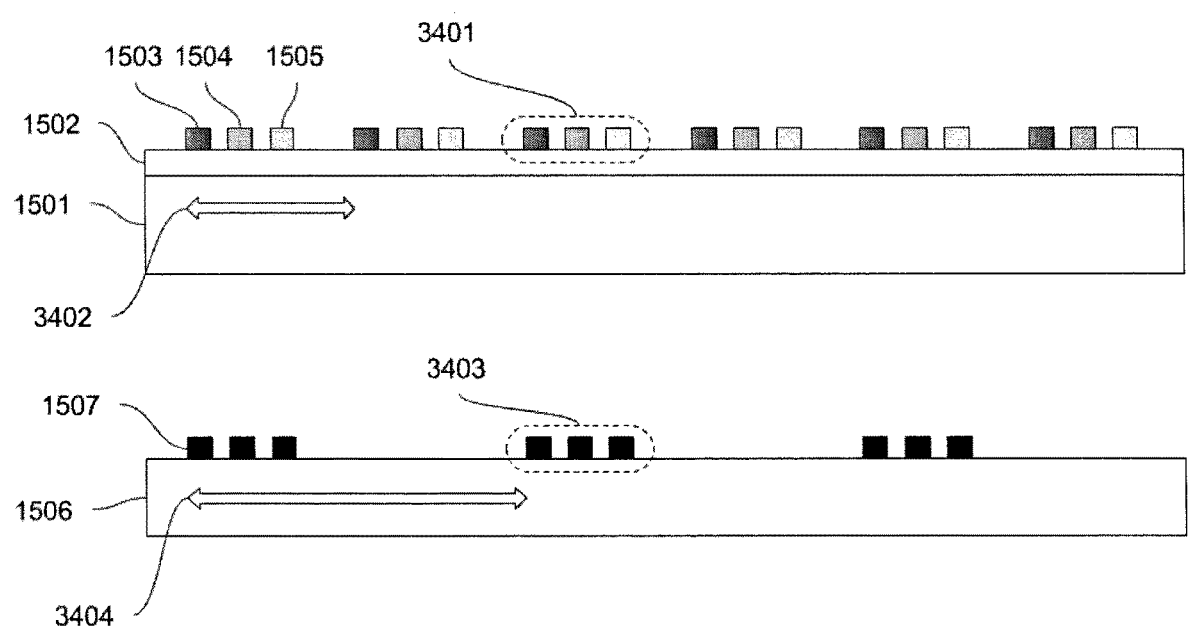
FIG. 33B is a cross section of a system substrate and a micro device substrate.

As an example, in one embodiment shown in FIG. 33B, the pitch 3404 of contact pads 1507 is two times larger than the pitch 3402 of the micro devices 3401 as shown in FIG. 33.

Figure 34:
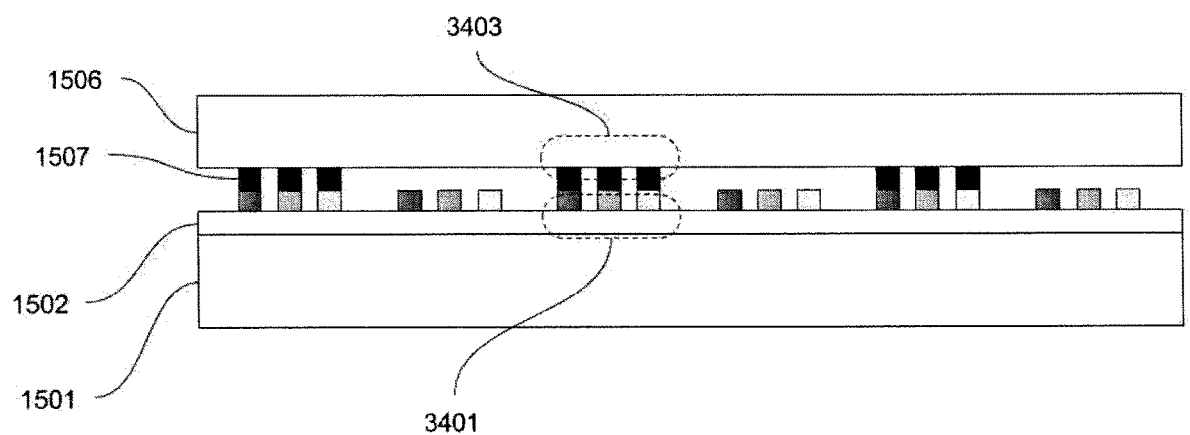
FIG. 34 is a cross section of a bonded system substrate and micro device substrate.

Referring to FIG. 34, the system substrate 1506 and micro device substrate 1501 are brought together, aligned and put in contact.

Figure 35:
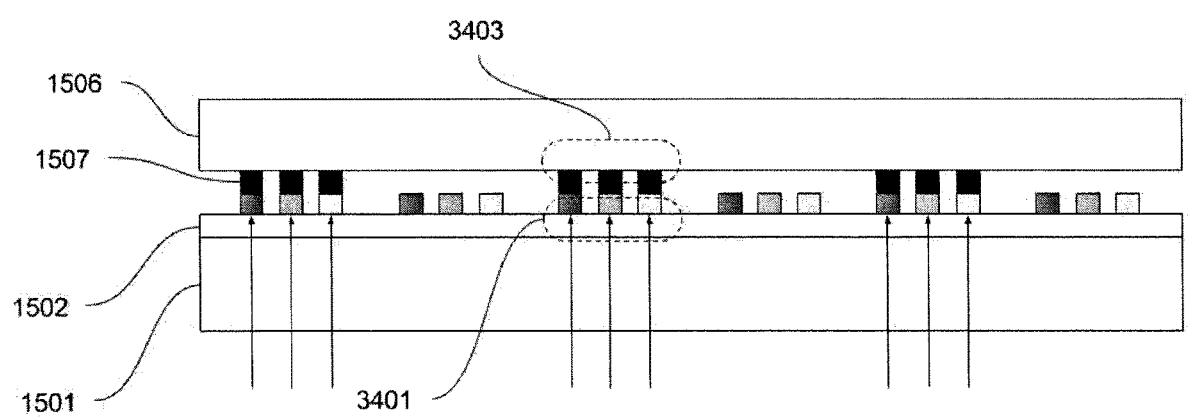
FIG. 35 shows the laser lift-off step for a micro device substrate in a transfer process.
Figure 36:
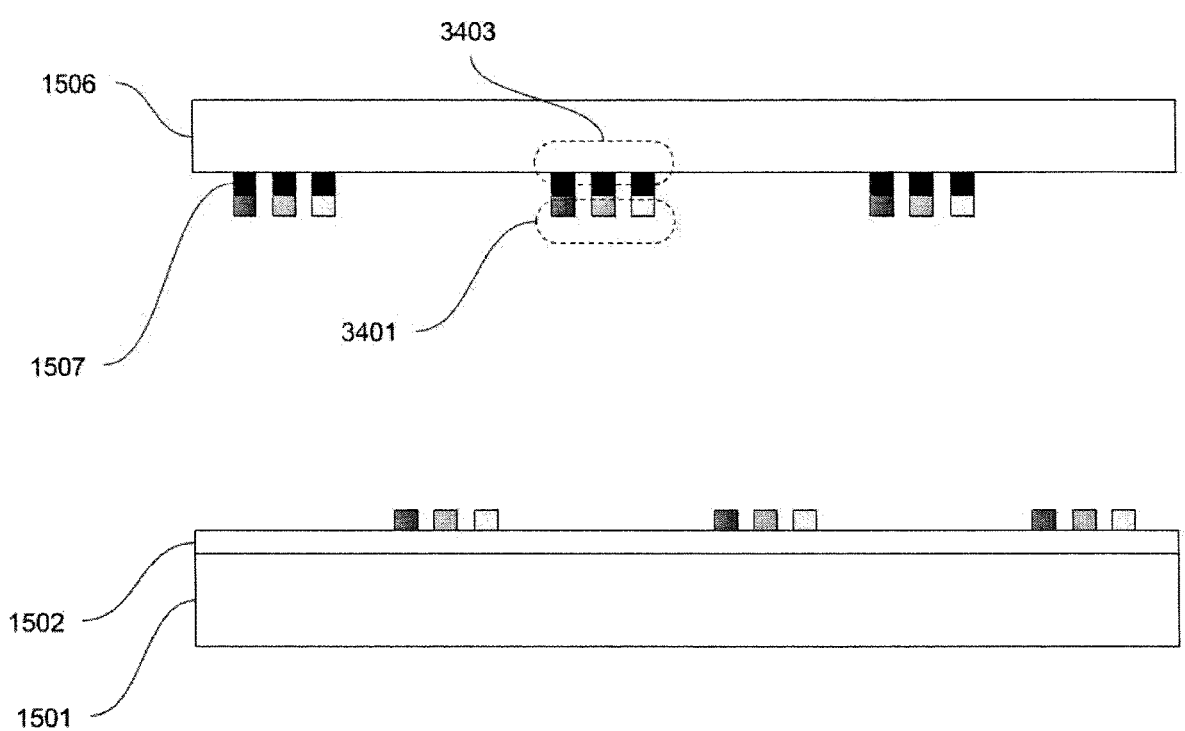
FIG. 36 is a cross section of a system substrate and a micro device substrate after the selective transfer process.
Figure 37:
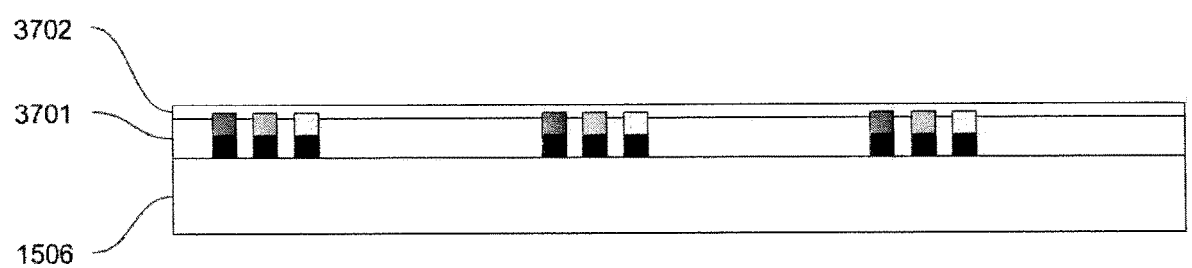
FIG. 37 shows an integrated system substrate with a common top electrode.

As shown in FIG. 35 and FIG. 36, methods such as laser lift-off (LLO) may be used to selectively transfer the micro devices 3401 to the contact pads 3403 on the system substrate 1506. As shown in FIG. 37, transfer may be followed by depositing a filler layer 3701 and a conformal conductive layer 3702 on top of the system substrate as the common electrode.

Figure 38A:
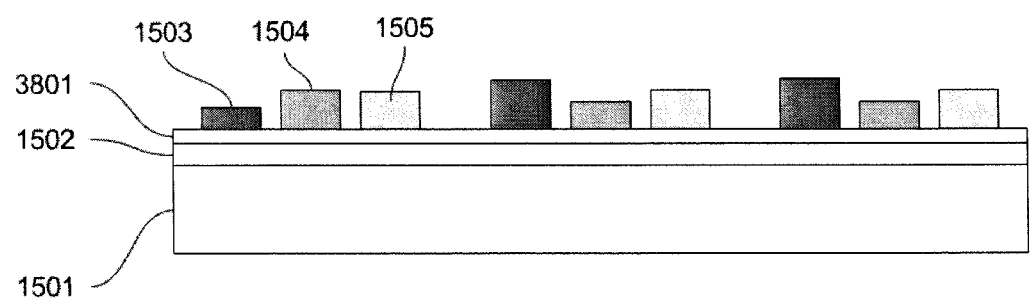
FIGS. 38A and 38B are cross sections of a micro device substrate with micro devices having different heights.
Figure 38B:
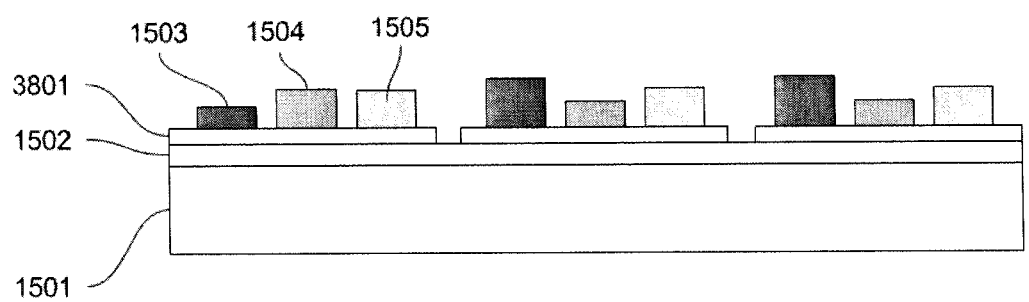

In another embodiment shown in FIGS. 38A and 38B, a buffer layer 3801 is necessary as a material template for the fabrication of micro devices 1503, 1504, and 1505.

Still referring to FIG. 38A and FIG. 38B, the buffer layer 3801 is deposited on the sacrificial layer 1502 and patterned to isolate micro devices 1503, 1504, and 1505. In some cases, the sacrificial layer 1502 may be patterned as well.

In one embodiment, instead of isolating individual micro devices, groups of micro devices may be isolated from one another (as shown in FIG. 38A and FIG. 38B) to facilitate the transfer process.

Figure 39:
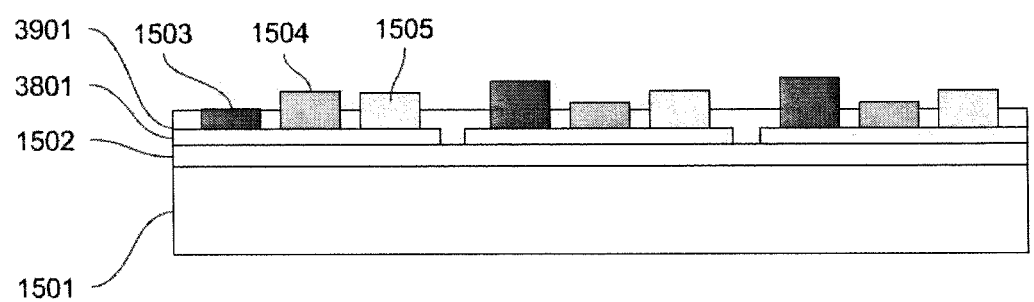
FIG. 39 is a cross section of a micro device substrate with a filler layer.

Referring to FIG. 39, a filling material 3901, such as but not limited to polyimide, may be spin coated on the substrate 1501 to fill the gap between the individual micro devices 1503, 1504 and 1505. This filling step insures the mechanical strength during the transfer process. This is particularly important when a process like laser lift-off is used to detach micro devices from the carrier substrate.

Figure 40:
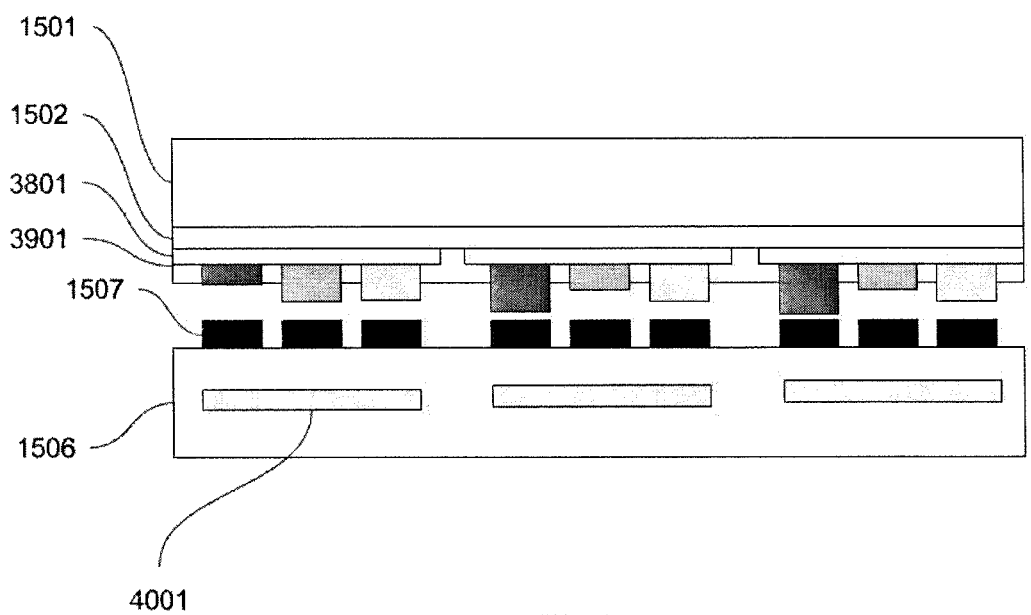
FIG. 40 shows the alignment step for a system substrate with grip mechanisms and a micro device substrate in a transfer process.

Referring to FIG. 40, the micro devices may not have the same height which make it difficult to bond them to the system substrate 1506. In these cases, one can implement an electrostatic grip mechanism 4001 or other grip mechanisms in the system substrate 1506 to temporarily keep the micro devices on the system substrate 1506 for the final bonding steps. The grip mechanism 4001 may be local for micro devices or a global grip for a group of micro devices as in the case of same-pitch transfer for the whole wafer. The grip mechanism 4001 may be on a layer above the contact electrode 1507. In this case, a planarization layer may be used.

Figure 41A:
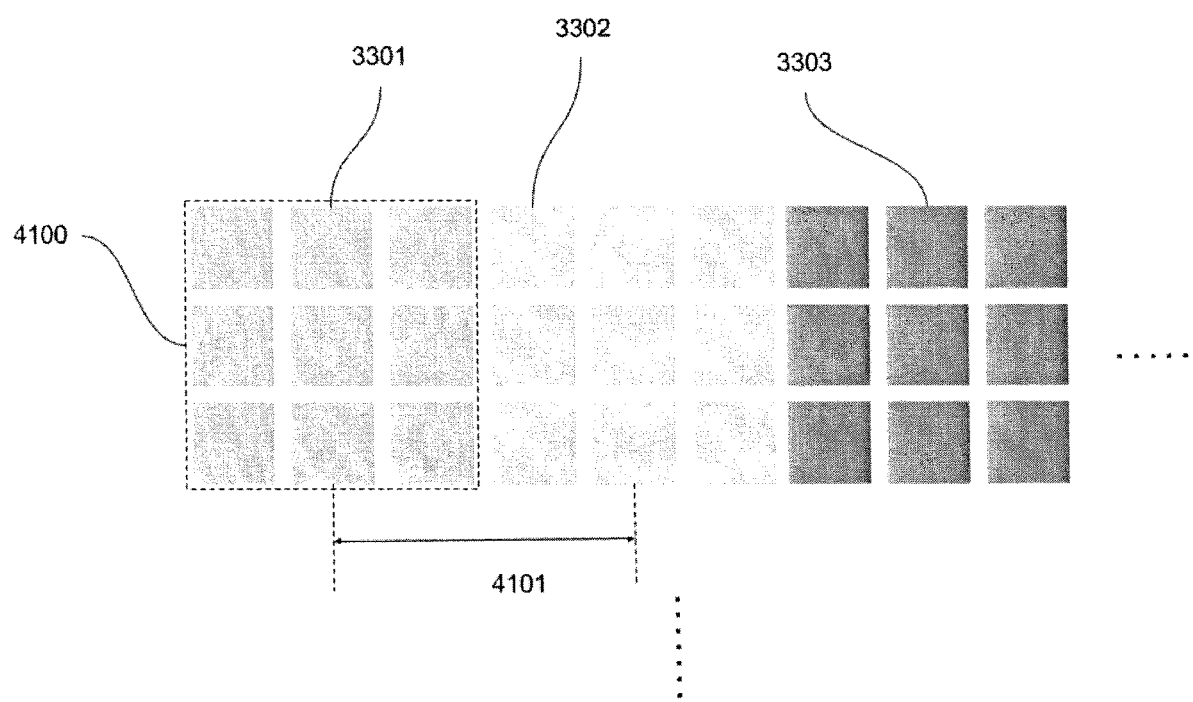
FIG. 41A shows a two dimensional arrangement of micro devices in a donor substrate.

In one embodiment, referring to FIG. 41A, the pattern of different micro device types 3301, 3302, and 3303 on donor substrate create a two dimensional array of each type (for example array 4100) where the pitch between the arrays 4101 defined as the center-to-center distance between adjacent arrays matches the pitch of the corresponding area on the system substrate.

Figure 41B:
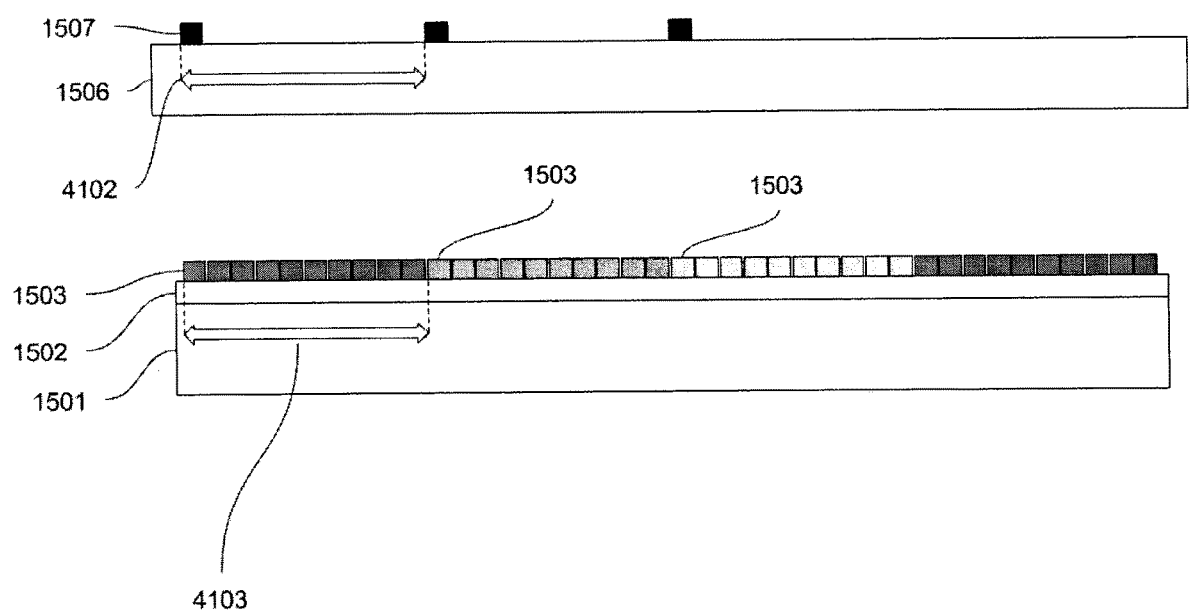
FIG. 41B is a cross section of a system substrate and a micro device substrate with different pitches.
Figure 42:
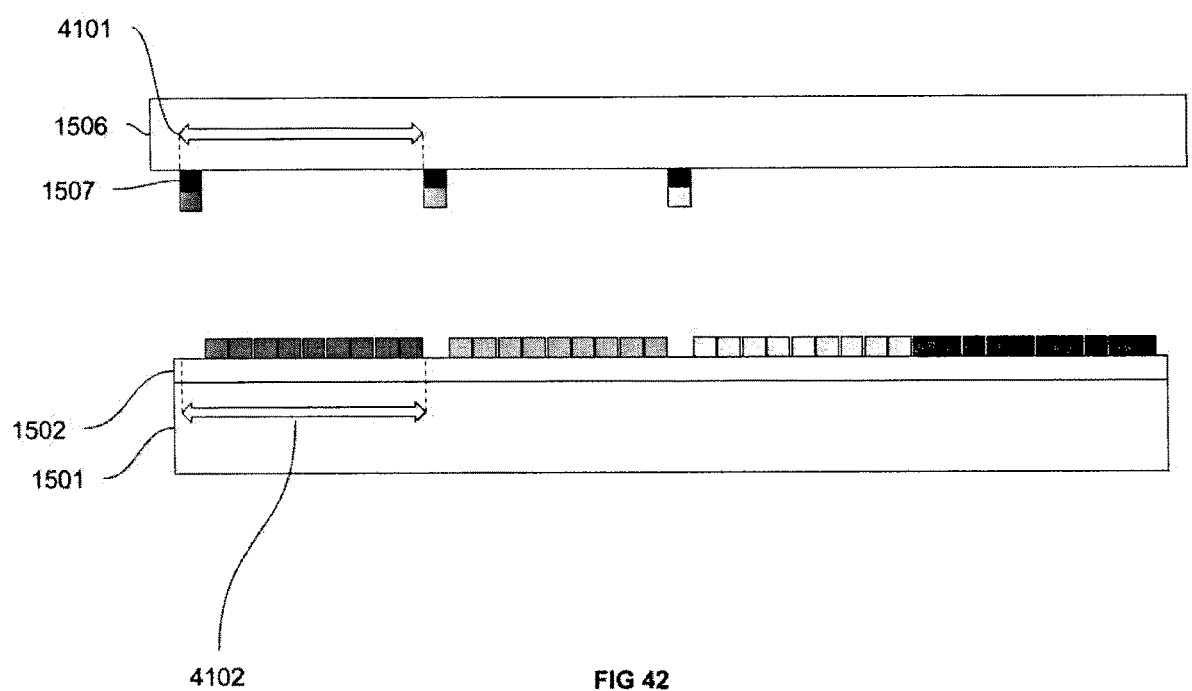
FIG. 42 shows the selective micro device transfer process for a system substrate and a micro device substrate with different pitches.

In one embodiment shown in FIG. 41B and FIG. 42, when sub-device pitch 4103 is larger than the normal distance between fabricated individual micro devices 1503 on their substrate (e.g. in large displays), micro device substrate 1501 is laid out in the form of two-dimensional single color arrays. Here, the pitch 4102 of the contact pads 1507 and the pitch 4103 of the micro device array 1503 are the same. Using this technique, one may relax the micro device fabrication requirements and reduce the selective transferring process as compared to that described above.

Figure 43:
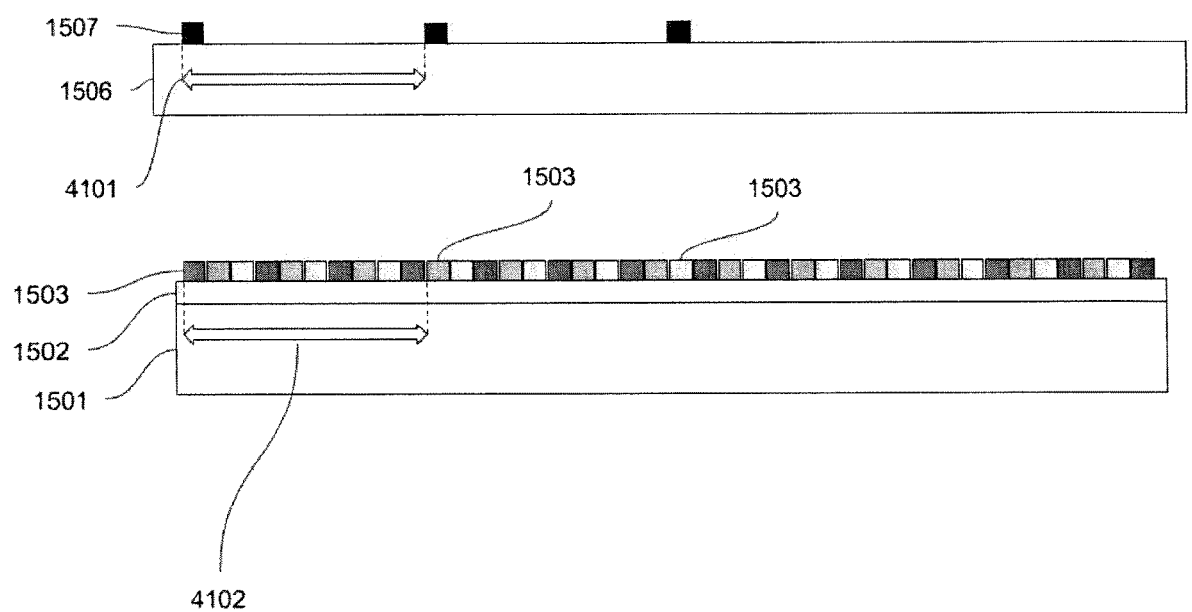
FIG. 43 is a cross section of a system substrate and a micro device substrate with different pitches.
Figure 44:
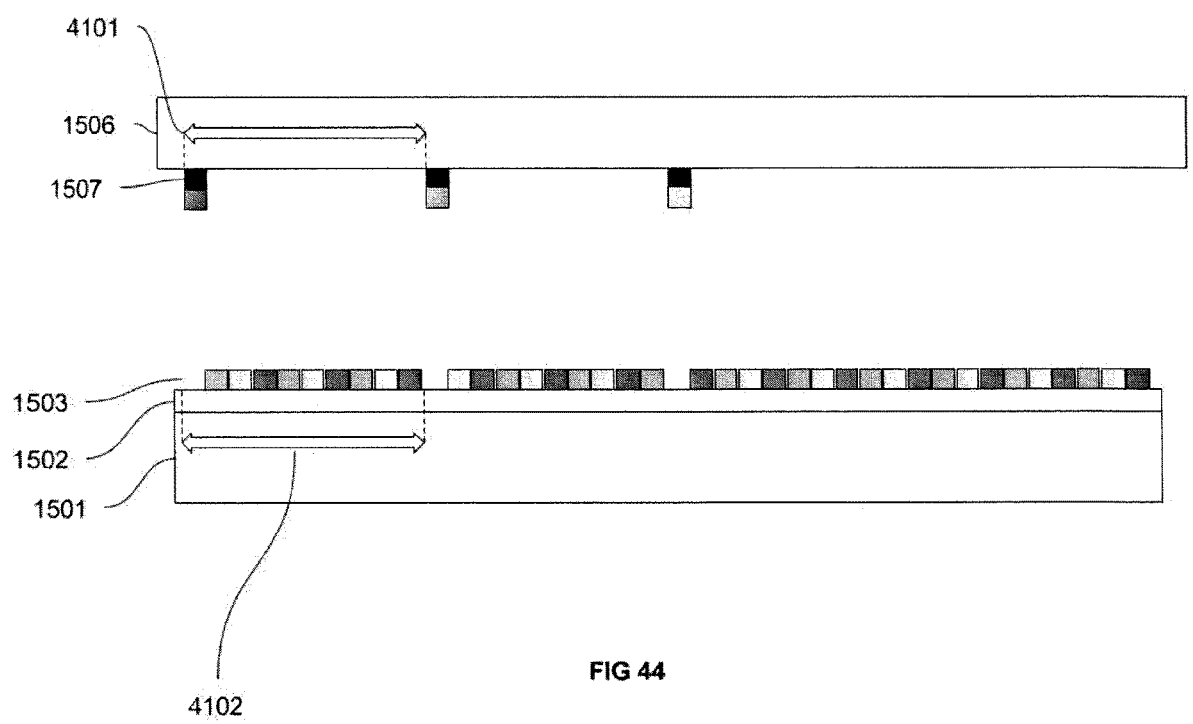
FIG. 44 shows the selective micro device transfer process for a system substrate and a micro device substrate with different pitches.

FIG. 43 and FIG. 44 shows an alternative pattern where micro devices 1503 are not formed in two-dimensional groups, and in which the different micro devices 1503 are uniformly placed across the substrate 1501 as it shown in FIG. 43 for three different micro devices 1503.

Figure 45:
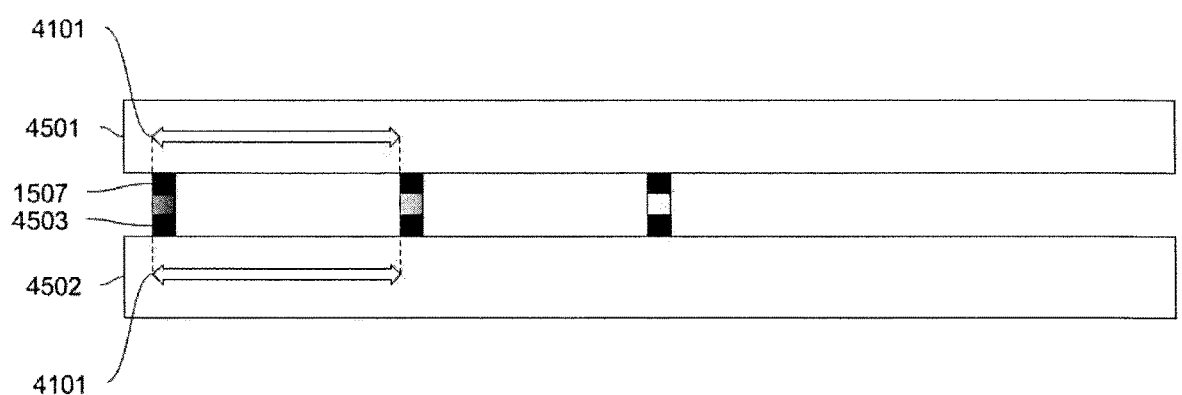
FIG. 45 shows an integrated micro device substrate.

Referring to FIG. 45, in another embodiment, micro devices 4503 are first transferred to a conductive semi-transparent common substrate 4501, then they are bonded to a system substrate 4502.

Color Conversion Structure

In some embodiments where the micro devices are optical devices such as LEDs, one can use either color conversion or color filters to define different functionality (different colors in the case of pixels). In this embodiment, two or more contact pads on the system substrate are populated with the same type of optical device. Once in place, the devices on the system substrates are then differentiated by different color conversion layers.

Figure 46A:
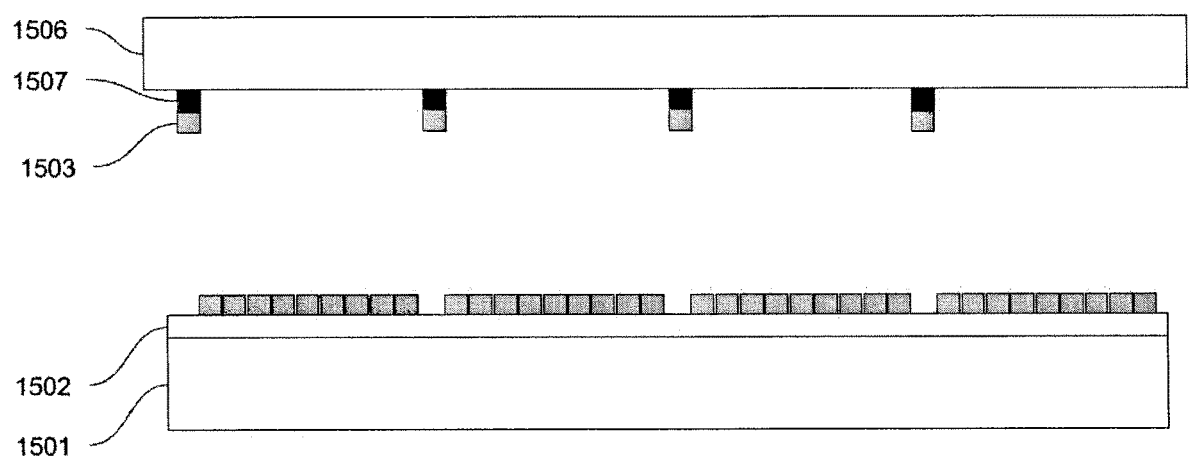
FIG. 46A and FIG. 46B show the transfer process of micro devices to a system substrate with a planarization layer, a common top electrode, bank structures, and color conversion elements.
Figure 46B:
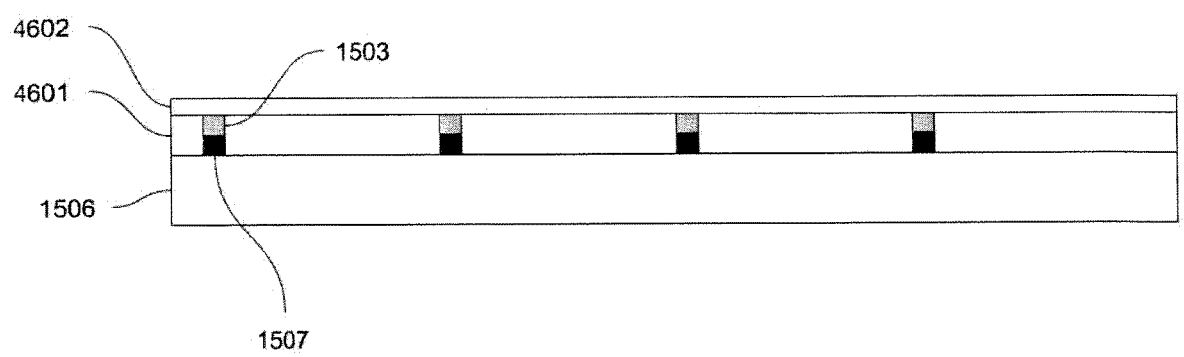

Referring to FIG. 46A and FIG. 46B, in one embodiment, after transferring micro devices 1503 to the system substrate 1506, the whole structure is covered by a planarization layer 4601. A common electrode 4602 is then formed on the planarization layer 4601. The planarization layer can be the same height as, taller than, or shorter than the stacked devices. If the planarization layer 4601 is shorter (or there is no planarization layer) the wall of the device can be conformally covered by passivation materials.

Figure 47:
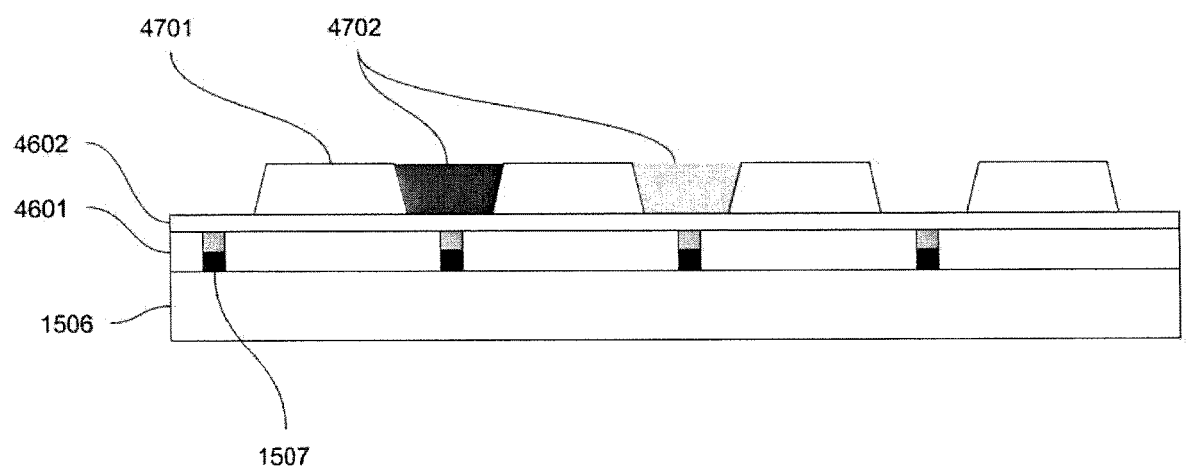
FIG. 47 shows a structure with color conversion for defining the color of pixels.

Referring to FIG. 47, a bank structure 4701 is developed (especially if a printing process is used to deposit the color conversion layers). The bank 4701 can separate each pixel or just separate different color conversion materials 4702.

Figure 48:
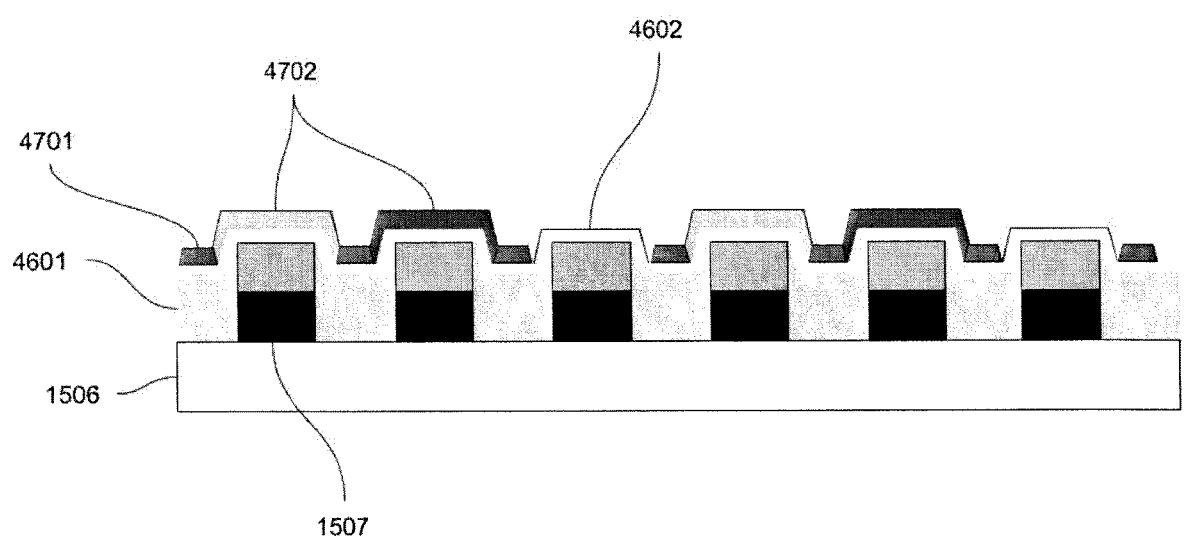
FIG. 48 shows a structure with conformal common electrode and color conversion separated by a bank layer.

FIG. 48 shows an integrated structure where the color conversion layer 4702 fully covers the top of the transferred micro devices and partially covers their sides. Bank 4701 separates the color conversion layers 4702 and the electrode 4602 is a common contact for all transferred micro devices.

Figure 49:
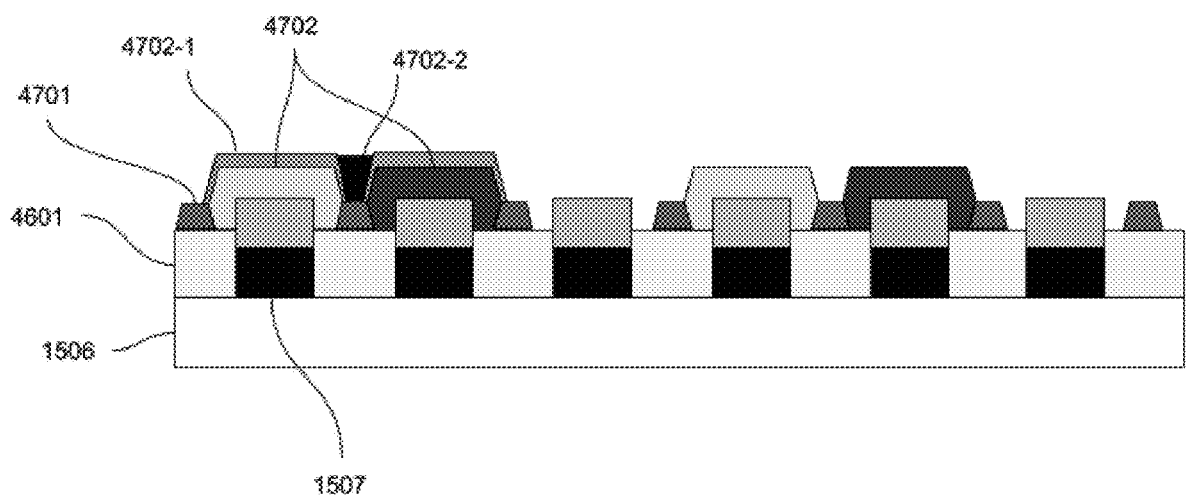
FIG. 49 shows a structure with conformal color conversion separated by a bank layer.

FIG. 49 shows an integrated structure where the color conversion layer 4702 fully covers the top of the transferred micro devices and partially covers their sides. Bank 4701 separates the color conversion layers 4702 and contacts 1507 to the micro devices are made only through the system substrate 1506.

Figure 50:
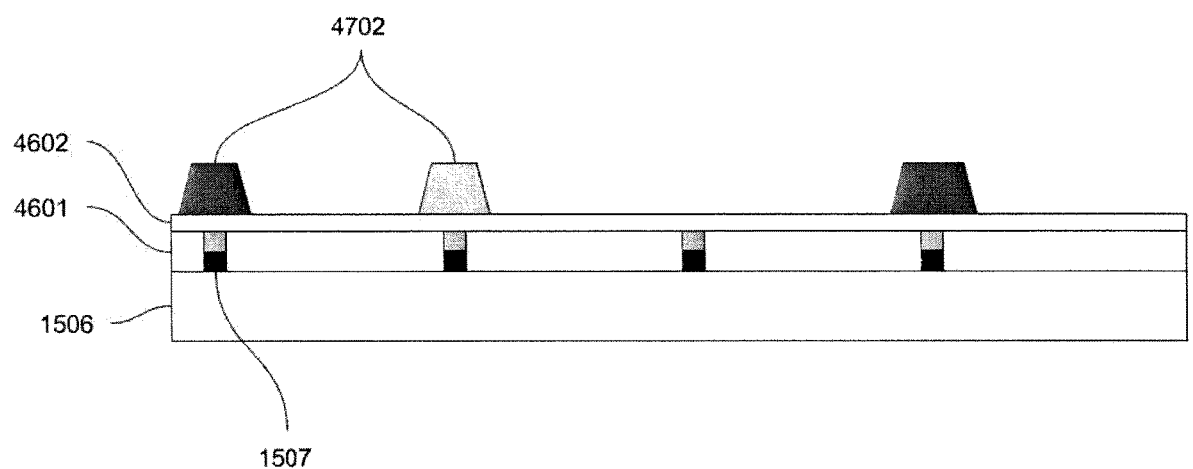
FIG. 50 shows a structure with color conversion elements on the common electrode without the bank layer.

FIG. 50 shows an integrated structure where the color conversion layer 4702 is directly formed on the common electrode 4602. In this case no bank layer is used.

Figure 51:
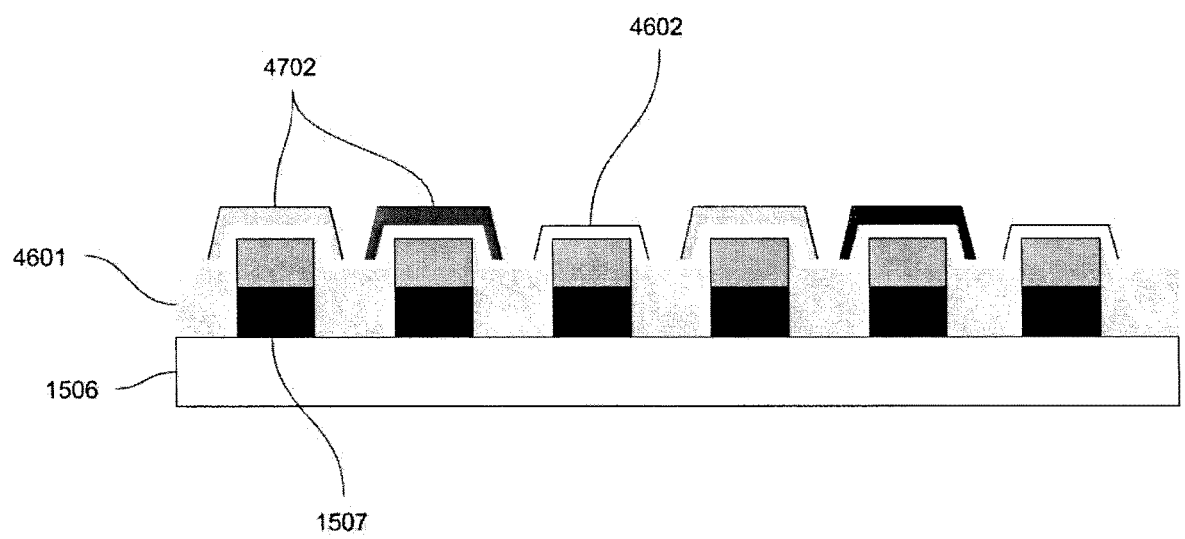
FIG. 51 shows a structure with conformal common electrode and color conversion.

FIG. 51 shows an integrated structure where the color conversion layer 4702 fully covers the top of the transferred micro devices and partially covers their sides. The electrode 4602 is a common contact for all transferred micro devices. In this case no bank layer is used.

Figure 52:
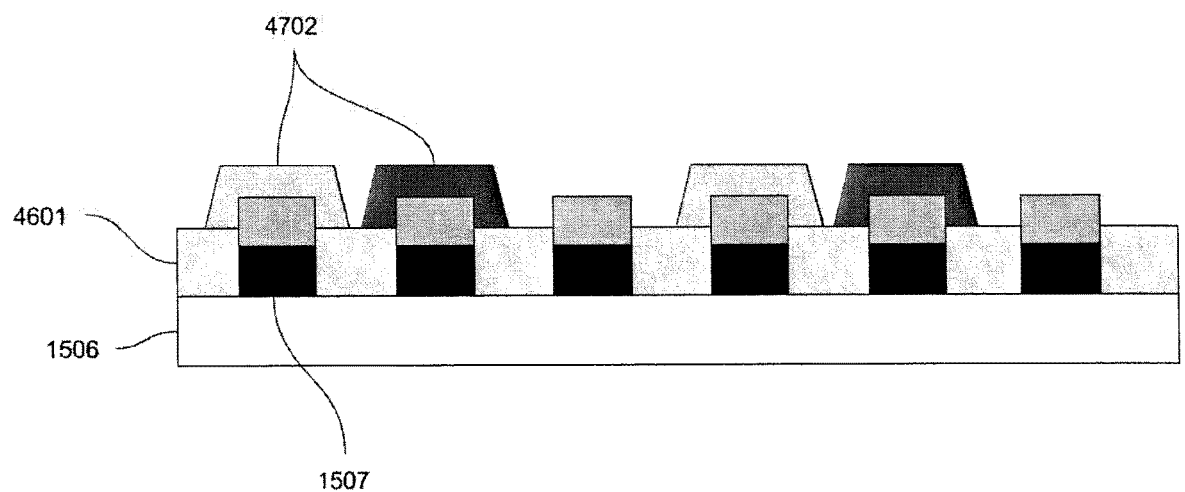
FIG. 52 shows a structure with conformal color conversion elements formed directly on the micro devices.

FIG. 52 shows an integrated structure where the color conversion layer 4702 fully covers the top of the transferred micro devices and partially covers their sides. The contacts to the micro devices are made only through the system substrate 1506. In this case no bank layer is used.

Figure 53A:
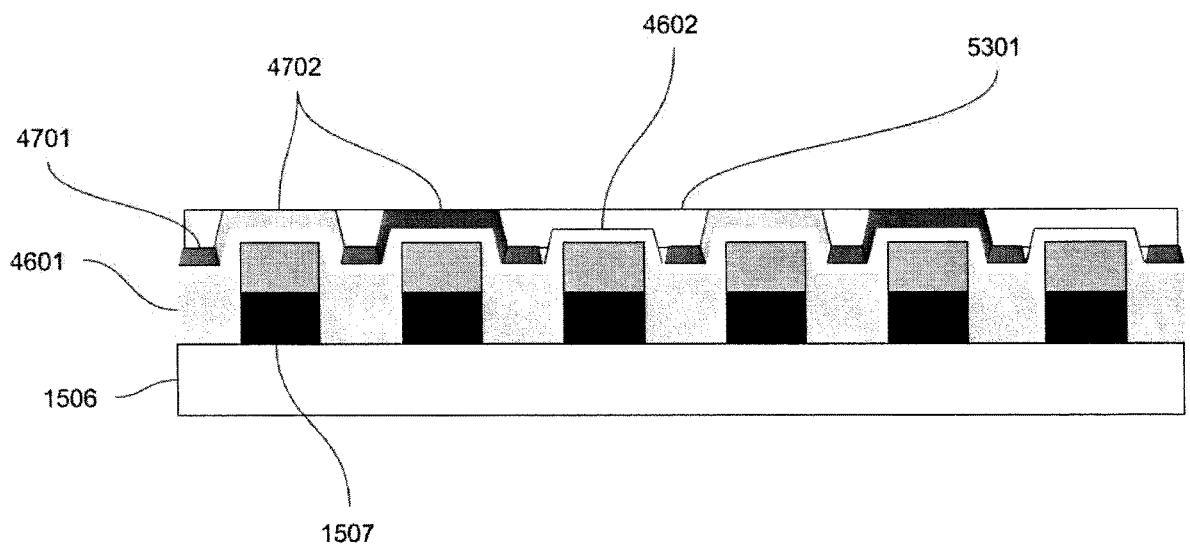
FIG. 53A and FIG. 53B show a structure with color conversion for defining pixel color, a planarization layer, and a common transparent electrode.
Figure 53B:
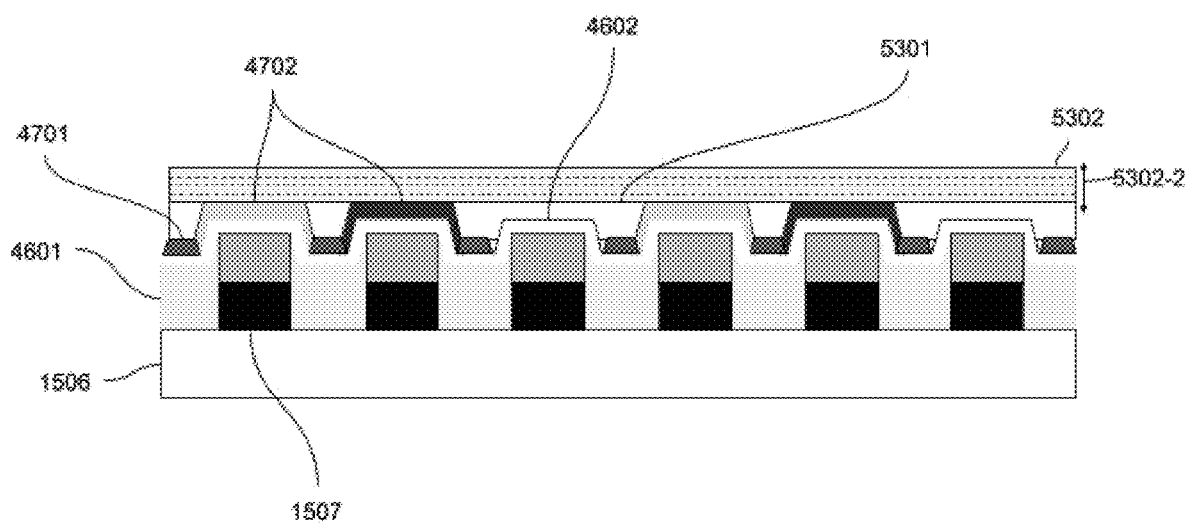
Figure 54A:
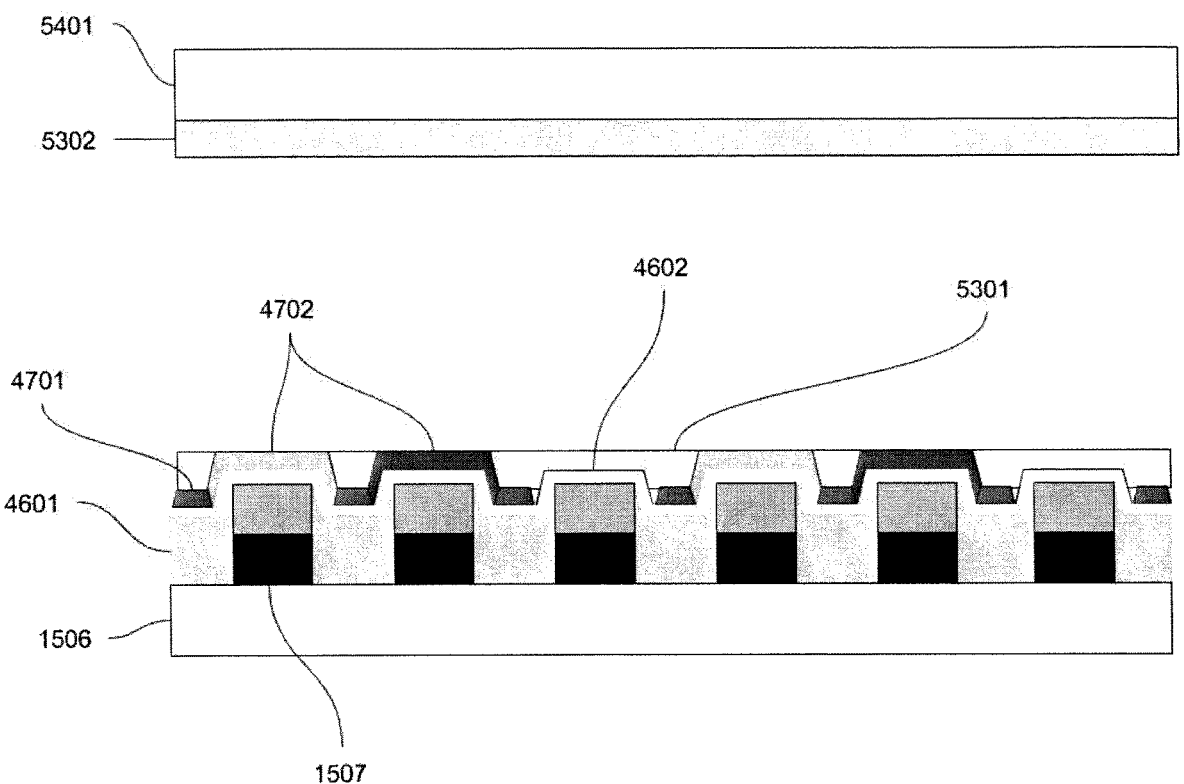
FIG. 54A and FIG. 54B show a structure with color conversion for defining pixel color and a separate substrate for encapsulation.
Figure 54B:
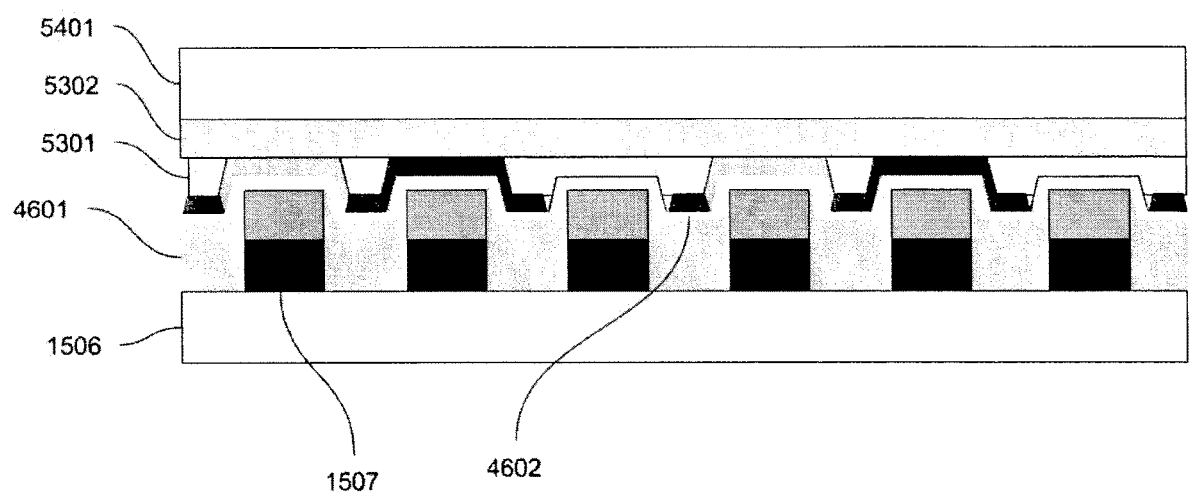

In one embodiment, shown in FIG. 53A and FIG. 53B, after forming the color conversion material 4702 on the integrated system substrate 1506, a planarization layer 5301 is deposited on the structure. In some cases where the color conversion material and/or other components of the integrated substrate need to be protected from environmental conditions, an encapsulation layer 5302 is formed over the whole structure. It should be noted that the encapsulation layer 5302 may be formed from a stack of different layers 5302-2 to effectively protect the integrated substrate from environmental conditions Referring to FIG. 54A and FIG. 54B, in another embodiment a separate substrate 5401 coated with the encapsulation layer 5302 may be bonded to the integrated system substrate.

The embodiments depicted in FIG. 53 and FIG. 54 may be combined in which encapsulation layer 5302 is formed both on the structure 1506 and the separate substrate 5401 for more effective capsulation.

The common electrode is a transparent conductive layer deposited on the substrate in the form of a blanket. In one embodiment, this layer can act a planarization layer. In some embodiments, the thickness of this layer is chosen to satisfy both optical and electrical requirements.

The distance between the optical devices may be chosen to be large enough so as to reduce cross-talk between the optical devices or a blocking layer is deposited between the optical devices to achieve this. In one case, the planarization layer functions also as a blocking layer.

After the color conversion layers are deposited, different layers such as polarizers can be deposited.

In another aspect, color filters 4702-1 are deposited on the color conversion layers. In this case, wider color gamut and higher efficiency may be achieved. One can use a planarization layer and/or bank layer after the color conversion layer before depositing the color filter layers.

The color filters can be larger than the color conversion layer to block any light leakage. Moreover, a black matrix 4702-2 can be formed between the color conversion islands or color filters.

Figure 55A:
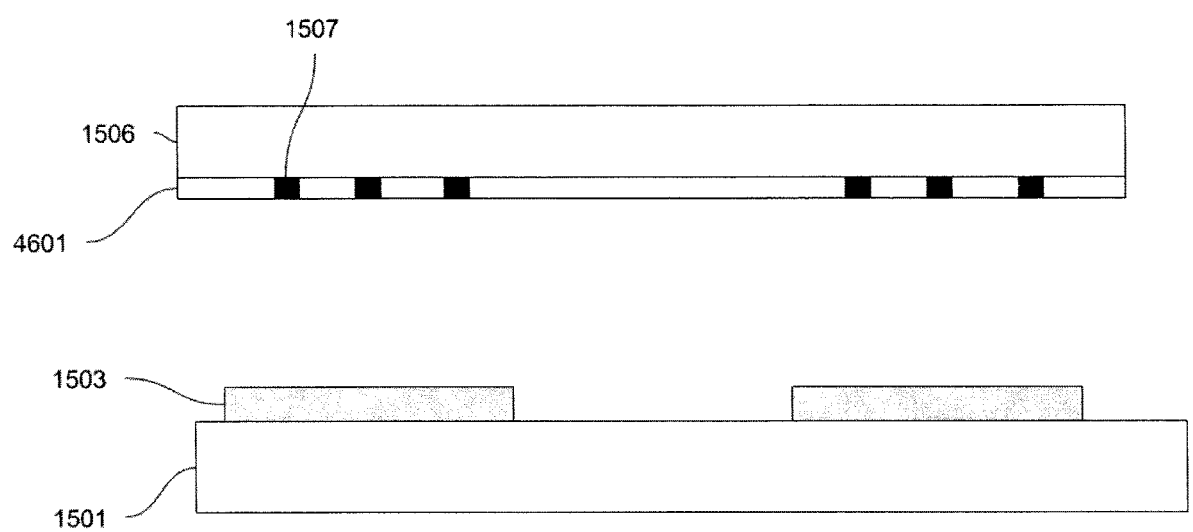
FIG. 55A, FIG. 55B, FIG. 55C and FIG. 55D show a structure with color conversion for defining pixel color while the pixelation is done with current confinement methods.
Figure 55B:
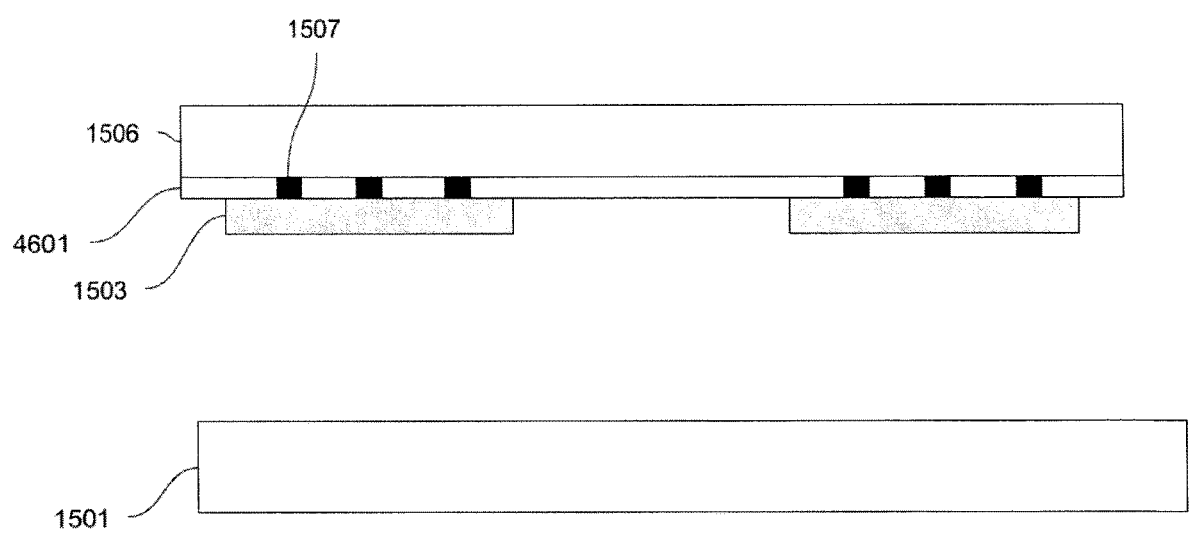
Figure 55C:
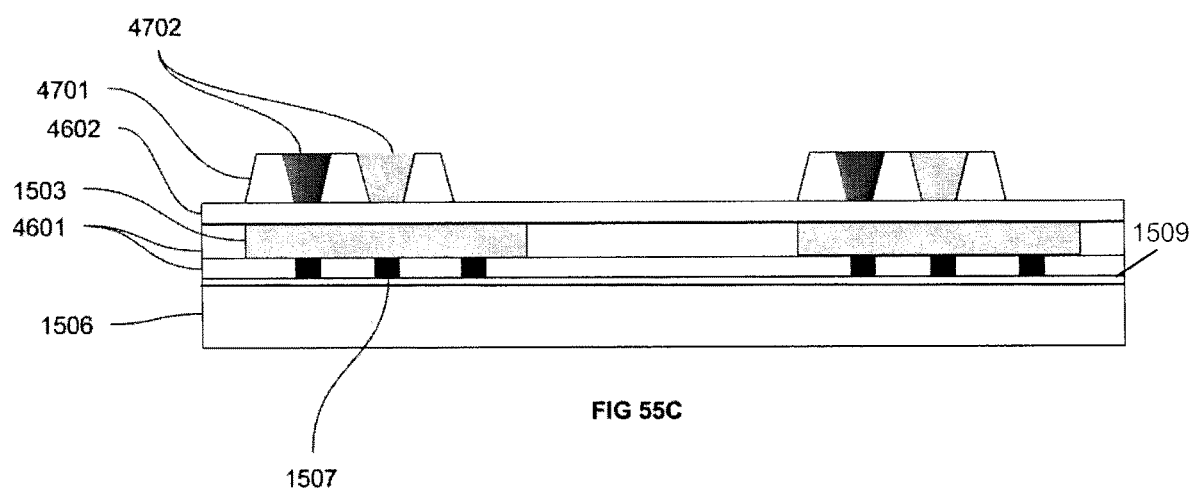

FIGS. 55A, 55B, and 55C illustrates structures where the device is shared between a few pixels (or sub-pixels). Here the micro device 1503 is not fully patterned but the horizontal condition is engineered so that the contacts 1507 define the area allocated to each pixel. FIG. 55A shows the system substrate 1506 with contact pads 1507 and a donor substrate 1501 with micro devices 1503. After the micro devices 1503 are transferred to system substrate (shown in FIG. 55B), one can do post processing (FIG. 55C) such as depositing common electrode 4602, color conversion layers 4702, color filters and so on. FIG. 55C shows one example of depositing color conversion layers 4702 on top of the micro device 1503. Here, the color conversion layer can be followed by color filter deposition. The methods described in this disclosure and/or other possible method can be used for different parts or integration of different layers into the display. Also, one can use planarization layer 4601 before or after electrode 4602. Also a reflective layer 1509 can be used between the LEDs 1503. Filler can be used between the pads 1507 and the filler can be a black matrix. Some spacer or light confinement structure can be used between LEDs 1503. On the system substrate 1506 a reflective layer can be used to direct the light.

Figure 55D:
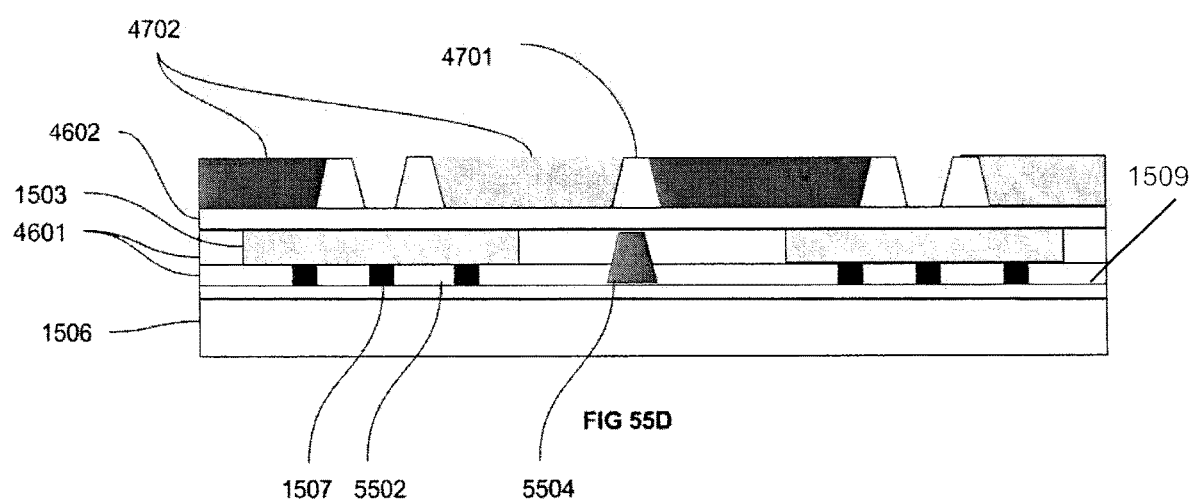

FIG. 55D shows another example of depositing color conversion layers 4702 on top of the micro device 1503. However, the other methods described in this disclosure and other possible methods can also be used. Also, one can use planarization layer 4601 before or after transparent upper electrode 4602. Also a reflective layer can be used between the LEDs 1503. Filler can be used between the pads 1507 and the filler 5502 can be a black matrix. Some spacer or light confinement structure 5504 can be used between micro-LEDs 1503. On the system substrate 1506 a reflective layer 1509 can be used to direct the light. Here, the light of micro-LEDs 1503 is spread over larger area so that there is less stress on the color conversion layer 4702. Different structure can be used to spread the light over larger area as well.

It is possible to add the color conversion layers as described into pixel (or sub-pixel) active areas after formation of the active area. This can offer a higher fill factor and higher performance and also avoid color leaking from the side pixel (or sub-pixel) if the active area of the pixel (or sub-pixel) is covered by reflective layers.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An integrated optical system comprising:
   a system substrate;
   a first and second plurality of electrode contact pads on the system substrate;
   a first light emitting micro device mounted on the first plurality of electrode contact pads;
   a second light emitting micro device mounted on the second plurality of electrode contact pads;
   a planarization layer surrounding and between the first and second light emitting micro devices;
   a first color conversion layer over the first light emitting micro device and a second light emitting micro device;
   a bank structure deposited between the first color conversion layer and the second color conversion layer to separate the first light emitting micro device and the second light emitting device; and
   a bottom reflector on the system substrate for directing light from the first and second light emitting micro devices through the first color conversion layer and the second color conversion layer.

2. The integrated optical system of claim 1, wherein the first light emitting micro device or the second light emitting micro device is provided with connections through a top common electrode over top of both the first and second light emitting micro devices, wherein the top common electrode is a transparent conductive layer deposited on the system substrate.

3. The integrated optical system of claim 1, wherein the planarization layer can be used before or after the first and second plurality of electrode contact pads.

4. The integrated optical system of claim 1, further comprising a color filter mounted on the first color conversion layer and the second color conversion layer.

5. The integrated optical system of claim 4, further comprising a black matrix mounted between the first and second plurality of electrode contact pads as a filler.

6. The integrated optical system of claim 1, wherein a spacer is placed between the first and second light emitting micro devices.

7. The integrated optical system of claim 6, wherein the spacer is a light confinement structure.

8. The integrated optical system of claim 1, further comprising a reflective layer deposited between the first and second light emitting micro devices to direct the light.

9. The integrated optical system of claim 1, wherein the first and second light emitting micro devices are not fully patterned but a horizontal condition is engineered so that the first and second plurality of electrode contact pads define an area allocated to each pixel.

10. The integrated optical system of claim 1, wherein connection to the first and second light emitting micro devices are made through the system substrate.

* * * * *